(12) United States Patent
Matsui et al.

(10) Patent No.: US 7,327,590 B2
(45) Date of Patent: Feb. 5, 2008

(54) MEMORY MODULE AND MEMORY SYSTEM

(75) Inventors: Yoshinori Matsui, Tokyo (JP); Toshio Sugano, Tokyo (JP); Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/492,981

(22) Filed: Jul. 26, 2006

(65) Prior Publication Data

US 2006/0262587 A1 Nov. 23, 2006

Related U.S. Application Data

(62) Division of application No. 10/828,189, filed on Apr. 21, 2004, now Pat. No. 7,123,497.

(30) Foreign Application Priority Data

Apr. 21, 2003 (JP) ............................. 2003-115834

(51) Int. Cl.
*G11C 5/02* (2006.01)
(52) U.S. Cl. ..................... 365/51; 365/63; 365/191; 257/686
(58) Field of Classification Search ............... 257/686; 326/38; 361/735; 365/51, 63, 174, 189.03, 365/214, 52, 191, 198
See application file for complete search history.

(56) References Cited

U.S. PATENT DOCUMENTS

| | | | | |
|---|---|---|---|---|
| 5,502,667 A | * | 3/1996 | Bertin et al. | 365/51 |
| 5,561,622 A | * | 10/1996 | Bertin et al. | 365/51 |
| 6,133,640 A | | 10/2000 | Leedy | 257/778 |
| 6,487,102 B1 | * | 11/2002 | Halbert et al. | 365/51 |
| 6,627,985 B2 | * | 9/2003 | Huppenthal et al. | 257/686 |
| 6,717,251 B2 | * | 4/2004 | Matsuo et al. | 257/686 |
| 6,727,582 B2 | * | 4/2004 | Shibata | 257/723 |
| 6,778,404 B1 | * | 8/2004 | Bolken et al. | 361/767 |

(Continued)

FOREIGN PATENT DOCUMENTS

| | | |
|---|---|---|
| JP | 6/291250 | 10/1994 |
| JP | 9-504654 | 5/1997 |
| JP | 2000-49277 | 2/2000 |

(Continued)

*Primary Examiner*—Anh Phung
*Assistant Examiner*—Alexander Sofocleous
(74) *Attorney, Agent, or Firm*—Young & Thompson

(57) ABSTRACT

In a memory module including a plurality of DRAM chips which transmit/receive a system data signal with a predetermined data width and at a transfer rate and which transmit/receive an internal data signal having a larger data width and a lower transfer rate as compared with the system data signal, the transfer rate of the system data signal is restricted. Current consumption in DRAMs constituting the memory module is large, hindering speed increases. For this memory module, a plurality of DRAM chips are stacked on an IO chip. Each DRAM chip is connected to the IO chip by a through electrode, and includes a constitution for mutually converting the system data signal and the internal data signal in each DRAM chip by the IO chip. Therefore, wiring between the DRAM chips can be shortened, and DLL having a large current consumption may be disposed only on the IO chip.

7 Claims, 40 Drawing Sheets

U.S. PATENT DOCUMENTS

| | | |
|---|---|---|
| 7,091,591 B2 * | 8/2006 | Shibata ................. 257/686 |
| 7,102,905 B2 * | 9/2006 | Funaba et al. ............. 365/51 |
| 7,111,149 B2 * | 9/2006 | Eilert .................... 711/220 |
| 2002/0036338 A1 | 3/2002 | Matsuo et al. ........... 257/686 |
| 2004/0080013 A1 | 4/2004 | Kimura et al. ........... 257/499 |
| 2005/0082664 A1 | 4/2005 | Funaba et al. ........... 257/724 |
| 2005/0139978 A1 | 6/2005 | Hirose .................. 257/686 |
| 2007/0023887 A1 * | 2/2007 | Matsui .................. 257/686 |

FOREIGN PATENT DOCUMENTS

| | | |
|---|---|---|
| JP | 2001-256772 | 9/2001 |
| JP | 2002-305283 | 10/2002 |
| JP | 2003-46057 | 2/2003 |
| JP | 2003-60053 | 2/2003 |

* cited by examiner

| S0_in  | 1 | 0 | 1 | 0 | 1 | 0 | 1 | 0 |
|--------|---|---|---|---|---|---|---|---|
| S1_in  | 1 | 0 | 0 | 1 | 1 | 0 | 0 | 1 |
| S2_in  | 1 | 0 | 0 | 0 | 0 | 1 | 1 | 1 |
| S0_ out | 0 | 1 | 0 | 1 | 0 | 1 | 0 | 1 |
| S1_ out | 0 | 0 | 1 | 1 | 0 | 0 | 1 | 1 |
| S2_ out | 0 | 0 | 0 | 0 | 1 | 1 | 1 | 1 |
| S0 N   | 1 | 0 | 1 | 0 | 1 | 0 | 1 | 0 |
| S0T    | 0 | 1 | 0 | 1 | 0 | 1 | 0 | 1 |
| S1 N   | 1 | 1 | 0 | 0 | 1 | 1 | 0 | 0 |
| S1T    | 0 | 0 | 1 | 1 | 0 | 0 | 1 | 1 |
| S2 N   | 1 | 1 | 1 | 1 | 0 | 0 | 0 | 0 |
| S2T    | 0 | 0 | 0 | 0 | 1 | 1 | 1 | 1 |
| C4     | 0 | 0 | 0 | 1 | 0 | 0 | 0 | 0 |
| C8     | 0 | 0 | 0 | 0 | 0 | 0 | 0 | 1 |

FIG. 10

MEMORY MODULE AND MEMORY SYSTEM

BACKGROUND OF THE INVENTION (1) Field of the Invention

The present invention relates to a memory system including a plurality of memory modules such as memory subsystems, particularly to a memory system comprising a plurality of memory units in the respective memory modules.

(2) Description of the Related Art

As this type of memory system, there has heretofore been a DRAM memory system comprising a constitution in which a plurality of memory modules are attached onto a mother board and these memory modules are controlled by a chip set (memory controller) and a plurality of DRAMs are mounted as memory units on the respective memory modules.

For the above-described DRAM memory system, a system has been proposed in which a stub series terminated transceiver logic (SSTL) is used as interface standards and data can be written/read at a high rate and with a low signal amplitude using a double data rate (DDR) method for inputting/outputting data in synchronization with front and rear edges of a clock.

As an example of this memory system, a memory system including a plurality of memory modules (i.e., DRAM modules) on which a plurality of DRAMs are mounted and which are attached to a mother board has been described in Japanese Patent Application Laid-Open No. 2001-256772 (hereinafter referred to as Patent Document 1). Specifically, the memory module comprises a memory module substrate having a rectangular shape, a plurality of DRAMs arranged in a row in a longitudinal direction of the memory module substrate, a command/address buffer between the DRAMs, and a PLL chip which distributes clocks to the respective DRAMs, and the respective memory modules constitute a memory sub-system.

Here, each DRAM on the memory module extends in a short direction of the module substrate and is connected to a module data wiring, and the command/address buffer and a PLL chip are connected to a module command/address wiring and a module clock wiring extending in the short direction of the module substrate.

Furthermore, a module command/address distribution wiring and a module clock distribution wiring are drawn out in the longitudinal direction of the module substrate in order to distribute commands, addresses, and clocks to the respective DRAMs from the command/address buffer and PLL chip.

In this constitution, a data signal is directly transmitted to a DRAM chip on the memory module constituting each memory sub-system from the memory controller disposed on the mother board substrate, and a command/address signal and a clock signal are transmitted to the DRAM chip on each memory module via the command/address buffer and PLL chip from the memory controller.

According to this memory module constitution, even when a write and read rate with respect to the DRAM chip is lowered as compared with a transfer rate of the system data signal, the system data signal can be transferred to an external circuit at a high rate.

However, as described in Patent Document 1, it has become clear that a constitution in which a plurality of DRAM chips are arranged in a plane on a mounting substrate cannot meet a requirement for a high data rate of 12.8 GBps with respect to the memory module of the next generation.

On the other hand, in Japanese Patent Application Laid-Open No. 6-291250 (Patent Document 2), a semiconductor integrated circuit has been described including a constitution whose length and breadth are standardized and in which a plurality of IC chips comprising signal pads are stacked on standardized/unified positions and in which the pad of the IC chip is connected to another pad by a longitudinal wiring.

In Patent Document 2, as a concrete example, an example is described in which four layers of SRAMs are stacked on an address decoder layer (FIG. 8 and paragraph 0025). In this case, the address decoder layer is disposed as a first layer, and SRAM layers are disposed as second to fifth layers. Chip enable buses for individually selecting SRAMs are connected to the SRAMs disposed in the second to fifth layers. Accordingly, the respective SRMs are individual selected and activated.

In Patent Document 2, one of a plurality of SRAM layers is selected on the address decoder layer, and the data signal from the selected SRAM layer is output as it is to the outside from the address decoder layer.

Furthermore, in Japanese Patent Publication No. 9-504654 (Patent Document 3), a memory package has been described in which a single IC chip is replaced with an IC chip laminate, an interface circuit for translating a signal between a host system and the IC chip laminate is included in the IC chip laminate (claim 2). Even in this example, the stacked IC chip laminates are selectively controlled by an interface circuit so that the laminates operate independently of one another. In this case, a signal and transfer rate of the data signal between the host system and IC chip laminate are equal to those of an internal data signal inside the IC chip laminate.

In other words, in Cited Document 3, anything is not considered concerning a case where an internal data width inside the IC chip laminate is larger than a data signal width outside the IC chip laminate.

Moreover, a memory having a three-dimensional structure has been described in U.S. Pat. No. 6133640 (Patent Document 4). In Patent Document 4, a constitution is described in which memory circuits and a control logic circuit are individual arranged on a plurality of physically separated layers, the memory circuits of the respective layers are individually optimized by the single control logic circuit, accordingly the plurality of memory circuits are operated, and cost is reduced.

Among Patent Documents 1 to 4 described above, in Patent Documents 2 to 4, anything is not suggested with respect to the memory system and DRAM module (memory module) described in Patent Document 1. Furthermore, concerning the memory system in which the width and transfer speed of the data signal inside the module are different from those of the data signal outside the module and problems in the memory system, anything is not pointed out in Patent Documents 1 to 4 described above.

In the memory system described in Patent Document 1, data from the plurality of DRAMs are transmitted/received as memory sub-system data, and the plurality of DRAMs are arranged in a row in a plane on the module substrate.

However, it has become clear that with an increase of the number of DRAMs mounted on the module substrate in this memory sub-system, a demand for a higher speed, especially a demand for a high data rate of 12.8 GBps in the memory module of the next generation cannot be met.

As a result of intensive research of a cause for hindering the speeding-up in the above-described DRAM module by the present inventors, it has become that a wiring topology of a data signal, address command signal, and clock signal between the memory controller and each DRAM chip differs by several cm on the mounting substrate with the arrangement of a plurality of DRAM chips in a plane on the mounting substrate. Therefore, a difference is made in a signal reach time by this degree of difference of the wiring topology, that is, skew occurs, and it has become clear that this skew cannot be corrected even using PLL with an increase of the transfer rate.

Furthermore, there is a problem that when the transfer rate is raised, a consumption current in the memory sub-system accordingly increases. A DLL circuit for receiving/transmitting a high-frequency transmission signal is mounted on each DRAM chip on the memory module, the consumption current occupies about 15% of a read/write current at 800 Mbps, and this results in a circumstance in which an increase of consumption current cannot be avoided.

The above-described problem will be concretely described hereinafter with reference to FIG. 40.

The memory sub-system, that is, the memory module which is an object of the present invention will be schematically described with reference to FIG. 40. First, a memory module shown in FIG. 40 comprises a module substrate 200, a plurality of DRAM chips (nine chips) 201 arranged in a row in a plane on the module substrate 200, and a register 202, PLL 203, and serial presence detector (SPD) 204 arranged in a middle portion of the module substrate 200, and the module substrate 200 is attached onto a mother board (not shown) via a connector (not shown).

Here, in addition to the shown memory module, another memory module is mounted together with a chip set (memory controller) on the mother board, and these plurality of memory modules and the chip set constitute a memory system.

A module data wiring is laid below the respective DRAMs 201 in the drawing, that is, in a short direction of the module substrate 200. On the other hand, a module command/address wiring is disposed below the register 202 in the drawing. Furthermore, a module clock wiring extends below the PLL 203 in the drawing, and these module command/address wiring and module clock wiring are connected to a connector disposed in a longitudinal direction of the module substrate 200. The SPD 204 is a memory which determines an operation condition of the DRAM chip 201 mounted on the module substrate 200, and usually comprises ROM.

Furthermore, a module command/address distribution wiring is disposed for each DRAM chip 201 in the longitudinal direction of the module substrate 200, that is, in a transverse direction from the shown register 202, and a module clock distribution wiring is similarly disposed for each DRAM chip 201 from the PLL 203.

In the memory module including this constitution, data having a bit number in accordance with a bus width of a memory access data bus can be input/output as module data. However, in this constitution, a topology of a module data wiring is different from a topology of a module command distribution wiring from a module command wiring and topologies of the module clock wiring and module clock distribution wiring from the PLL 203.

On the other hand, in the shown memory module constitution, a method in which a broad bus width is used as means for realizing a data rate required by a processor (general data processing system using SDRAM such as DDR) and a method in which the transfer rate is raised with a small bus width (system of RDRAM) are used.

In these methods, for a conventional general memory module constituted with a large bus width, 4 to 16 single DRAMs having an IO number of 16, 8, 4 are mounted in a row in a plane on the module substrate to constitute 64 or 72 data buses.

On the other hand, the module command/address signal and module clock signal are usually shared by all the DRAM chips 201 on the module substrate 200. Therefore, for these wirings, as shown, the register 202 and PLL 203 are mounted on the module substrate 200, these register 202 and PLL 203 adjust timings for buffering and wiring delay on the module, and the module command/address signal and the module clock signal are supplied to each DRAM chip 201.

As described above, the data signal, address command signal, and clock signal distributed from the memory controller (chip set) have physically different wiring topologies, and transmission characteristics of the signal differ.

The difference of the signal reach time or the skew which cannot be corrected by the PLL 203 are generated by the difference of this physical wiring topology in the data signal, module clock signal, and command/address signal, and a problem occurs that this is a large obstacle in further raising the transfer rate.

Furthermore, as another problem in this type of memory system, there is a problem of a branch wiring on a data wiring caused because it is possible to additionally dispose the memory module. Usually, the module is increased by insertion/detachment with respect to a socket connected to the bus wiring. Therefore, the data signal is branched on the bus wiring and supplied to the DRAM chip 201 in the module. A problem occurs that an obstacle is brought in high-rate signal transmission by signal reflection caused by this branch wiring.

Moreover, when the memory module is increased, deterioration of a signal quality by the branch wiring or that of a signal quality by LC which is parasitic on a DRAM package increases. Therefore, the number of additional modules in DDRII using this constitution has a limitation of two slots in the actual circumstances. In actual, the data rate which can be realized in the memory sub-system by the DDRII using this constitution is 533 Mbps per data pin and about 4.26 GBps per system channel.

On the other hand, a method has also been proposed in which the transfer rate is raised with a small bus width in the memory module of a shown form (RDRAM). In this method, the single RDRAM having an IO number of 16 is connected in series on the bus wiring and disposed. Therefore, the data signal, module address/command signal, and module clock signal distributed from the memory controller have the physically same wiring topology, and the difference of the signal reach time in each RDRAM, that is, skew is not generated.

Moreover, since each RDRAM is mounted on the bus, the signal wiring is not branched.

Therefore, at present, the transfer rate of the bus which can be realized in the memory sub-system by the RDRAM using this constitution is 1.066 Gbps per data pin. However, since the data width is only two bytes, the data rate of the system is about 2.13 GBps. Furthermore, a method of constituting the system of two channels is used in order to raise the data rate of the memory system, but the rate is about 4.26 GBps even in this case.

In this constitution of the RDRAM, the bus is not branched, but 4 times or more RDRAMs need to be connected to the same bus in order to realize a required memory capacity. When a large number of RDRAMs are connected to a long bus in this manner, the deterioration of the signal quality by the LC parasitic on the RDRAM package increases. Therefore, a restriction is generated on addition of the memory capacity, and it is difficult to realize the memory capacity required for the system. It is difficult to realize a high required data rate in a state in which a large number of DRAMs as loads are connected and held onto a long bus.

Moreover, it is also considered that the IO number in the RDRAM is increased, but the RDRAM chips and packages increase, and the cost of the single RDRAM increases. When the IO number is increased in the same RDRAM, an accessible page size is reduced by an IO unit, and the requirement of the system is not satisfied.

SUMMARY OF THE INVENTION

An object of the present invention is to provide a memory system capable of solving various problems in a memory module and operating at a high rate.

An object of the present invention is to provide a DRAM memory module in which a high-rate operation is possible and current consumption can be reduced.

An object of the present invention is to provide a memory module and a memory system capable of dealing with even a data rate of 12.8 GBps required for a memory system of the next generation.

In the present invention, a memory module can be realized in which a data rate (12.8 GBps) required for a memory system of the next generation is maintained with a sufficiently memory capacity (expansion property) and an increase of a current consumption is suppressed.

Specifically, according to a first mode of the present invention, there is obtained a memory module comprising: a system input/output terminal via which a system data signal having a predetermined data width is input/output; and a plurality of memory chips which transmit/receive an internal data signal broader than the system input/output terminal, the memory module further comprising: an IO chip including a function of performing conversion between the system data signal and the internal data signal in the system input/output terminal, the plurality of memory chips being stacked on the IO chip and being connected to the IO chip via through electrodes extending through the plurality of stacked memory chips.

In this case, the module further comprises an interposer substrate for mounting the IO chip, and the interposer substrate has a terminal for mounting, constituting the system input/output terminal.

According to a second mode of the present invention, there is obtained a memory system including a plurality of memory modules which input/output the system data signal having the predetermined data width and which transmit/receive the internal data signal broader than the system data signal, wherein each of the plurality of memory modules comprises a constitution in which an IO chip, and a plurality of memory chips stacked on the IO chip are stacked.

In this case, the plurality of memory modules may also be attached onto a common mother board in a plane, or the plurality of memory modules are mounted on a common mounting substrate and may also have a constitution in which the mounting substrate is attached onto the mother board.

According to a third mode of the present invention, there is obtained a system comprising: a plurality of memory chips which transmit/receive a system data signal at a predetermined transfer rate and which transmit/receive an internal data signal at an internal processing rate lower than the transfer rate, the system further comprising: an IO chip comprising a terminal which transmits/receives a data signal at the predetermined transfer rate and which performs conversion between the internal data signal at the internal processing rate and the system data signal at the transfer rate, the plurality of memory chips being stacked on the IO chip.

According to another mode of the present invention, there is obtained a DRAM memory module comprising: an IO chip; a plurality of DRAMs stacked on the IO chip; and an interposer substrate having BGA terminals of all system data signals, system address signals, system control signals, and system clock signals required to constitute a function of a memory sub-system of a channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM and a GND terminal via the through electrode. In this case, an SPD chip may also be stacked on the stacked DRAM chip.

According to another mode of the present invention, there is obtained a DRAM module comprising: an IO chip; a plurality of DRAM chips stacked on the IO chip; and an interposer substrate having BGA terminals of all system data signals, system address signals, system control signals, and system clock signals required to constitute a function of a memory sub-system of a channel, wherein each DRAM chip comprises a counter circuit to generate a collation signal with which a control signal or an address signal transmitted from the IO chip is collated to receive a signal, and has a constitution in which the DRAM chips having at least two types of different through electrode forming patterns are alternately stacked.

According to another embodiment of the present invention, there is obtained a DRAM module comprising: an IO chip; a plurality of DRAM chips stacked on the IO chip; and an interposer substrate having BGA terminals of all system data signals, system address signals, system control signals, and system clock signals required to constitute a function of a memory sub-system of a channel, and all the DRAM chips to be stacked have the same pattern, comprise a plurality of fuse devices, and produce collation signals indicating stacked positions by cut positions of the fuse device.

According to another mode of the present invention, the is obtained a DRAM module comprising: a system input/output terminal via which a system data signal having a predetermined data width is input/output; and a plurality of memory chips which transmit/receive an internal data signal broader than the system input/output terminal, the module further comprising: an IO chip including a function of performing conversion between the system data signal and the internal data signal in the system input/output terminal, the plurality of memory chips being stacked on the IO chip and being connected to the IO chip by through electrodes extending through the plurality of stacked memory chips, the respective stacked DRAM chips having a bank constitution and selectively operating by a bank selection signal logically produced from a system bank selection signal by the IO chip.

According to still another mode of the present invention, there is obtained a DRAM module comprising: an interposer substrate comprising a BGA terminal via which a system data signal is input/output; and two IO chips mounted on the interposer substrate, each IO chip being connected to ½ of system data signal BGA terminals and comprising a constitution in which BGA terminals other than those of data such as an address, command, and clock are shared, a plurality of DRAM chips being stacked on the two IO chips. In this case, the DRAM chips stacked on the two IO chips constitute two ranks to be simultaneously accessed. In this constitution, without increasing a terminal capacity of a data signal, a constitution freedom degree of a memory capacity is enhanced, a wiring length on the interposer substrate can be reduced, and characteristics can accordingly be improved.

Moreover, an SPD chip is preferably mounted on an uppermost stage of one of the two DRAM chip laminates.

According to still another mode of the present invention, there is obtained a DRAM module comprising: a system input/output terminal via which a system data signal having a predetermined data width is input/output; and a plurality of memory chips which transmit/receive an internal data signal broader than the system input/output terminal, the module further comprising: an IO chip having a function of performing conversion between the system data signal and the internal data signal in the system input/output terminal, the plurality of memory chips being stacked on the IO chip and being connected to the IO chip via through electrodes extending through the plurality of stacked memory chips, a plurality of banks controlled by individual array control circuits being constituted inside each DRAM chip.

According to further mode of the present invention, there is obtained a memory module comprising: a system input/output terminal via which a system data signal having a predetermined data width is input/output; and a plurality of memory chips which transmit/receive an internal data signal broader than the system input/output terminal, the module further comprising: an IO chip including a function of performing conversion between the system data signal and the internal data signal in the system input/output terminal, the plurality of memory chips being stacked on the IO chip and being connected to the IO chip by through electrodes extending through the plurality of stacked memory chips, each of the stacked DRAM chips comprising a pad for exclusive use in a test and a test circuit connected to the pad for exclusive use in the test.

In this constitution, a test command, test address, and test data signal are supplied from the pad for exclusive use in the test in synchronization with a test trigger signal at a DRAM chip test time, and an address, command, and data signal produced by the test circuit are received by a latch signal for a test produced by the test circuit to start an internal operation.

BRIEF DESCRIPTION OF THE DRAWINGS

FIG. 10 is a diagram showing a signal relation shown in FIG. 6;

DESCRIPTION OF THE PREFERRED EMBODIMENT

Figure 1:
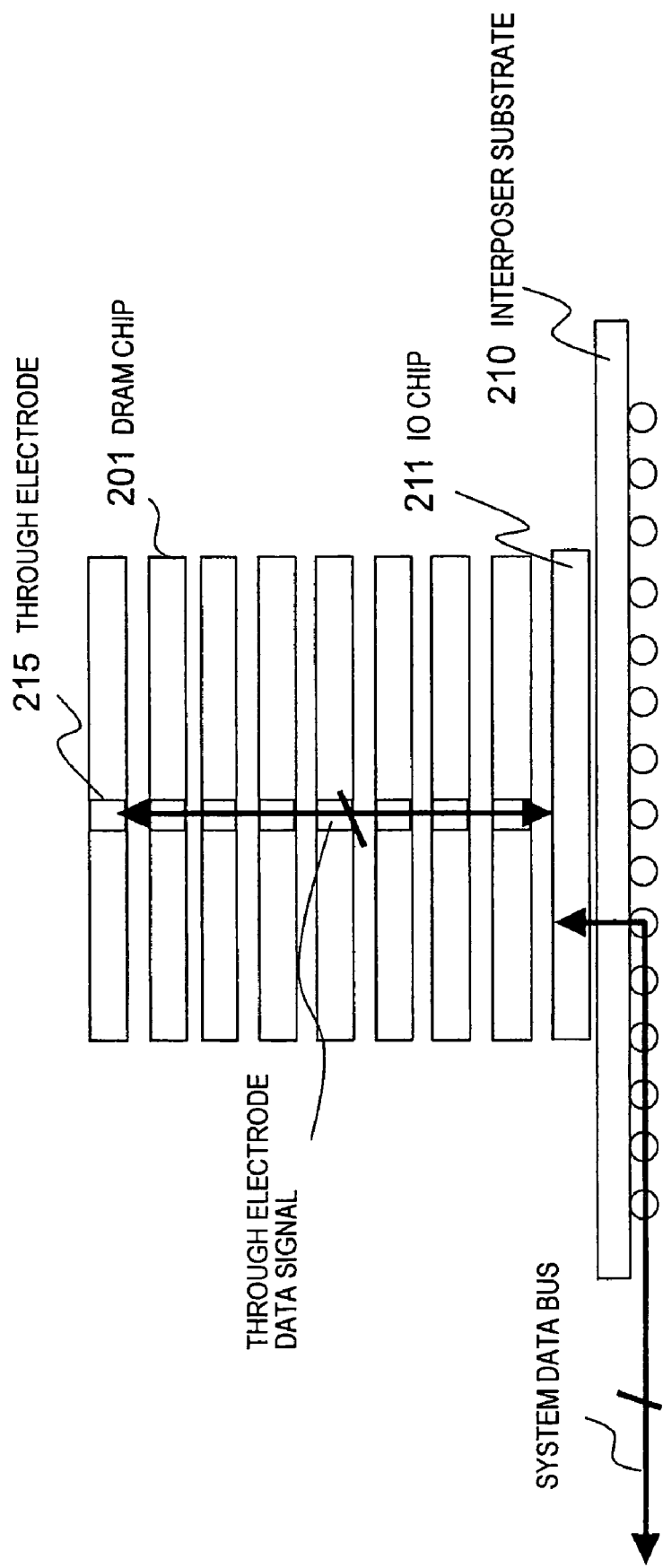
FIG. 1 is a diagram showing a schematic constitution of a memory module according to the present invention.

Referring to FIG. 1, a memory module according to a first embodiment of the present invention is shown. The memory module shown in FIG. 1 is capable of inputting/outputting a data signal corresponding to a data width of a plurality of DRAM chips as a memory data bus width in the same manner as in the memory module shown in FIG. 40. The memory module shown in FIG. 40 can be formed in a stacked structure shown in FIG. 1 in this manner to constitute a memory system including a plurality of memory sub-systems in the whole memory system and having a data rate of 12.8 GBps in each memory sub-system and capable of increasing a memory capacity by expansion and reducing a mounting area.

The shown memory module comprises an interposer substrate 210, an IO chip 211 mounted on the interposer substrate 210, and eight DRAM chips 201 stacked on the IO chip 211. Here, first to eighth DRAM chips will be referred to upwards from the DRAM chip of a lowermost layer adjacent to the IO chip 211. The memory module mentioned herein indicates a constituting unit of a memory sub-system comprising a plurality of DRAM single bodies so as to satisfy a memory capacity required by a chip set (CPU) and the data rate (data bus width (64, 72, 128, 144, 16 for RDRAM)×transfer rate).

Next, parts constituting the memory module will be described. Each DRAM chip 201 has a thickness of about 50 μm, the IO chip 211 is connected to the respective DRAM chips 201 by through electrodes 215, and a data signal is transmitted/received with respect to the IO chip 211 via the through electrodes 215. Here, the through electrodes 215 are chip connecting electrodes each extending to the other surface from one surface of each DRAM chip 201, and it is assumed in this example that 72×4 (=288) through electrodes formed of copper or aluminum are disposed.

Furthermore, the interposer substrate 210 is formed of silicon, has BGA terminals corresponding to on-board mounting pitches of all system data signals, system address signals, system control signals, and system clock signals necessary for constituting a function of the memory sub-system of a channel, and includes a function capable of connecting each signal BGA terminal to each signal pad on the IO chip formed of a silicon chip by a substrate wiring and bump.

Moreover, the IO chip 211 includes pads and interface circuits of all the system data signals, system address signals, system control signals, and system clock signals necessary for constituting the function of the memory sub-system of the channel. Here, the channel is a unit of data to be processed by the chip set (CPU), and here, for example, 64 or 72 bits are assumed.

Roughly speaking, the IO chip 211 includes a function of re-constituting a signal input from the chip set in order to operate the DRAM chips 201, a function of transmission to the DRAM chips 201 from through electrode 215 terminals, a function of receiving the signal from the DRAM chips 201 from the through electrode 215 terminal, and a function of re-constituting the data signal received from the DRAM chip 201 to transmit the system data signal.

The shown memory module comprises the interposer substrate 210 including the BGA terminals for all the system data signals, system address signals, system control signals, and system clock signals necessary for constituting the function of the memory sub-system of the channel. The BGA terminals of the interposer substrate 210 are connected to a pad for input/output and a pad for input of each input/output circuit on the IO chip 211. Data signal terminals, address signal terminals, and control signal terminals of the plurality of DRAM chips 201 stacked on the IO chip 211 and IO chip 211 are bonded by the through electrodes 215, and the data signal, address signal, and control signal between the chips are received/transmitted via the through electrode 215. A power supply and GND are supplied to the pads on the IO chip 211 from the BGA terminals of the interposer substrate 210, and supplied to a power supply of each DRAM chip 201 and a GND terminal via the through electrode 215.

Here, each DRAM chip 201 includes the number, which is 2n (n is a natural number of 1 or more) times that of system data buses, of through electrode data signal terminals for write and read, or bidirectional terminals. On the other hand, the IO chip 211 includes the number, which is 2n times that of system data buses, of through electrode data signal terminals for write and read, or bidirectional terminals.

Mutual data transfer is performed between the DRAM chips 201 and the IO chip 211 comprising this constitution via data terminals of the through electrodes 215.

In this case, the IO chip 211 has a serial/parallel circuit which serial/parallel converts 2n data signals per continuous terminal transferred via a system data bus to simultaneously transfer the data signals to the DRAM chips 201. Furthermore, the IO chip 211 includes a parallel/serial circuit, and parallel/serial converts 2n data per terminal transferred from the DRAM chip 201 to output continuous 2n data to the system data bus.

Furthermore, the IO chip 211 includes an interface with a system data bus of 64 mbits or 72 mbits including a parity bit (m is a natural number of 1 or more).

The data signal terminal of each DRAM chip 201 is connected to that of the IO chip 211 via the through electrode 215. In this case, the through electrode 215 which is a data signal line is shared by the DRAM chips 201. The address signal terminals of the respective DRAM chips 201 share the through electrode 215 as an address signal line, and are connected to the address signal terminal of the IO chip 211. Furthermore, the control signal terminals of the respective DRAM chips 201 share the through electrode 215 as a control signal line, and are connected to the control signal terminal of the IO chip 211.

It is to be noted that in this example, after re-wiring by a wafer package process (WPP), the bumps are formed on the IO chip 211.

Figure 40:
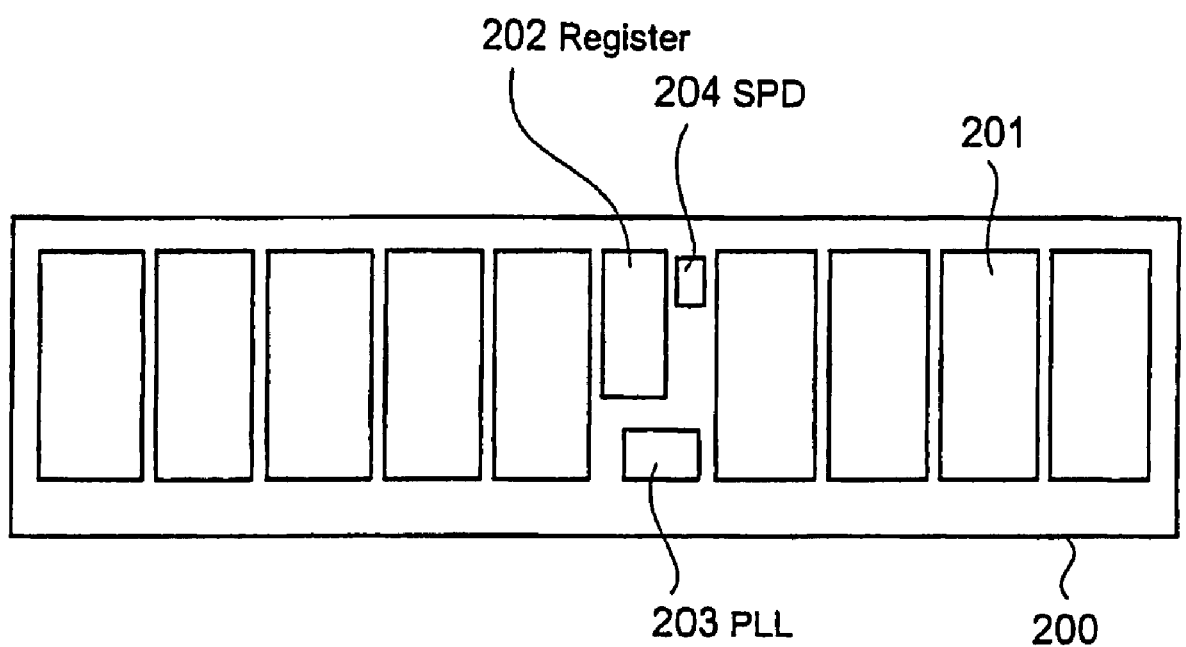
FIG. 40 is a plan view showing a conventional DRAM module.

Furthermore, an SPD may also be disposed in the memory module in the same manner as in FIG. 40. In this case, the SPD writes information such as a memory capacity, bank constitution, and assured operation speed of the memory module, and the chip set includes a function of referring to the information to automatically set control conditions at a system boot time. When the SPD chip is disposed on a laminate of the DRAM chips 201, the input/output signal terminal of the SPD chip is connected to an SPD input/output terminal pad on the IO chip 211 via the through electrode 215. Each of the DRAM chips 201 includes the through electrode for SPD input/output signal, which is not used in the DRAM chip 201.

Here, the DRAM chips 201 constituting the laminate have the same pattern in forming a pattern other than a pattern of the through electrode 215. Since the same pattern is formed on all the DRAM chips 201 to be stacked in this manner, a fuse device is separately disposed beforehand, and is cut for each of the DRAM chips 201 so that a signal to each of the DRAM chips 201 from the IO chip 211 can be identified.

The memory module according to a second embodiment of the present invention will be described with reference to FIG. 2. Each DRAM chip 201 shown in FIG. 2 comprises a counter circuit 300 which produces a collation signal with which a control signal or an address signal transmitted from the IO chip 211 is collated to receive a signal, and a chip identification code production circuit 301 is disposed in the IO chip 211.

Figure 2:
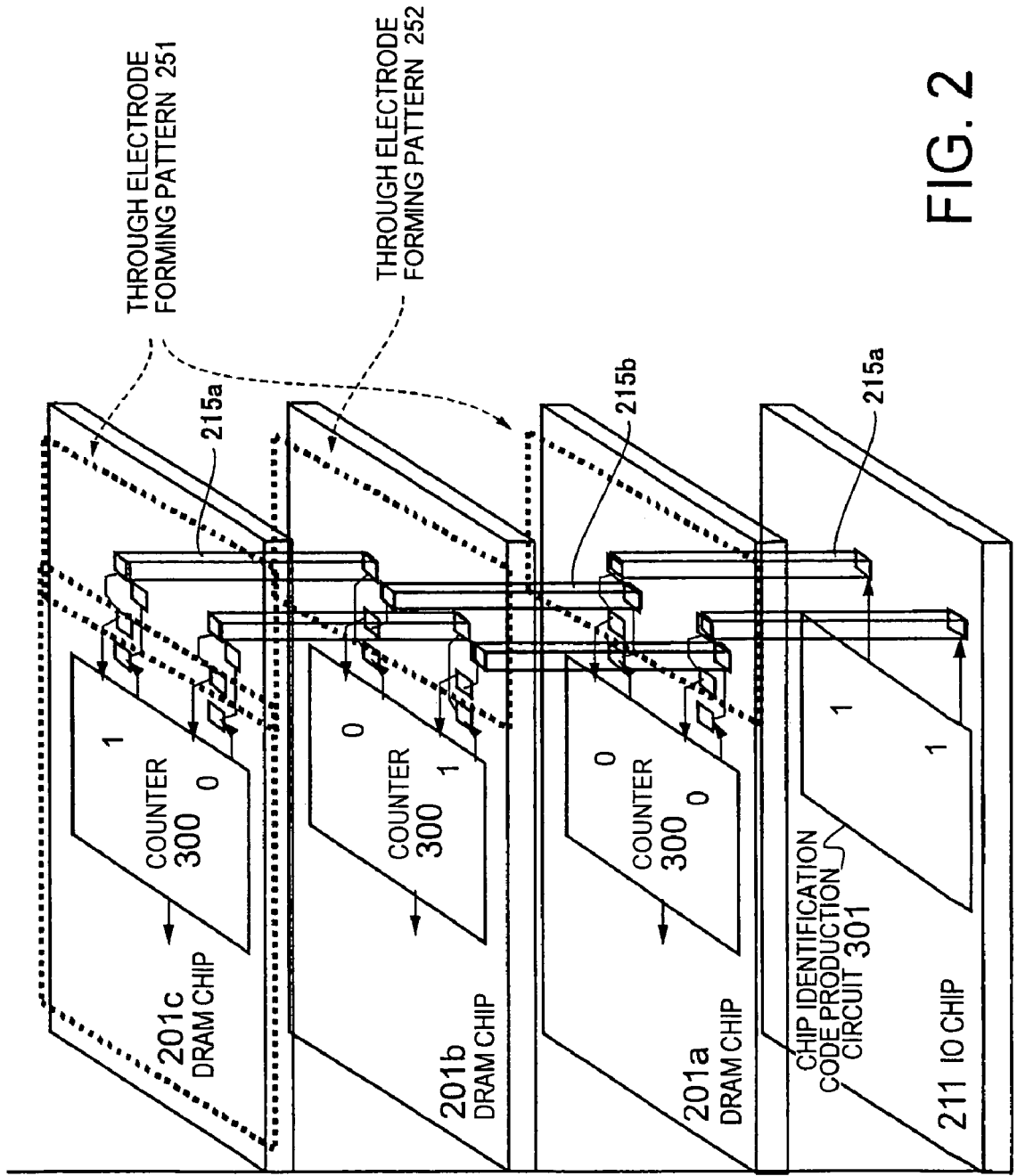
FIG. 2 is an exploded diagram showing the constitution of the memory module according to an embodiment of the present invention.

Furthermore, as shown in FIG. 2, DRAM chips 201a and 201c comprises the same through electrode forming pattern 251. On the other hand, a DRAM chip 201b comprise a through electrode forming pattern 252 different from the through electrode forming pattern 251 of the DRAM chips 201a and 201c. The IO chip 211 is connected to the through electrode forming pattern 251 of the DRAM chip 201a by through electrodes 215a, the DRAM chip 201a is connected to 201b by through electrodes 215b, and further the DRAM chip 201b is connected to 201c by the through electrodes 215a. Only two through electrodes are shown for the shown through electrodes 215a and 215b, and two or more electrodes may also be disposed. It is to be noted that the other through electrodes 215 are omitted for simplification of the drawing.

Specifically, the through electrode forming pattern 251 on the DRAM chip 201 a inputs from the through electrodes 215a with respect to the counter 300 on the DRAM chip 201a, and outputs an output from the counter 300 to the through electrodes 215b. Furthermore, the through electrode forming pattern 252 of the DRAM chip 201b supplies the output from the DRAM chip 201a with respect to the counter 300 on the DRAM chip 201b, and the output from the counter 300 of the DRAM chip 201b is output to the through electrode forming pattern 251 of the DRAM chip 201c of an upper layer via the through electrodes 215a. In this constitution, count values of the respective DRAM chips 201a, 201b, 201c are successively output to the DRAM chip of the upper layer.

In this manner, the shown memory module comprises a constitution in which the DRAM chips 201 comprising mutually different through electrode forming patterns 251 and 252 are alternately stacked. According to this constitution, signals of a plurality of bits output from the IO chip 211 are input into the counter 300 of the DRAM chip 201a of the lowermost layer, the output of the counter 300 is supplied to the counter 300 of the next layer, and incremented signals are successively transmitted to the DRAM chip of the uppermost layer. In this constitution, different counter output values can be obtained in the respective DRAM chips, and accordingly each DRAM chip 201 is capable of producing the collation signal using the counter output value inside to identify the control signal and address signal with respect to each DRAM chip 201.

The DRAM chips 201 comprising the above-described two types of through electrode forming patterns 251 and 252 can be easily manufactured, when the input/output of the counter 300 is only replaced by two types of mask patterns at a through electrode forming time.

Figure 3:
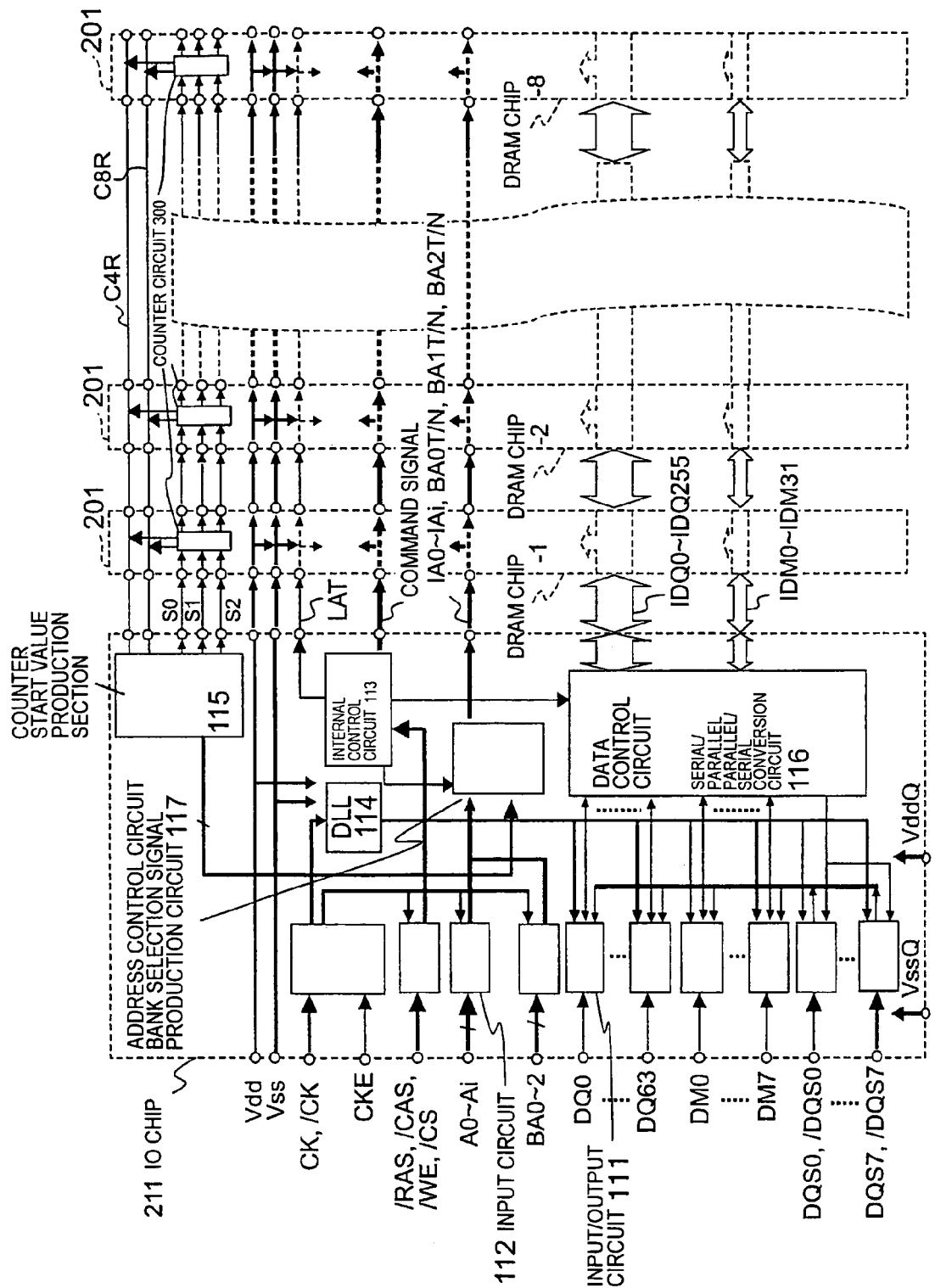
FIG. 3 is a block diagram showing a whole constitution of the memory module shown in FIG. 2.
Figure 4:
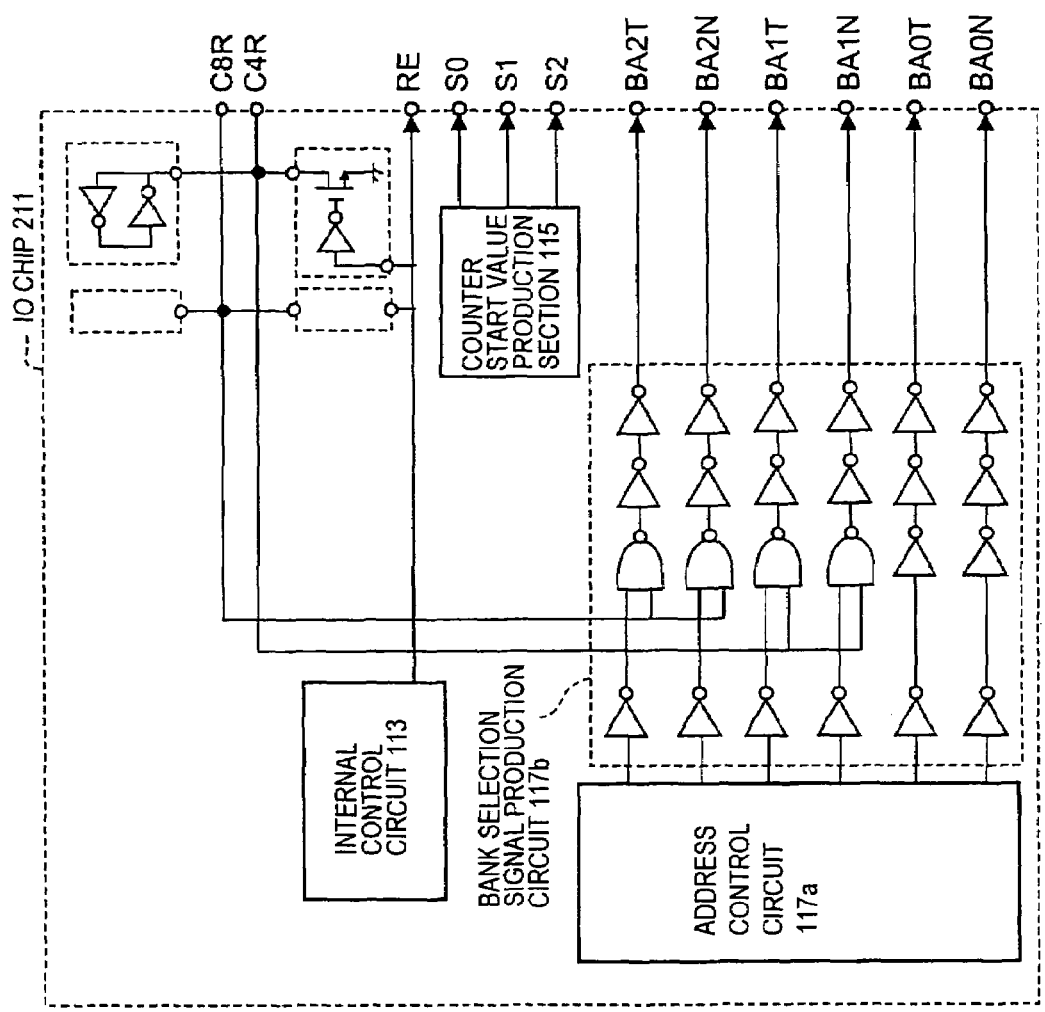
FIG. 4 is a block diagram more concretely showing a partial constitution of an IO chip 211 shown in FIG. 3.
Figure 5:
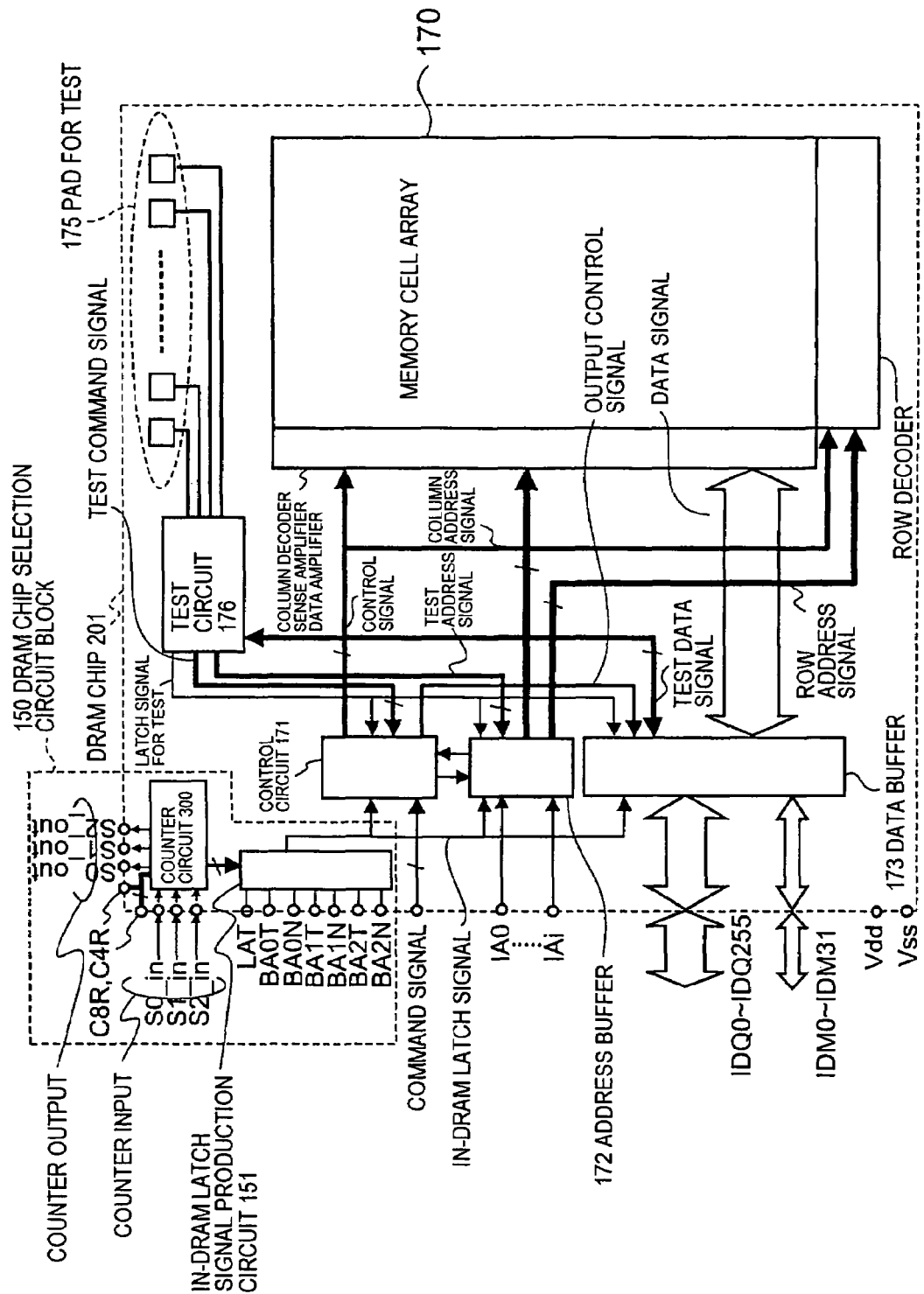
FIG. 5 is a block diagram showing a concrete constitution of a DRAM chip 201 shown in FIG. 3.
Figure 6:
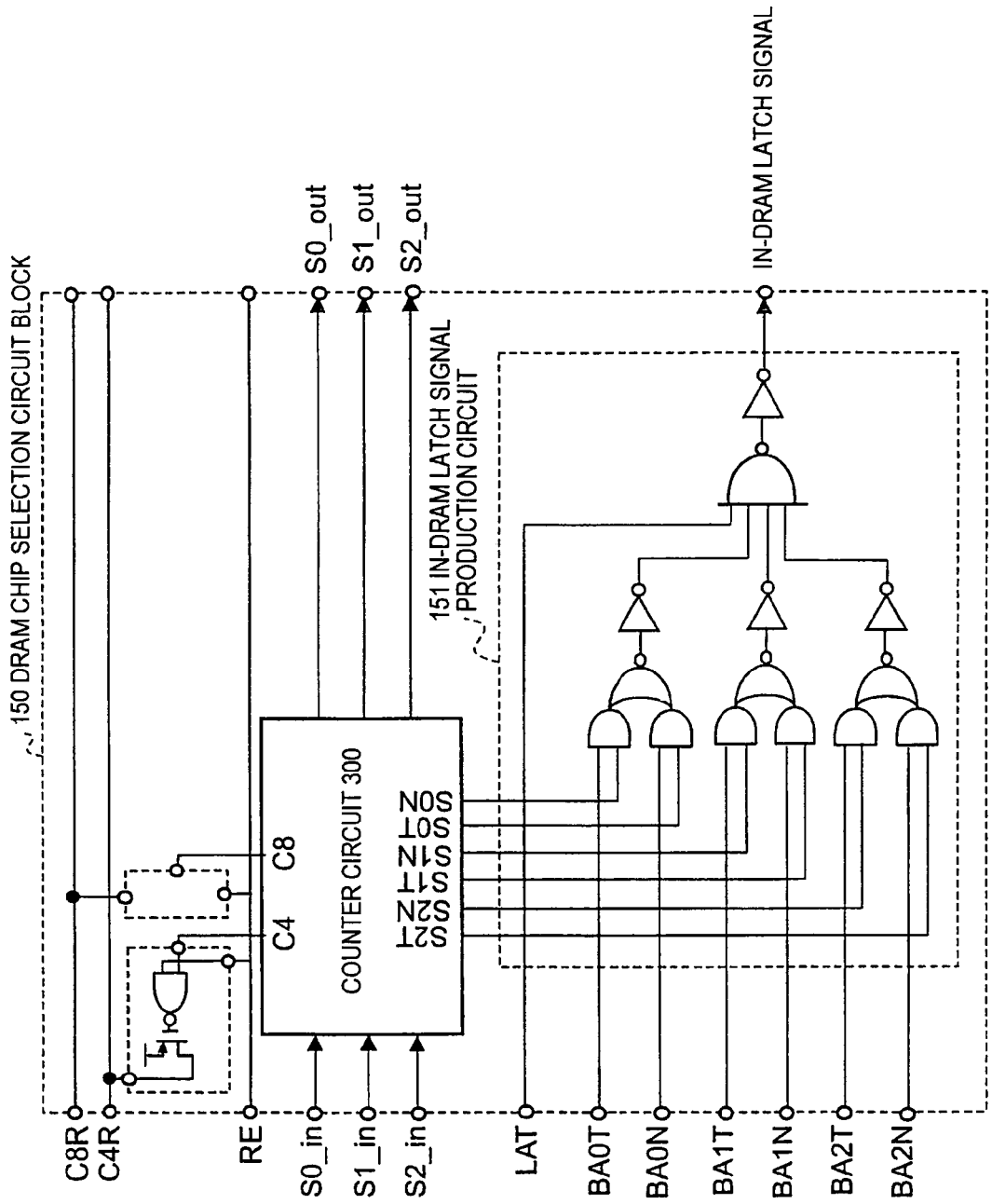
FIG. 6 is a block diagram showing a DRAM chip selection circuit for use in the DRAM chip 201 shown in FIG. 5 in more detail.

Next, FIG. 3 shows a concrete example of the whole memory module shown in FIG. 2. In FIG. 3, as shown in FIG. 2, eight DRAM chips 201 (DRAM-1 to DRAM-8) are mounted on the single IO chip 211. FIG. 4 more concretely shows the constitution of a part of the IO chip 211 shown in FIG. 3, FIG. 5 shows the concrete constitution of the DRAM chip 201 shown in FIG. 3, and further FIG. 6 shows a DRAM chip selection circuit for use in the DRAM chip 201 shown in FIG. 5 in more detail.

Referring to FIG. 3, the IO chip 211 includes an input/output circuit 111, input circuit 112, internal control circuit 113, DLL 114, and counter start value production section 115 for transmitting/receiving various signals with respect to the interposer substrate (not shown). Furthermore, the chip comprises a data control circuit, serial/parallel conversion circuit, parallel/serial conversion circuit, address control circuit, and bank selection signal production circuit. FIG. 3 shows a combination of the data control circuit, serial/parallel conversion circuit, and parallel/serial conversion circuit by a reference numeral 116, and a combination of the address control circuit and bank selection signal production circuit by a reference numeral 117. In FIG. 4, the address control circuit and bank selection signal production circuit are denoted with reference numerals 117a and 117b, respectively.

As shown in FIG. 3, system clock signals CK, /CK, system address signals A0 to Ai, and system bank address signals BA0 to BA2 are supplied together with control signals such as /RAS, /CAS, /WE, /CS, and strobe signal DQS to the IO chip 211 from the chip set (not shown) which is a memory controller. Furthermore, data signals DQ0 to DQ63 and DM0 to DM7 are transmitted/received between the chip set and the IO chip 211. A conventional circuit is usable as the data control circuit and serial parallel/parallel serial conversion circuit 116 shown in FIG. 3. Here, although not described in detail, internal data signals IDQ0 to 255, IDM0 to 31 are transmitted/received between the circuit 116 and each DRAM chip 201. It is to be noted that in the embodiment of the present invention, the DLL 114 is disposed only in the IO chip 211, and is not disposed in each DRAM chip 201.

System address signals a0 to Ai, and system bank address signals BA0 to BA2 are supplied to the circuit 117 of the IO chip 211 shown in FIG. 3, and the circuit is connected to the counter start value production section 115. Furthermore, the counter start value production section 115 supplies three-bit count signals S0 to S2 to the counter circuit of the DRAM chip 201 (DRAM-1) of the lowermost layer.

FIG. 4 also concretely shows a part of the IO chip 211 shown in FIG. 3.

FIG. 4 shows the internal control circuit 113, counter start value production section 115, address control circuit 117a, and bank selection signal production circuit 117b in the IO chip 211. Among the circuits, the internal control circuit 113 outputs an initialization signal RE. This initialization signal RE usually takes a high level, and is generally a pulse signal having a low level at an initialization time of the DRAM chip 201 on the module, performed in the system.

Figure 7:
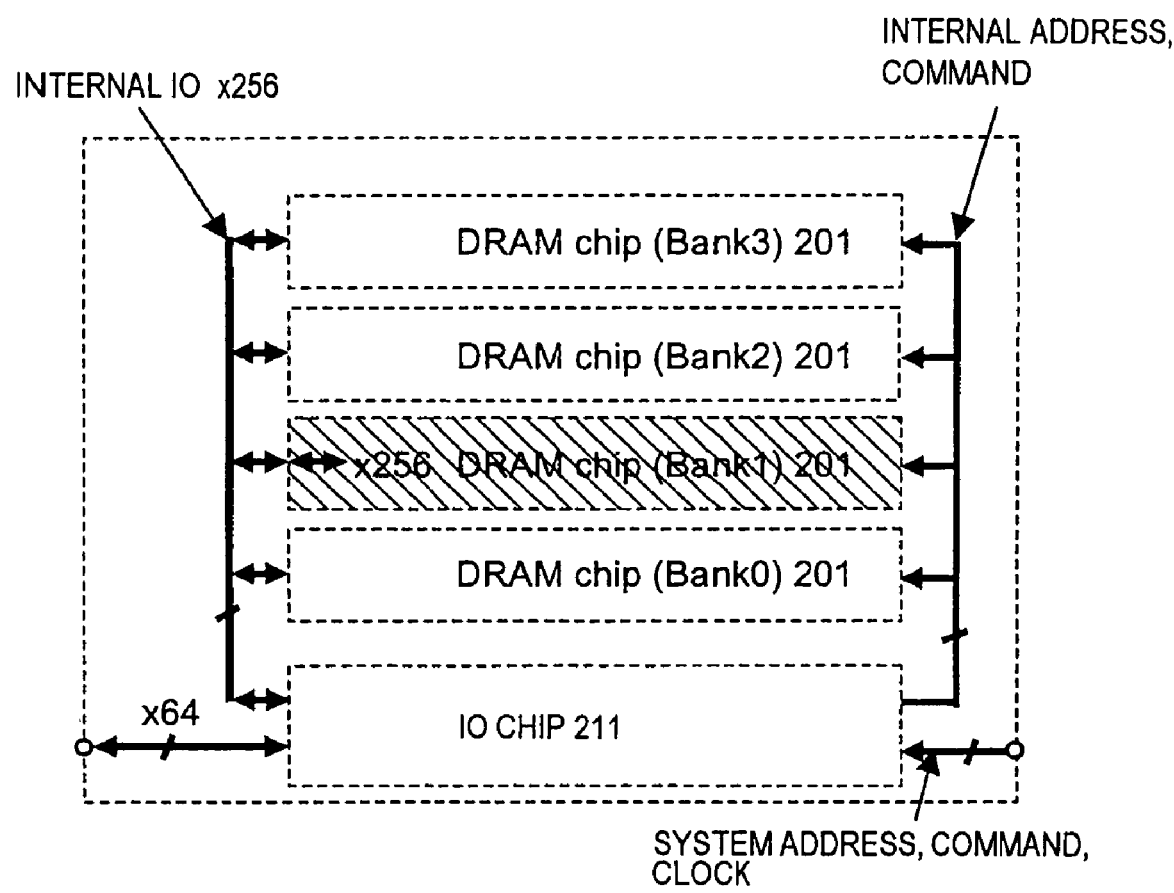
FIG. 7 is an explanatory view showing an example of the memory module according to the present invention together with an access method.
Figure 8:
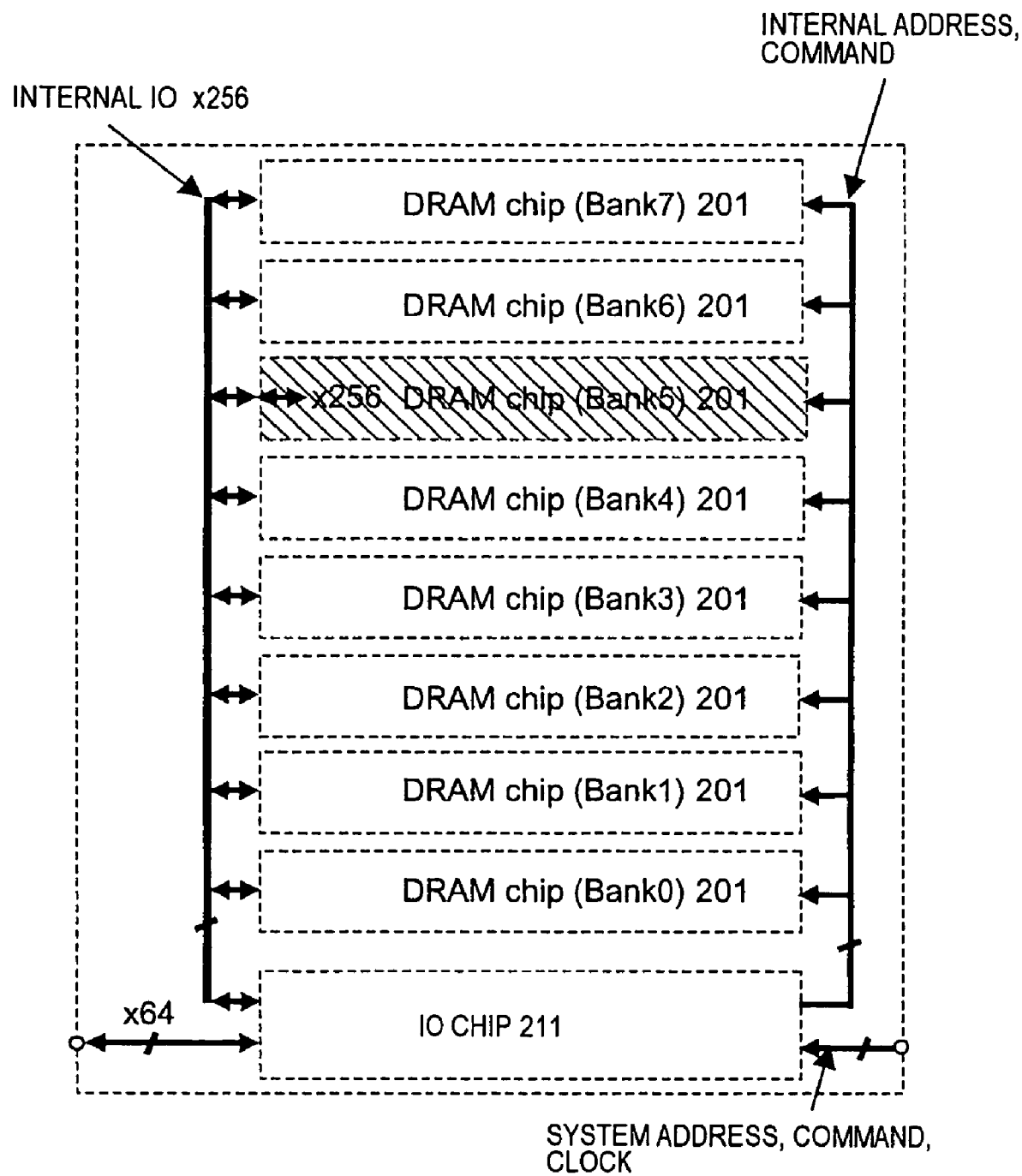
FIG. 8 is an explanatory view showing another example of the memory module according to the present invention together with the access method.

In the memory module shown in FIG. 3, four DRAM chips 201 may also be stacked on the single IO chip 211 as shown in FIG. 7, and eight DRAM chips 201 may also be stacked on the single IO chip 211 as shown in FIG. 8. In either FIG. 7 or 8, as shown by slanted lines, only one DRAM chip is selected from the td DRAM chips 201. In this manner, for the memory module according to the present invention, the number of DRAM chips 201 stacked on the IO chip 211 can be changed, and therefore the IO chip 211 needs to be capable of judging the number of stacked DRAM chips 201.

In the example shown in FIGS. 7 and 8, the respective DRAM chips 201 constitute a single bank, and further each DRAM chip 201 comprises x256 data terminals. On the other hand, the IO chip 211 comprises x64 system data lines. Therefore, the data terminals of the DRAM chip and the system data lines of the IO chip 211 have a relation of 4:1. Therefore, in this constitution, an output operation frequency of the DRAM chip 201 is reduced to ¼, and a test in a wafer state is also easy. One read/write access with respect to the memory module is performed with respect to one DRAM chip 201.

Figure 9:
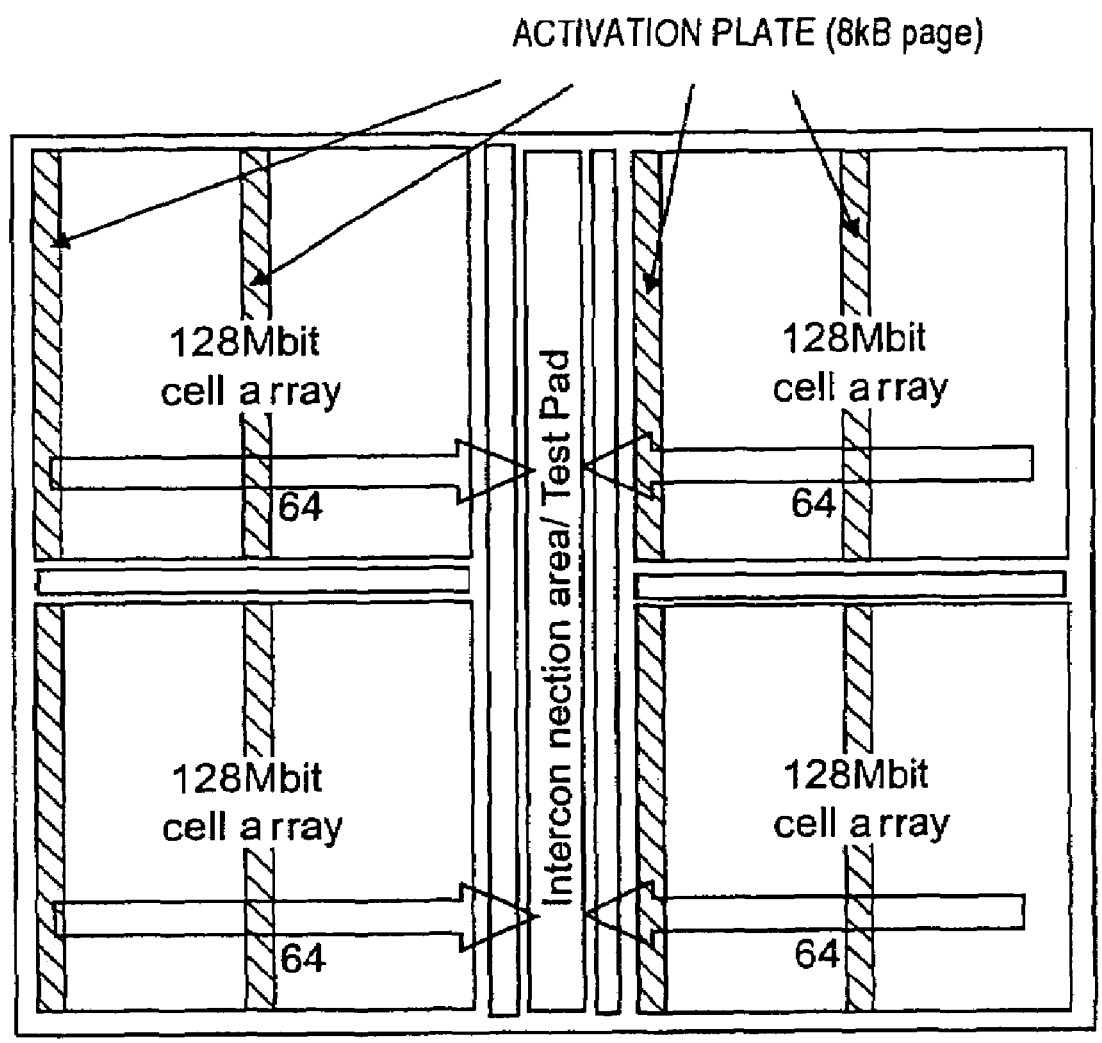
FIG. 9 is a diagram showing an activated state of the DRAM chip shown in FIGS. 7 and 8.

Referring to FIG. 9, a bank constitution of each DRAM chip 201 shown in FIGS. 7 and 8 is shown. The DRAM chip 201 shown in FIG. 9 comprises a capacity of 512 Mbit, and includes a single bank constitution in the same manner as in the existing 512 Mbit DDRII DRAM. The shown DRAM chip 201 is divided into four 128 Mbit cell arrays, and an interconnection area and test pad are disposed in a middle portion. When the address of the DRAM chip is designated, two regions are activated in each cell array region, and it is possible to read or write data signals of 256 bits in total, 64 bits from each array. Here, an activated state means a state in which a sense amplifier is operable, and a data unit in this state is referred to as a page. As a result, the shown DRAM chip 201 has a page of 8 kbytes.

An operation of the memory module shown in FIGS. 3 to 6 will be described on the assumption of the constitution shown in FIGS. 7 to 9. As also apparent from FIG. 3, in addition to the system address signals A0 to Ai, the system bank address signals BA0 to BA2 of the system are supplied to the address control circuit 117a of the IO chip 211 shown in FIG. 4.

In this state, the address control circuit 117a shown in FIG. 4 judges the bank of the target DRAM chip 201 from the bank address signals BA0 to BA2, here, a stacked position to output the position to the bank selection signal production circuit 117b.

A laminate number recognition signal is supplied to the bank selection signal production circuit 117b via laminate number recognition signal lines C8R, C4R.

In this example, as shown in FIG. 8, when eight DRAM chips 201 are stacked, both the laminate number recognition signal lines C8R, C4R become high. As a result, bank selection signals BA0N/T to BA2N/T produced from the bank selection signal production circuit 117b of the IO chip 211 are all enabled, and the memory module takes in bank address signals BA0, 1, 2 of the system to operate in an eight-bank constitution.

On the other hand, when four layers of DRAM chips 201 are stacked as shown in FIG. 7, the laminate number recognition signal line C8R is low, C4R is high, the bank selection signals BA0N/T to BA1N/T produced from the bank selection signal production circuit 117b of the IO chip 211 are enabled, and BA2N/T is fixed at a high level. As a result, the memory module takes in the bank address signals BA0, 1 of the system to operate in a four-bank constitution.

The internal control circuit 113 shown in FIG. 4 produces the initialization signal RE which usually has a high level and turns to a pulse signal having a low level at an initialization time of the DRAM chip 201 on the module. The initialization signal RE initializes the levels on the laminate number recognition signal lines connected to the laminate number recognition signal lines (C4R, C8R), respectively. On the initialization by the initialization signal RE, the states of the laminate number recognition signal lines (C4R, C8R) have levels in accordance with the number of DRAM chips 201 to be stacked as described above.

Moreover, the counter start value production section 115 of FIG. 4 outputs the count signals S0 to S2 of three bits. In this example, the count signals S0 to S2 are assumed to be 111. As a result, the counter circuit 300 of the DRAM chip 201 of the lowermost layer increments only 1, and outputs 000. Subsequently, the counter circuit 300 of the DRAM chip 201 of each layer similarly increments only 1, and successively sends out the count value to the upper layer.

As a result, when the DRAM chips 201 are stacked, the laminate number recognition signal line C4R becomes high by an output from the fourth DRAM chip 201 from the lower layer. Since the eighth DRAM chip 201 from the lower layer is not stacked, the laminate number recognition signal line C8R remains low. When eight layers of DRAM chips 201 are stacked, the laminate number recognition signal line C4R becomes high by the output from the fourth DRAM chip 201 from the lower layer, and the laminate number recognition signal line C8R becomes high by the output from the eighth DRAM chip 201 from the lower layer. Accordingly, the laminate number of the DRAM chips 201 can be recognized.

Next, the DRAM chip 201 shown in FIG. 5 includes a DRAM chip selection circuit block 150 including the counter circuit 300 connected to the counter start value production section 115 of the IO chip 211. The shown DRAM chip 201 comprises a control circuit 171, address buffer 172, and data buffer 173 in addition to a memory cell array 170 including a column decoder, sense amplifier, data amplifier, and row decoder.

Furthermore, the shown DRAM chip 201 is characterized in that a pad for test 175 and test circuit 176 are mounted on the DRAM chip 201 considering that each DRAM chip 201 cannot be tested in a stacked relation of the shown DRAM chip 201.

Here, referring also to FIG. 6, the above-described count signals S0 to S2 are supplied as count input signals S0_in to S2_in to the counter circuit 300 of the DRAM chip selection circuit block 150, and the count value incremented only by one are sent out as counter outputs S0_out to S2_out to the DRAM chip 201 of the upper layer.

Furthermore, the shown counter circuit 300 produces the collation signals (S0T/N to S2T/N) in response to the counter outputs S0_out to S2_out, and outputs the signals to an in-DRAM latch signal production circuit 151. The in-DRAM latch signal production circuit 151 collates the collation signals (S0T/N to S2T/N) applied from the counter circuit 300 with the bank selection signals (BA0T/N to BA2T/N) transmitted from the bank selection signal production circuit 117b of the IO chip 211 to produces an in-DRAM latch signal in the DRAM chip in a case of agreement. It is to be noted that, as shown in FIG. 3, a latch signal LAT is supplied to the shown in-DRAM latch signal production circuit 151 from the internal control circuit 113 in the IO chip 211.

The in-DRAM latch signals are applied to the control circuit 171, address buffer 172, and data buffer 173 of FIG. 5, and data signals of 256 bits are read from the memory cell array 170, or a writable state is attained with respect to the memory cell array 170.

It is to be noted that when the counter circuit 300 shown in FIG. 6 has four-layer and eight-layer structures, position control signals C4 and C8 are output to C4R, C8R via a logic circuit in order to identify the DRAM chip 201 positioned in an uppermost layer.

Each DRAM chip 201 comprising this constitution receives the bank selection signals (BA0T/N to BA2T/N) logically produced by the IO chip 211 to selectively operate by the operation of the DRAM chip selection circuit block 150.

Furthermore, as shown in FIG. 5, the in-DRAM latch signal is input into the control circuit 171 in the DRAM chip, the control signal of the DRAM chip 201 is produced in response to the command signal, and input into the address buffer 172 and data buffer 173, and the data signal transmitted from the IO chip 211 can be taken into the DRAM chip 201.

Moreover, it is seen that the number of stacked DRAM chips is recognized by the levels of the laminate number recognition signal lines C4R, C8R to allocate the logic level of the control signal or the address signal to the respective DRAM chips.

Furthermore, the shown test circuit 176 is connected to the control circuit 171, address buffer 172, and data buffer 173, latch signals for the test are output to these circuit 171 and buffers 172, 173, and a test command signal, test address signal, and test data signal are also output. Accordingly, the stacked DRAM chips 201 can be individually tested.

Referring to FIG. 10, the values of the count input signals S0_in to S2_in, output signals S0-out to S2_out, collation signal s (S0T/N to S2T/N), and position control signals C4 and C8 in the DRAM chip selection circuit block 150 shown in FIG. 6 are shown in order to the eighth layer from the first layer which is the lowermost layer.

In the DRAM chip 201 shown in FIG. 6, the counter circuit 300 is disposed in the selection circuit block 150, and the collation signals (S0T/N to S2T/N) in the DRAM chip 201 are produced by this counter circuit 300. In this manner, in the constitution using the counter circuit 300, as described with reference to FIG. 2, the mutually different through electrode forming patterns 251 and 252 need to be formed in the DRAM chip 201.

Figure 11:
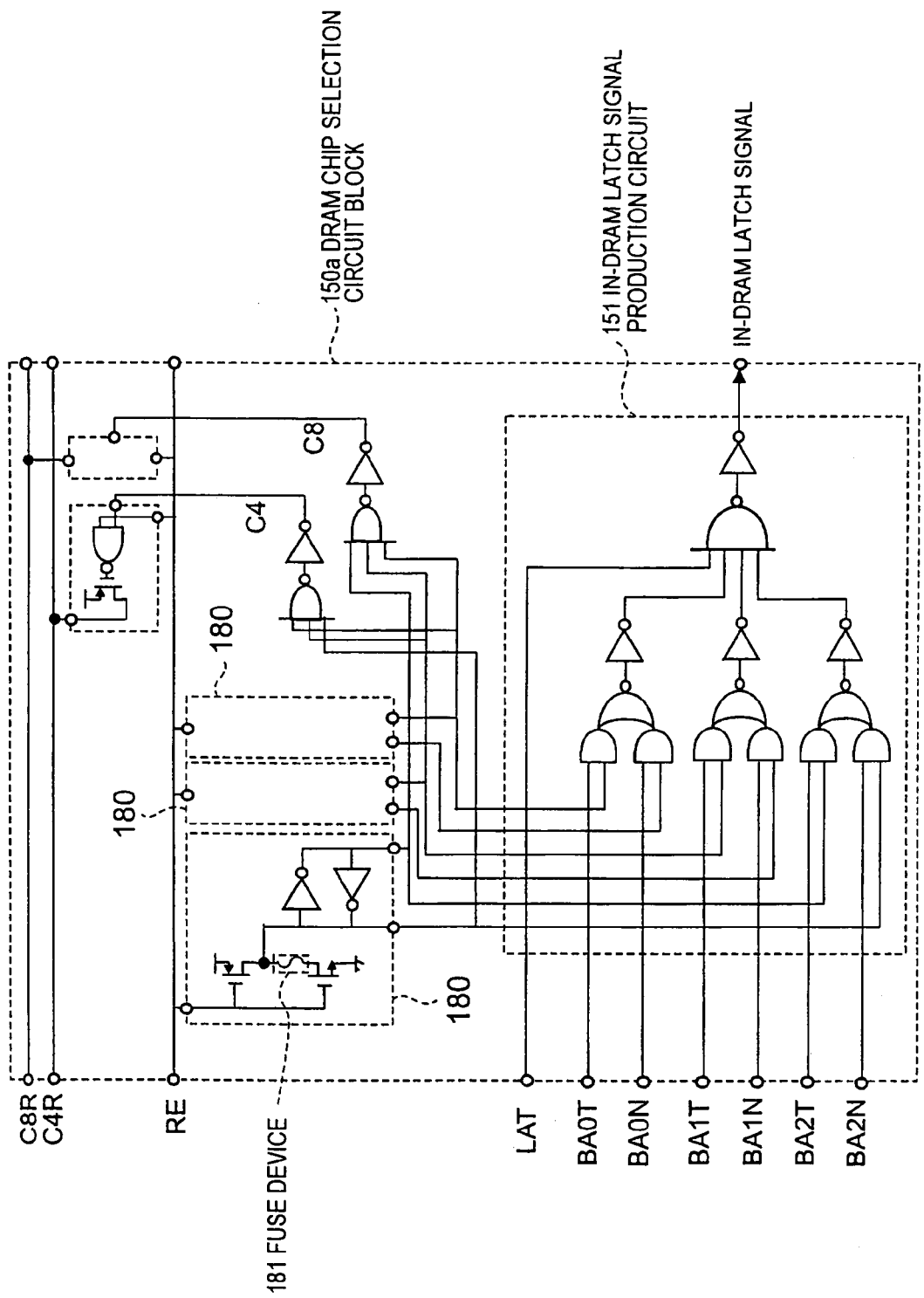
FIG. 11 is a block diagram showing another constitution example of the DRAM chip selection circuit for use in the DRAM chip 201 shown in FIG. 5.

A DRAM chip selection circuit block 150*a* shown in FIG. 11 comprises a constitution in which all the patterns of the stacked DRAM chips 201 are the same and the collation signals (S0T/N to S2T/N) can be produced in accordance with the stacked positions of the stacked DRAM chips 201. Specifically, the shown DRAM chip selection circuit block 150*a* includes a fuse circuit 180 which receives the initialization signal RE to operate instead of the counter circuit 300 (FIG. 6). Here, three fuse circuits 180 are disposed considering a case where eight DRAM chips 201 are stacked.

As apparent from the drawing, each fuse circuit 180 comprises a constitution in which a fuse device 181 is disposed between drains of N channel MOS and P channel MOS and a pair of inverter circuits are disposed on one end of the fuse device 181, and outputs of the opposite ends of the pair of inverter circuits are applied to the in-DRAM latch signal production circuit 151. The fuse device 181 is cut in accordance with the stacked position of the DRAM chip 201, and the collation signal can be produced in the same manner as in FIG. 6.

According to this constitution, the pattern of the DRAM chip 201 does not have to be changed for each layer, but the DRAM chips 201 of the fuse device 181 having different cut places need to be manufactured in accordance with the laminate number.

It is to be noted that the shown DRAM chip 201 changes the level of the laminate number recognition signal line (C4R, C8R) shared by each DRAM chip 201 and the IO chip 211 via the through electrode in response to the collation signal, and accordingly the DRAM chip of the uppermost layer can be identified.

Figure 12:
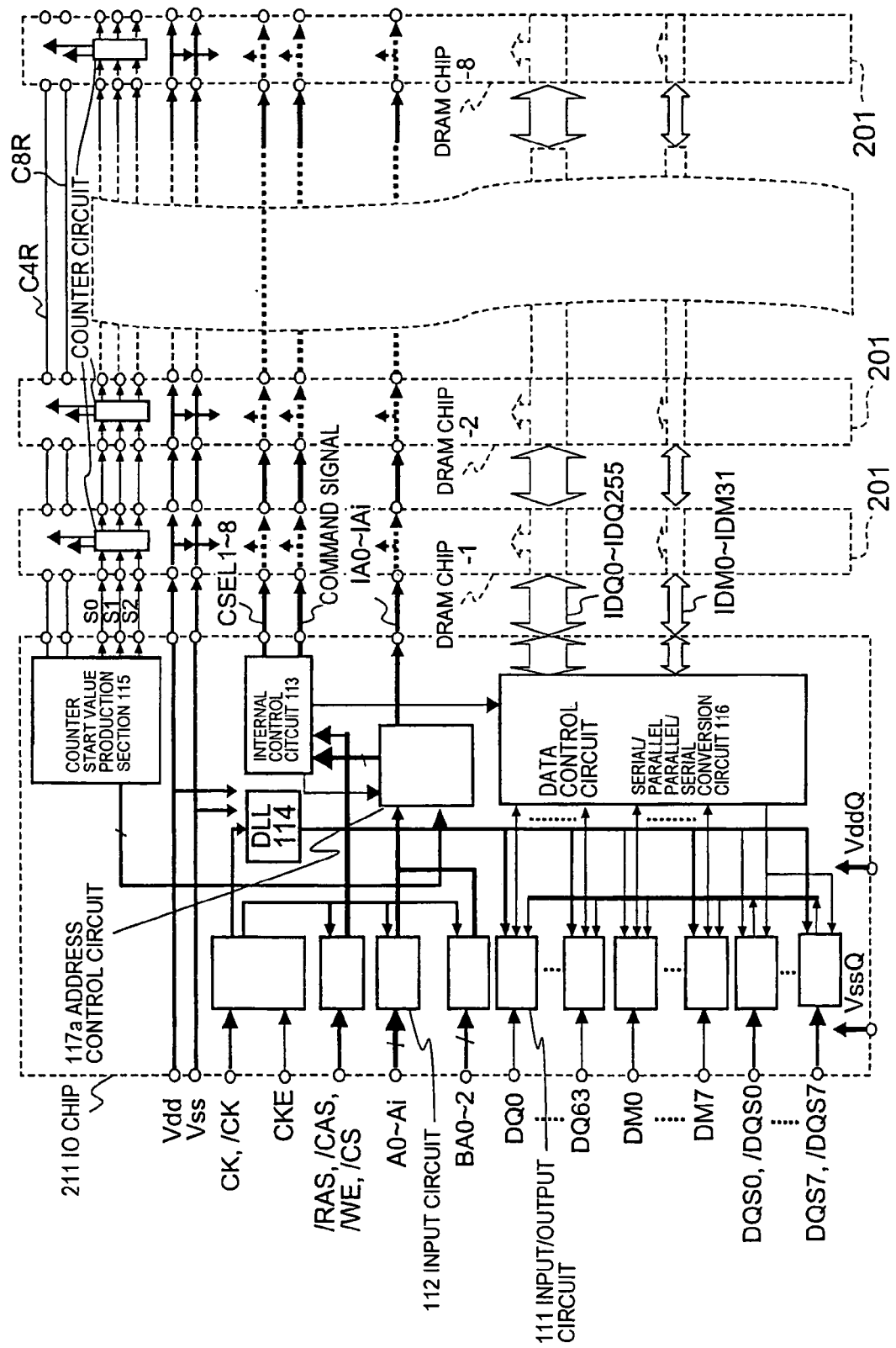
FIG. 12 is a block diagram showing another example of a method of selecting the DRAM chip according to the present invention.

Another example of a method of selecting the DRAM chip according to the present invention will be described with reference to FIGS. 12 to 14. The memory module shown in FIG. 12 is different from the memory module shown in FIG. 3 in that the module comprises the IO chip 211 and eight DRAM chips 201 and that chip select signals CSEL1 to 8 corresponding to the DRAM chips 201 are output to the DRAM chips 201 from the internal control circuit 113 through eight through electrode terminals. Therefore, the memory module is different from that of FIG. 3 in that the system address signals A0 to Ai and system bank address signals BA0 to 2 are supplied to the address control circuit 117*a* and that the bank selection signal production circuit 117*b* (FIG. 3) is not disposed.

Figure 13:
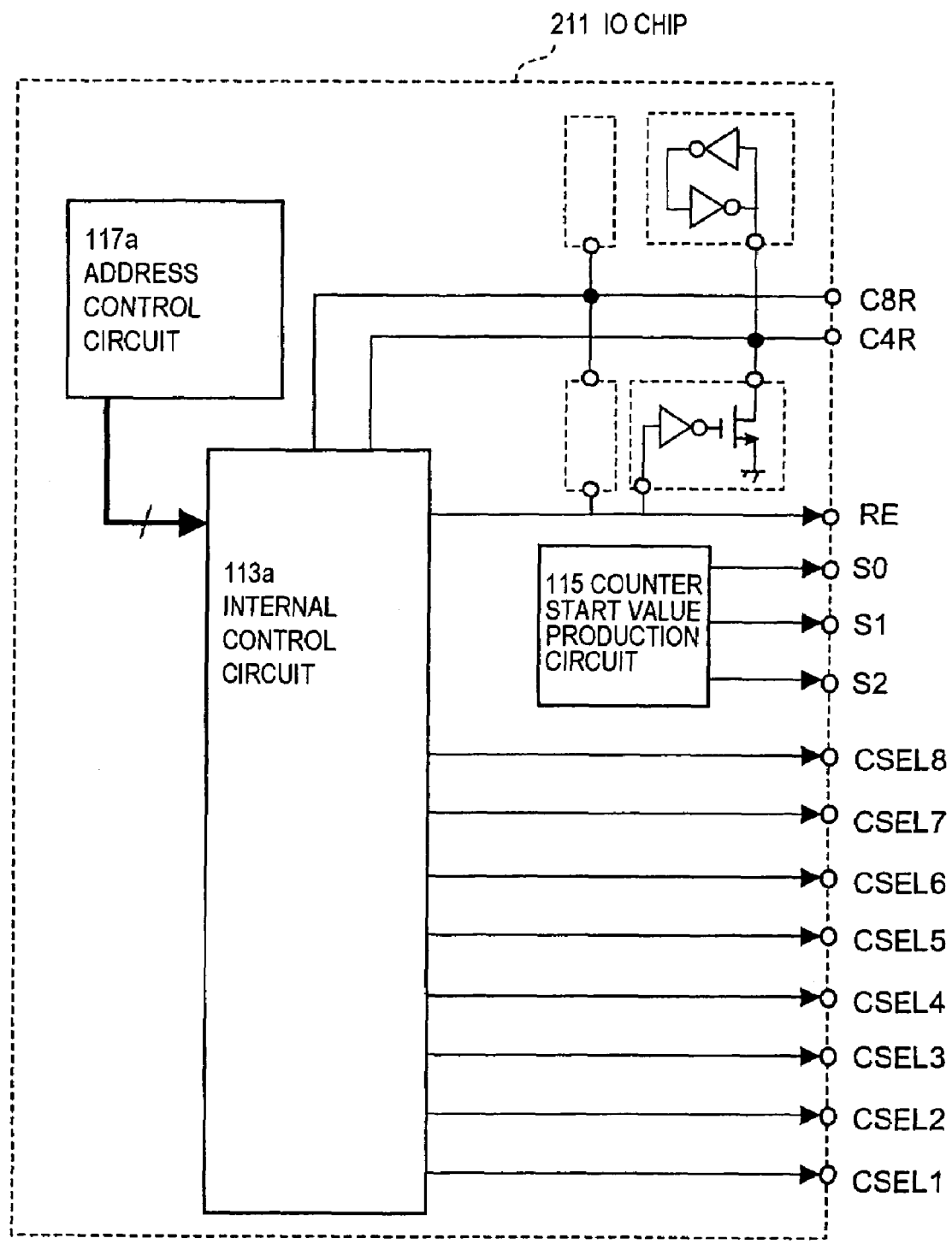
FIG. 13 is a block diagram concretely showing the constitution of the IO chip shown in FIG. 12.

The address control circuit 117*a* of the IO chip 211 shown in FIG. 13 produces an internal bank address signal from the system bank address signals BA0 to 2, and outputs the signal to an internal control circuit 113*a*. The internal control circuit 113*a* produces the chip selection signals CSEL1 to 8 from the internal bank address signal in accordance with the stacked positions of the stacked DRAM chips 201. Any through electrode terminal is selected from eight terminals to output the chip select signals CSEL1 to 8 to the through electrode terminal. Since the counter start value production section 115 and the laminate number recognition signal lines C4R, C8R have been described with reference to FIG. 4, they are not described in detail here.

Figure 14:
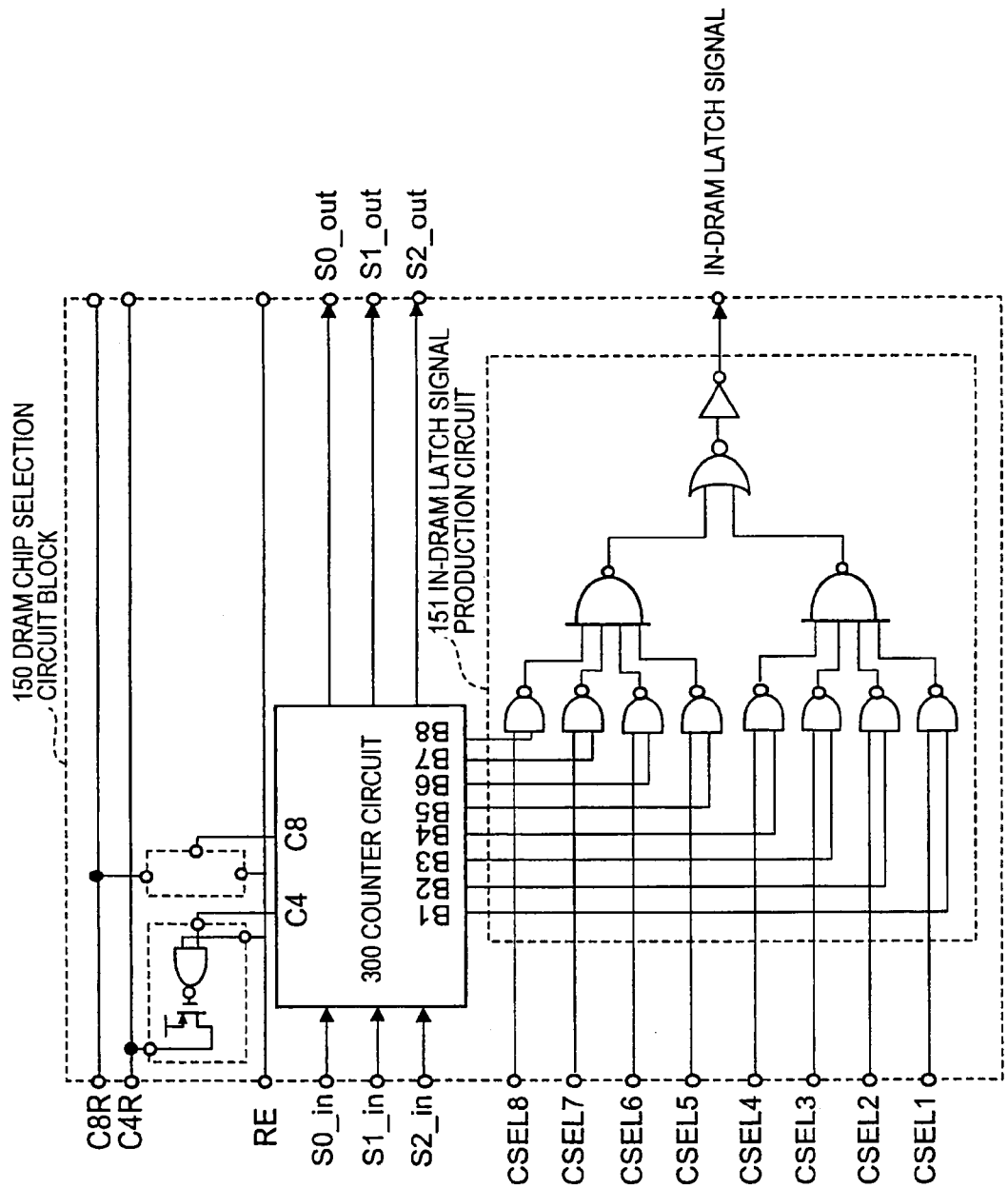
FIG. 14 is a block diagram showing the concrete constitution of the DRAM chip shown in FIG. 12.

Referring to FIG. 14, the DRAM chip selection circuit block 150 is shown which receives the chip selection signals CSEL1 to 8 and count signals S0 to S2 output from FIG. 13 to operate. The DRAM selection circuit block 150 shown in FIG. 14 receives the count signals S0 to S2 as the count input signals S0_in to S2_in to output the counter output signals S0_out to S2_out, and the number, corresponding to the laminate number of DRAM chips 201, of output terminals B1 to B8.

In this example, the counter circuit 300 selects one of output terminals b1 to 8 in accordance with the counter value to output the signal to the in-DRAM latch signal production circuit 151. In this case, for the output terminals B1 to B8, only the terminal corresponding to the layer number of the DRAM chip 201 indicates the high level, and the other terminals indicate the low level.

The chip selection signals CSEL1 to 8 any of which takes the high level are supplied to the shown in-DRAM chip latch signal production circuit 151 via the through electrodes. Therefore, the in-DRAM latch signal production circuit 151 of the DRAM chip 211 of the stacked position (layer number) outputs the in-DRAM latch signal, and only the signal from the selected through electrode is taken into the DRAM chip 201.

Here, an example in which the in-DRAM latch signal is produced by the chip selection signal CSEL and operation is performed in the same manner as in the above-described method, but the method of the present system may be means for receiving/transmitting the signals of the IO chip 211 and individual DRAM chips 201.

In FIG. 14, the DRAM chip selection circuit block 150 has been described which identifies the stacked position to output the in-DRAM latch signal using the counter circuit 300, but instead of the counter circuit 300, the fuse circuit 180 may also be disposed in accordance with the respective chip selection signals CSEL1 to 8 in the same manner as in FIG. 11.

Figure 15:
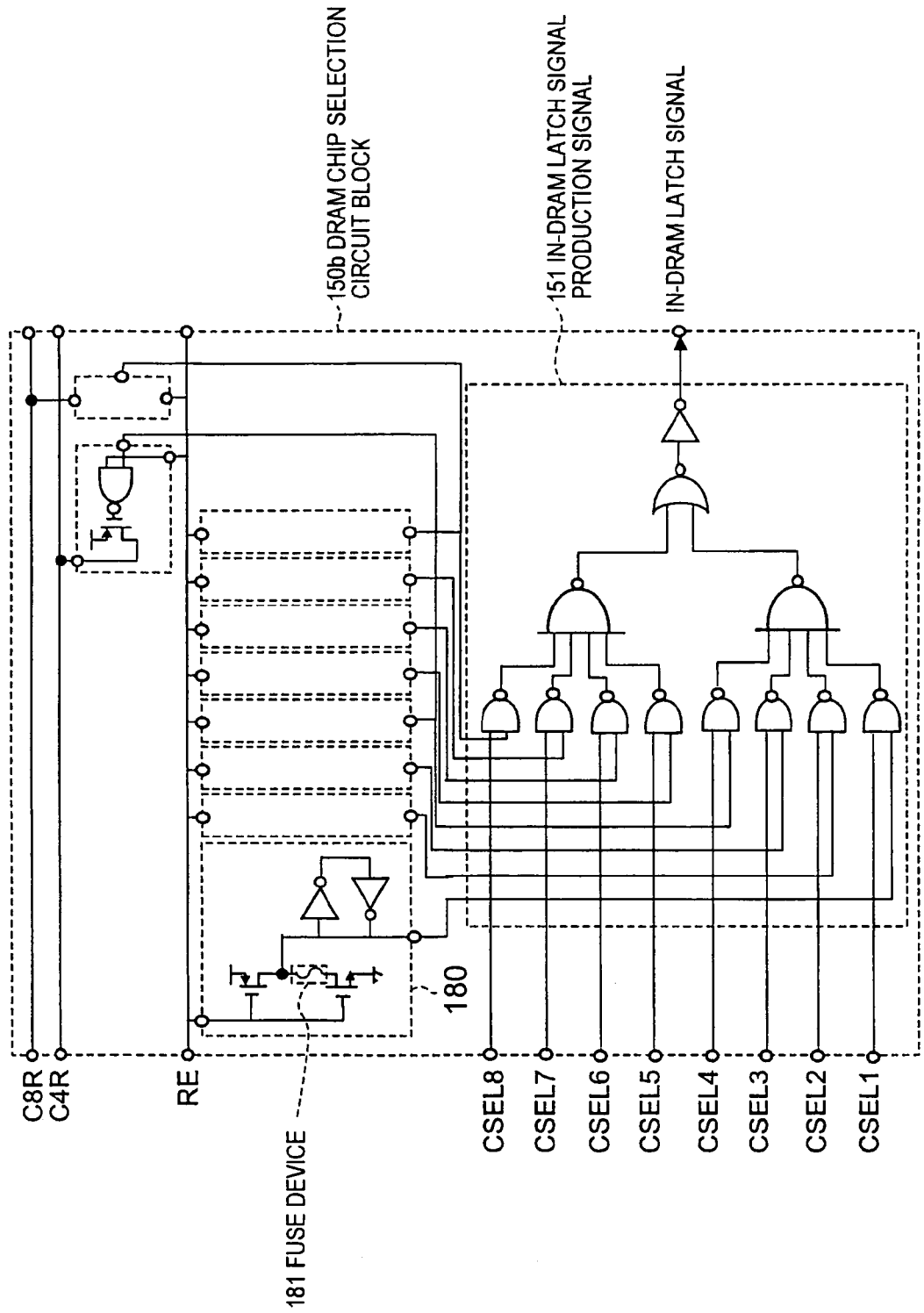
FIG. 15 is a block diagram showing a modification of the DRAM chip shown in FIG. 12.

Referring to FIG. 15, as a modification of FIG. 14, an example is shown in which fuse circuits 180 are disposed by the number corresponding to the laminate number of the DRAM chips 201. A shown DRAM chip selection circuit block 150b comprises eight fuse circuits 180 connected to an initialization signal RE terminal, and output terminals of the fuse circuits 180 are connected to NAND gates disposed corresponding to the chip selection signals CSEL1 to 8. Since the constitution of the fuse circuit 180 is similar to that of FIG. 11, the description is omitted, but the fuse device 181 of each fuse circuit 180 can be cut to produce the signals corresponding to B1 to B8.

Figure 16:
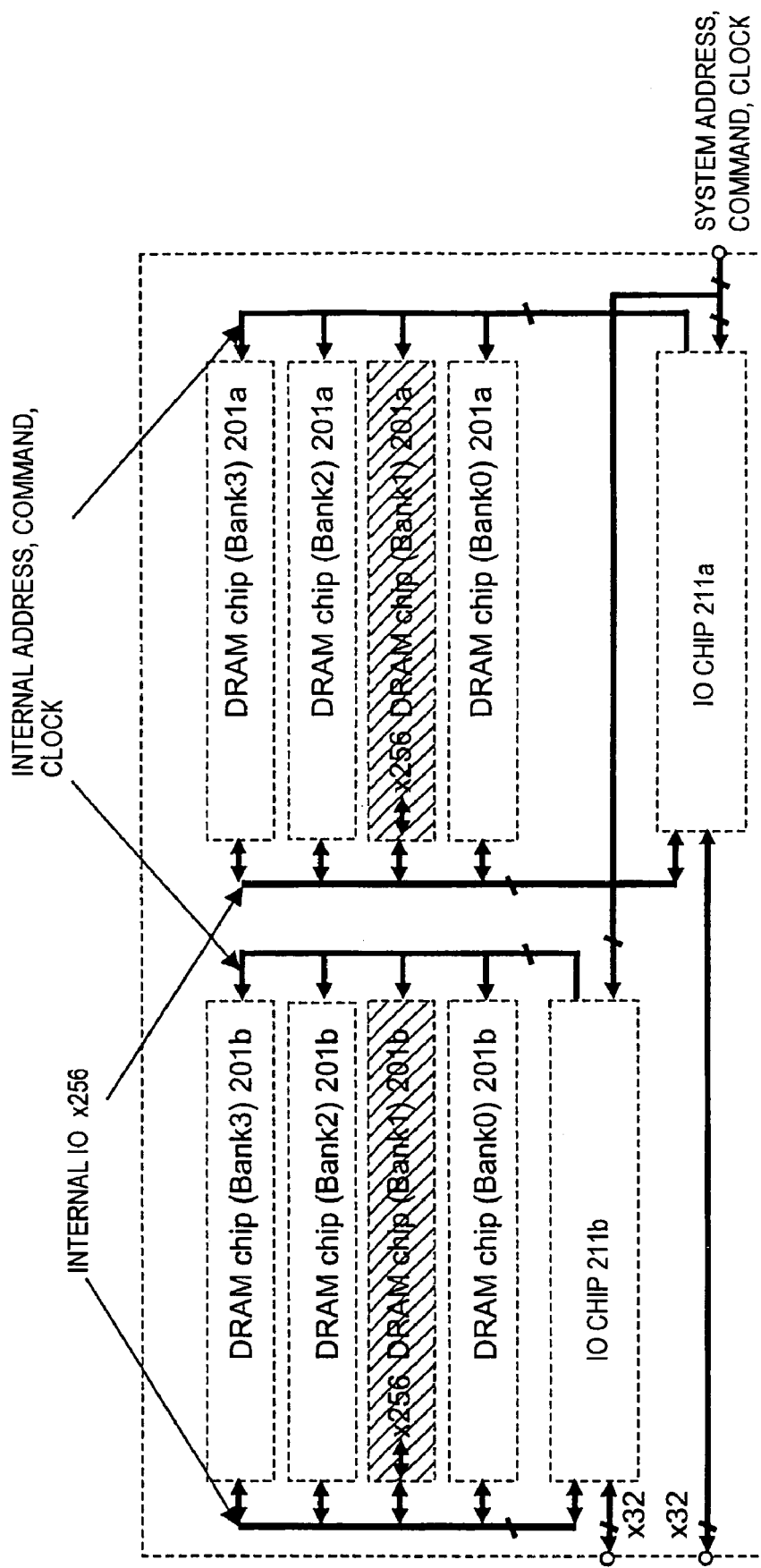
FIG. 16 is a block diagram showing the schematic constitution of a DRAM module according to another embodiment of the present invention and an access method.

Referring to FIG. 16, the memory module according to a third embodiment of the present invention is shown. The memory module can have a memory capacity equal to that of a conventional 2-rank memory module. For the shown memory module, a constitution suitable for a case where two DRAM chips 201 are simultaneously objects of access is shown.

Specifically, for the memory module, two IO chips 211a and 211b mounted on the interposer substrate (not shown), and four layers of DRAM chips 201a, 201b on the IO chips 211a, 211b are stacked, and the DRAM chips 201a, 201b on the respective IO chips 211a and 211b are simultaneously accessed one by one to constitute a 2-rank memory module. In this case, the data signals of x256 bits are transmitted/received between the simultaneously accessed DRAM chips 201a, 201b and IO chips 211a and 211b, and the system data signals of x32 bits are transmitted/received between the respective IO chips 211a and 211b and the chip set. In the drawing, a pair of DRAM chips 201a, 201b which are simultaneous access objects constitute the same banks 0 to 3.

On the other hand, the system address signal, command, and clock signal are supplied to two IO chips 211a and 211b in common. Furthermore, the respective IO chips 211a and 211b are connected to the half of the system data signal BGA terminals on the interposer substrate, and the terminals for the signals other than the data signal use a constitution shared by both the IO chips 211a and 211b. When the IO chips 211a and 211b are connected to the half of the system data signal BGA terminals on the interposer substrate, deterioration of transmission characteristics of signals by an increase of an input capacity can be reduced.

Figure 17:
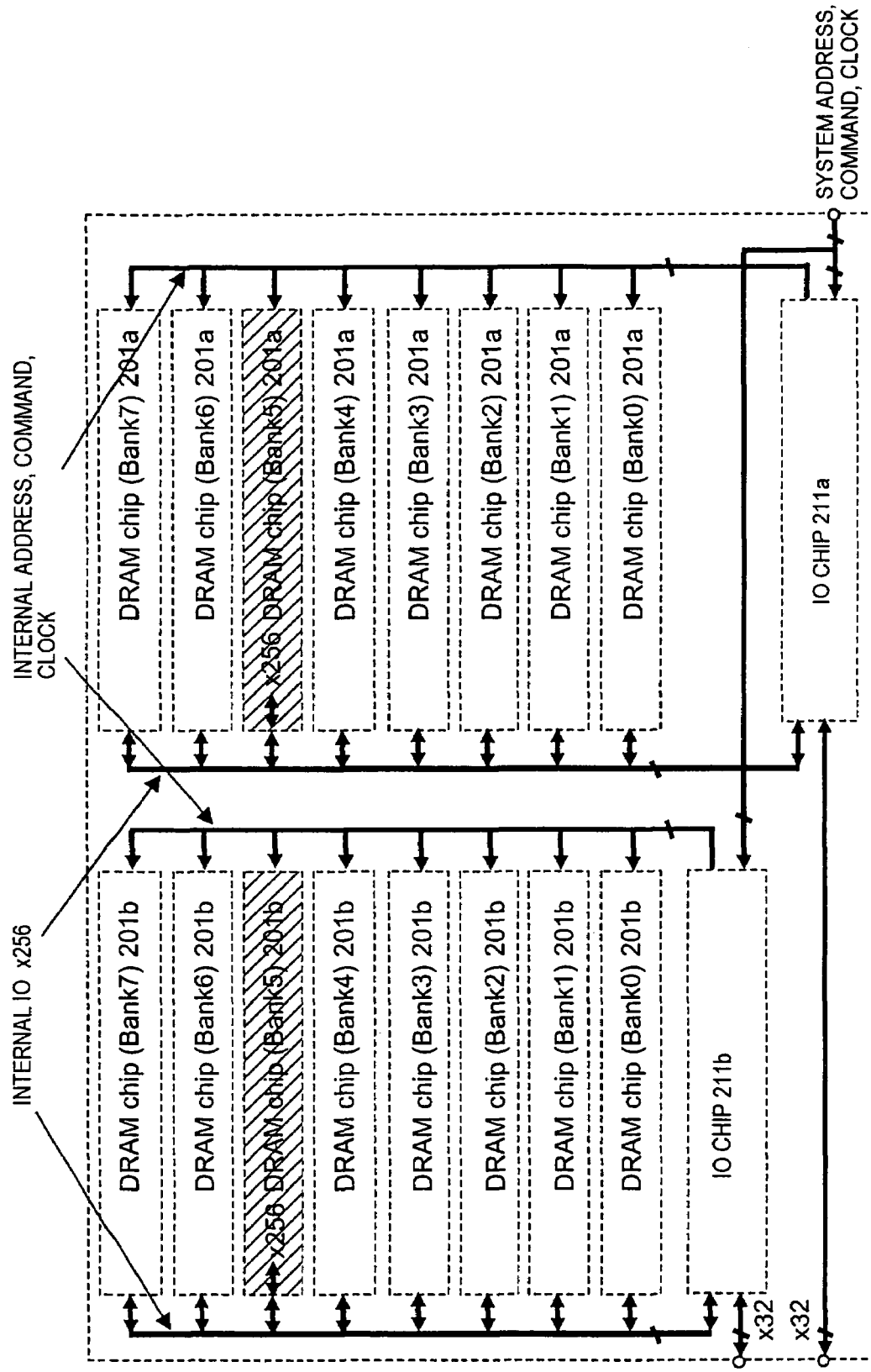
FIG. 17 is a block diagram showing a modification of the DRAM module according to another embodiment of the present invention and the access method.

Referring to FIG. 17, as a modification of the memory module shown in FIG. 16, a memory module is shown in which eight DRAM chips 201a, 201b are stacked on two IO chips 211a and 211b, and in this relation, the DRAM chips 201a, 201b of banks 0 to 7 are stacked on the respective IO chips 211a and 211b to the eighth layer which is the uppermost layer from the first layer which is the lowermost layer.

Also in this example, two IO chips 211a and 11b are connected to ½ of system data signal BGA terminals on the interposer substrate, and share the BGA terminals for the address, command, and clock except the data.

It has been confirmed that when two IO chips 211a and 211b are mounted on the interposer substrate in this manner, a wiring length to the pads on the IO chips 211a and 211b from the BGA terminals of the data signals on the interposer substrate can be reduced.

In the example shown in FIGS. 16 and 17, the DRAM chips 201a, 201b have x256 data terminals, there are inputs/outputs with respect to x32 data lines of the system in the parallel serial conversion circuit of the IO chips 211a and 211b, therefore the data terminals of the DRAM chips 201a, 201b and the data line of the system have a constitution of 8:1, and the constitution is capable of dealing with a higher operation frequency.

In addition to the above-described embodiment, each DRAM chip 201 may also be formed in a 2-bank constitution.

Figure 18:
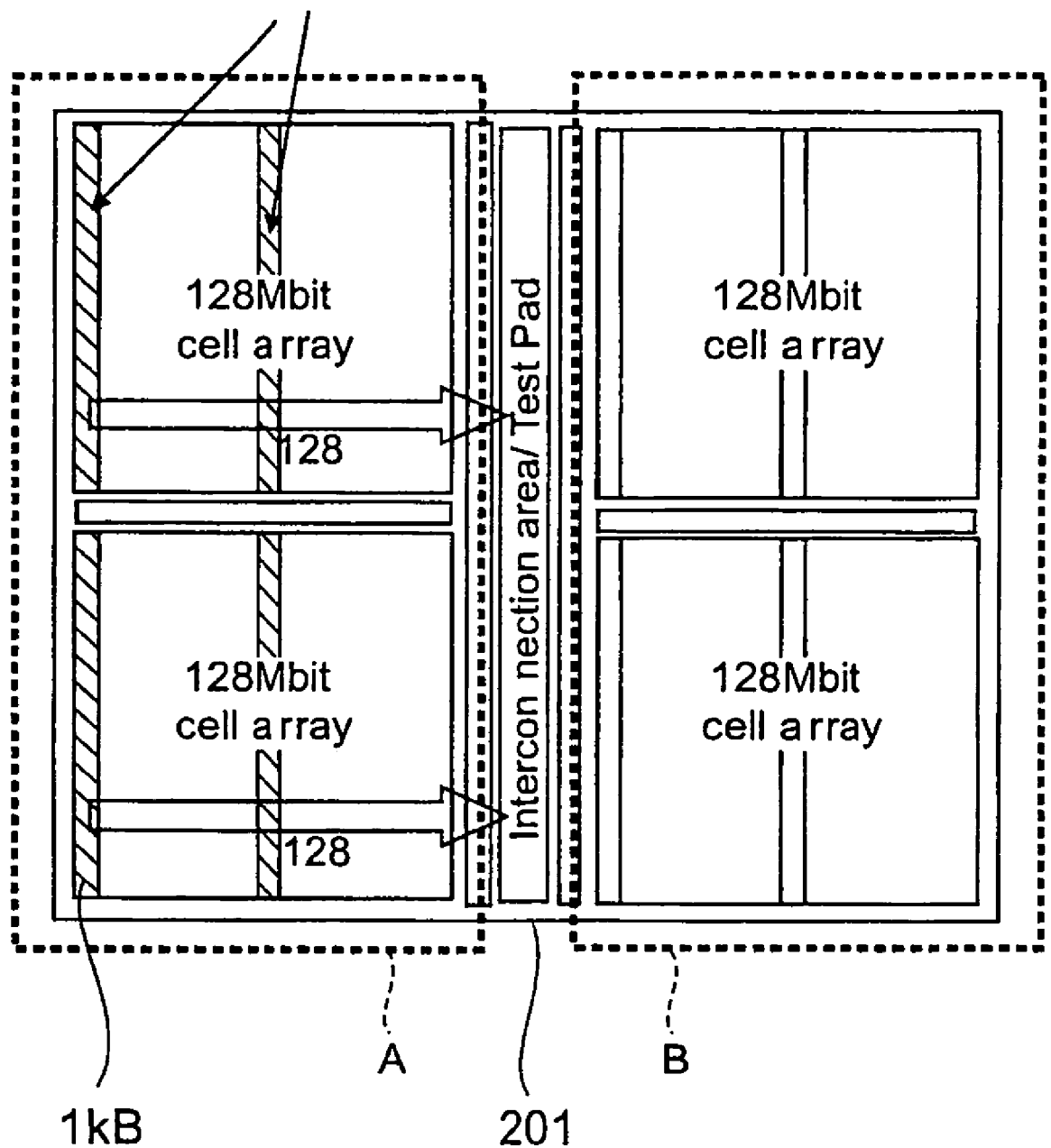
FIG. 18 is an explanatory view showing the constitution of each DRAM chip in the DRAM module according to still another embodiment of the present invention.

Referring to FIG. 18, an example is shown in which a 512 Mbit DRAM chip 201 is formed in the 2-bank constitution including 256 Mbit banks A and B. In this 2-bank constitution, only the half of the inside of the DRAM chip 201 is activated, and 256 bit data signals can be read from the activated bank A. When each DRAM chip 201 is formed in the 2-bank constitution, an activated page size becomes half as compared with FIG. 9, and the page size is 4 kbyte in FIG. 18.

Figure 19:
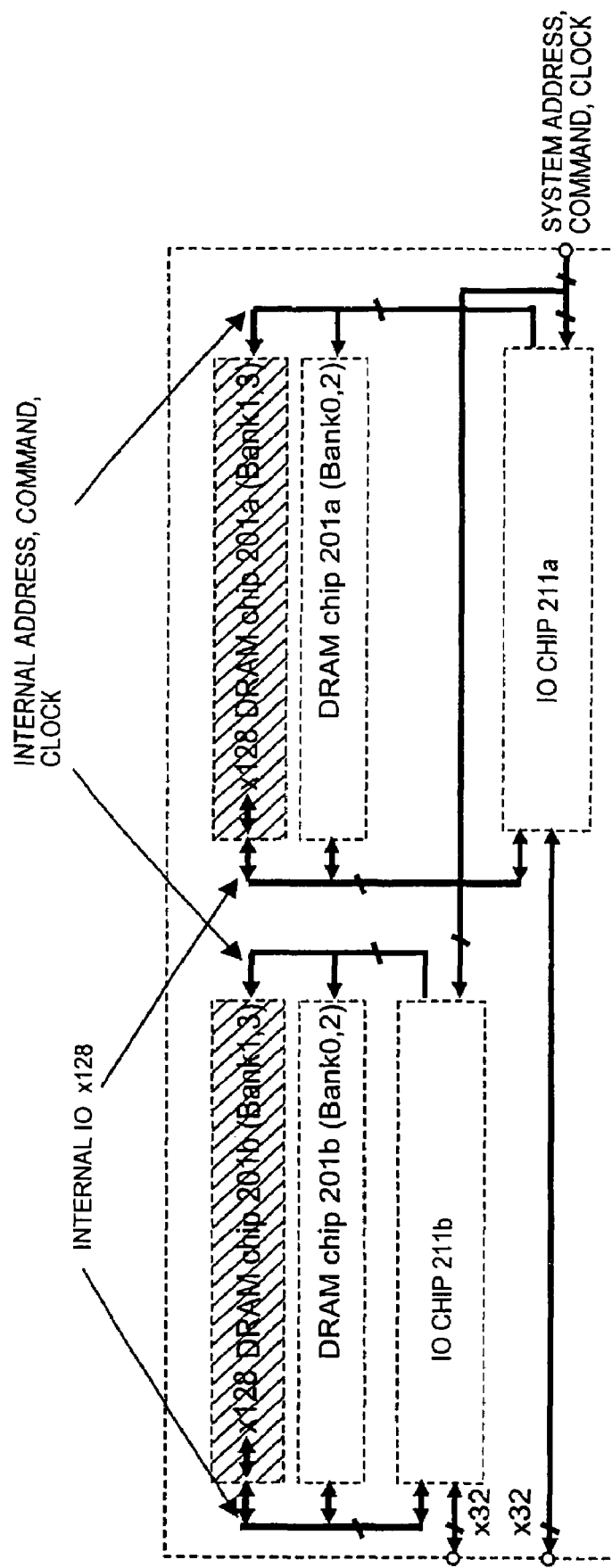
FIG. 19 is a diagram showing a constitution example of the DRAM module shown in FIG. 18.

Referring to FIG. 19, the memory module according to a fourth embodiment of the present invention comprises a constitution in which the DRAM chips each having the 2-bank constitution are stacked. The shown example has a constitution in which two IO chips 211a and 211b are mounted on the interposer substrate 210 (not shown) and two DRAM chips 201a, 201b are stacked on two IO chips 211a and 211b. Each of the DRAM chips 201a, 201b stacked on the IO chips 211a and 211b has the 2-bank constitution as shown in FIG. 19.

Among the shown DRAM chips 201a, 201b, banks 0, 2 are allocated to the DRAM chips 201a, 201b in most vicinity of the IO chips 211a and 211b, that is, in the lowermost layer. On the other hand, banks 1, 3 are allocated to the upper-layer DRAM chips 201a, 201b.

Here, the respective IO chips 211a and 211b are connected to ½ of the system data signal BGA terminals, and share the BGA terminals for the address, command, and clock except the data.

According to this constitution, a constitution freedom degree of the memory capacity can be enhanced without increasing a terminal capacity of the data signal, and characteristics by reduction of the wiring length on the interposer substrate can be improved.

Figure 20:
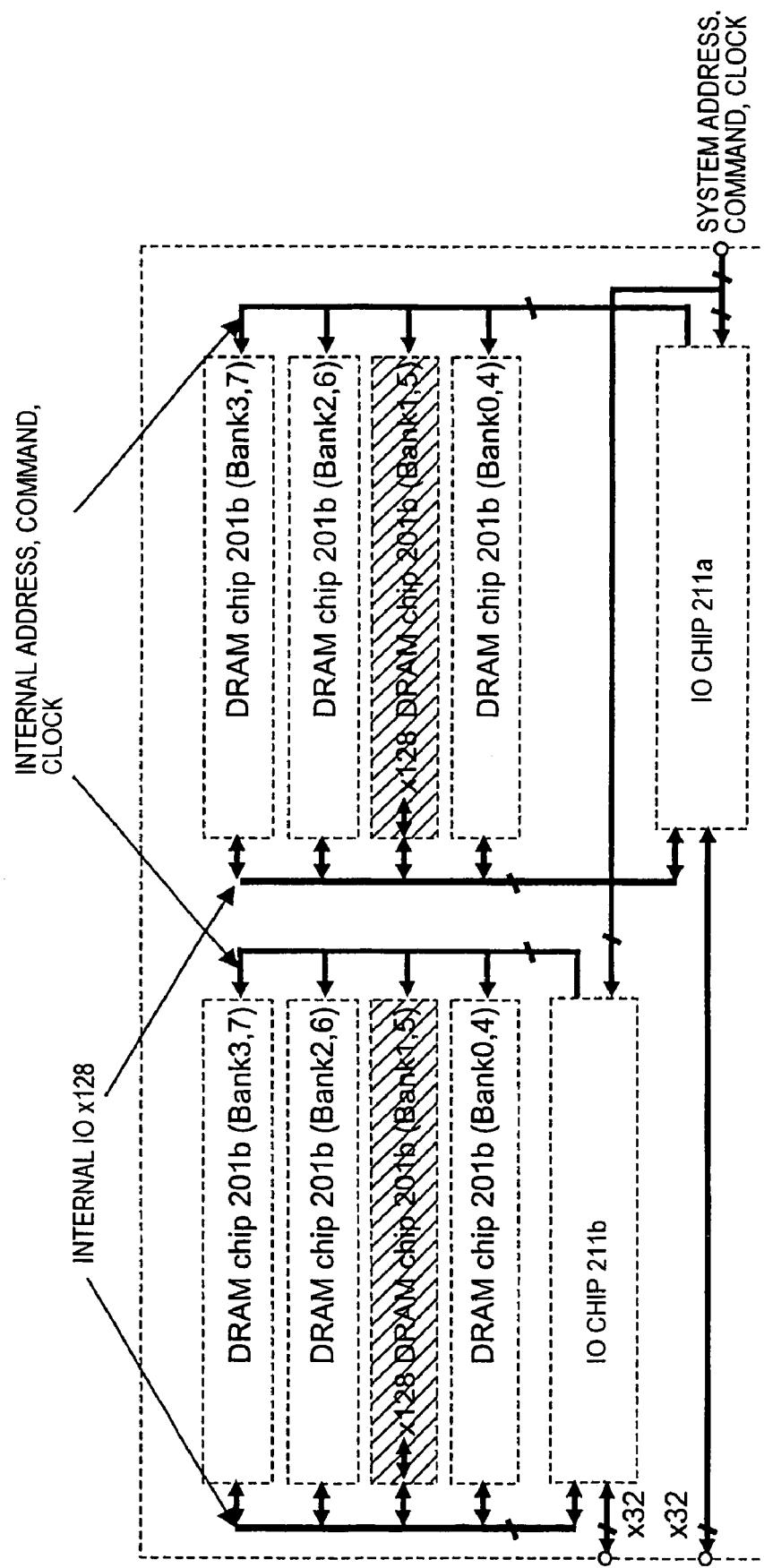
FIG. 20 is a diagram showing another constitution example of the DRAM module shown in FIG. 18.

Referring to FIG. 20, as a modification of the memory module shown in FIG. 19, an example is shown in which four DRAM chips 201a, 201b each having the 2-bank constitution are stacked on two IO chips 211a and 211b. In this case, banks (0, 4), (1, 5), (2, 6), (3, 7) are allocated to four DRAM chips 201a, 201b to the uppermost layer from the lowermost layer, and x128 data signals are transmitted/received between the respective banks and the IO chips 211a and 211b. On the other hand, x32 system data signals are transmitted/received between the respective IO chips 211a and 211b and the chip set.

Figure 21:
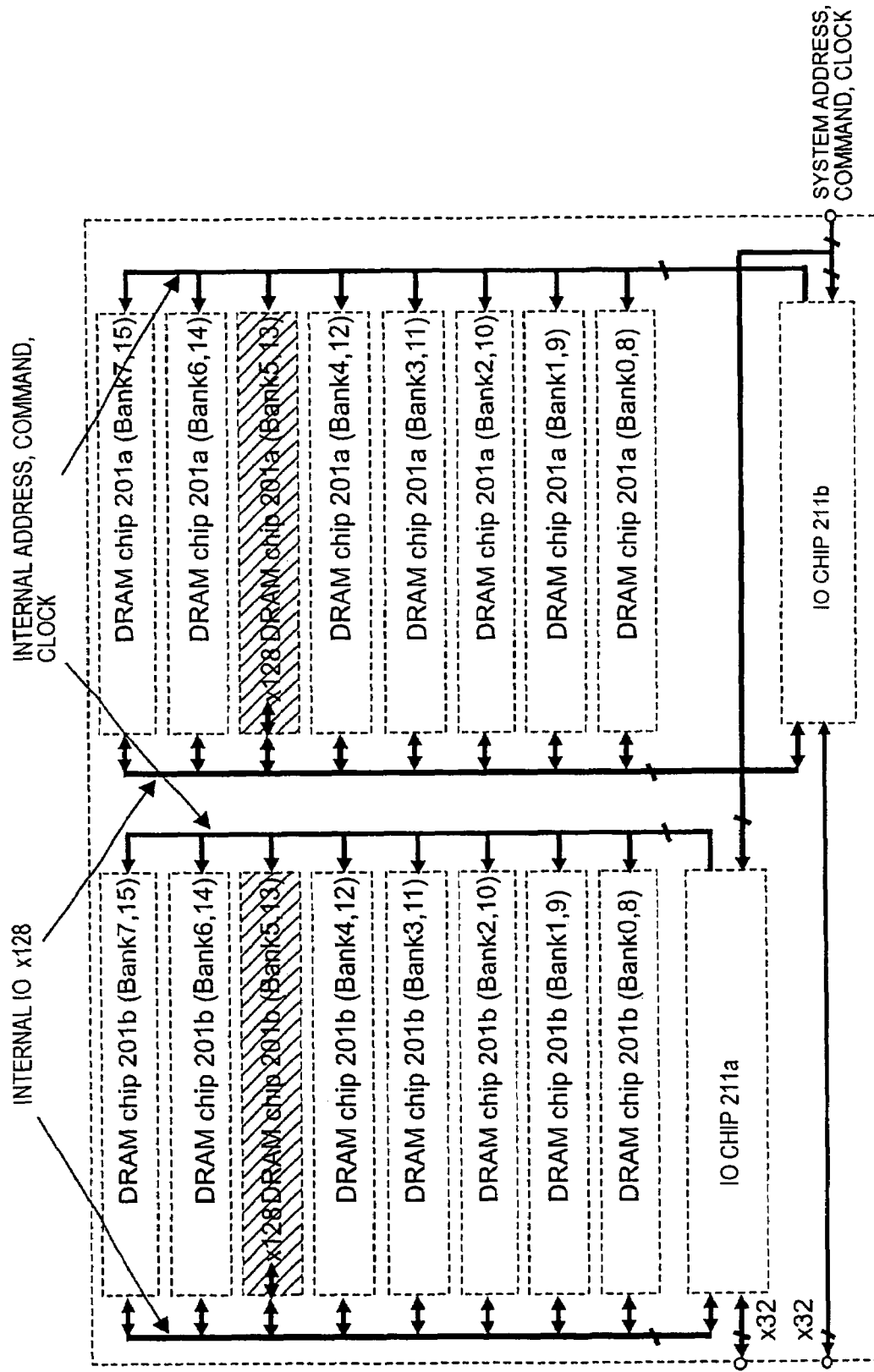
FIG. 21 is a diagram showing still another constitution example of the DRAM module shown in FIG. 18.

Referring to FIG. 21, another modification of the memory module shown in FIG. 19 is shown. As apparent from the drawing, the module is similar to those of FIGS. 19 and 20 except that eight DRAM chips 201a, 201b each having the 2-bank constitution are stacked on two IO chips 211a and 211b.

As shown in FIGS. 19 to 21, when the respective DRAM chips 201a, 201b are constituted of a plurality of banks, a memory module can be entirely constituted to have a bank number equal to a DRAM chip number x (bank number in DRAM chip). In this case, a page size at a time when the inside of the DRAM chip 201a or 201b is operated as a plurality of banks (n banks) is 1/n. Moreover, it is also possible to select whether or not to operate the inside of the DRAM chip 201a, 201b as a plurality of banks (n banks) by the BGA terminal level.

Figure 22:
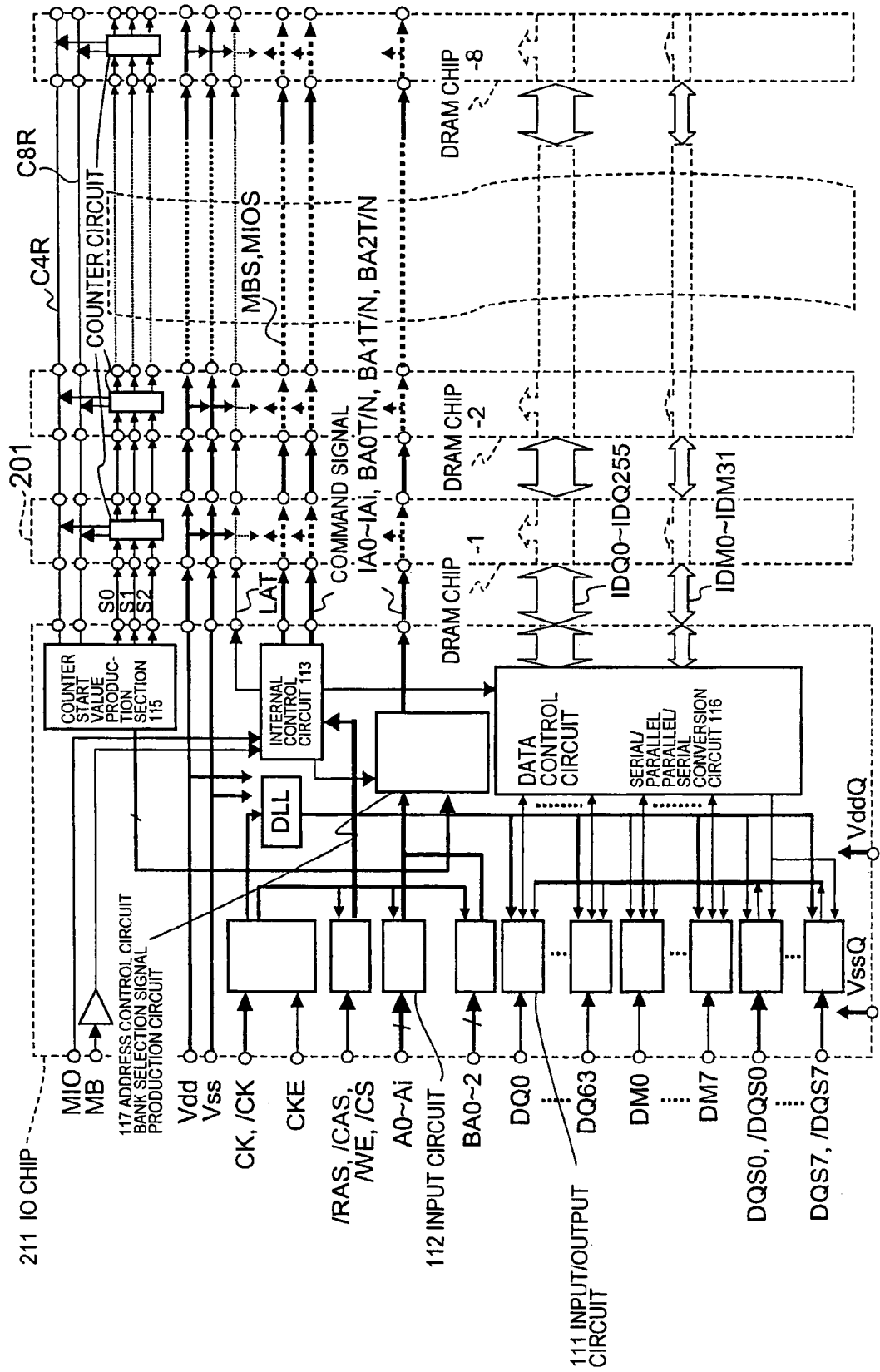
FIG. 22 is a block diagram showing an operation in the DRAM module shown in FIGS. 18 to 21.

Concrete circuit constitutions of the memory modules shown in FIGS. 19 to 21 will be described with reference to FIGS. 22 to 24. Control signals MIO, MB for controlling the respective DRAM chips 201a, 201b each having the 2-bank constitution are supplied to each IO chip 211 shown in FIG. 22, and the control signals MIO, MB are supplied to the internal control circuit 113 of the IO chip 211. Here, the control signal MB is a bank mode signal indicating whether or not a plurality of DRAM chips 201a, 201b in the memory module are formed in the 2-bank constitution, and the control signal MIO is a for selecting the IO chip 211a, 211b.

An internal control circuit 113a receives the control signal MIO, MB to operate, and controls the address control circuit, bank selection signal control circuit 117. The shown internal control circuit 113a is similar to the internal control circuit 113 shown in FIG. 3 in that the control signal and latch signal LAT are produced. The address control circuit, bank selection signal control circuit 117 produces a bank selection signal BSELT/N as described later.

The IO chip 211 shown in FIG. 22 will be concretely described with reference to FIG. 23. The address data control circuit 117a which receives the system bank address signals BA0 to BA3 to operate individually outputs internal bank selection signals (BA0T/NP to BA3T/NP) to the bank selection signal production circuit 117b.

On the other hand, the internal control circuit 113 receives a bank mode MB to output an internal bank mode signal MBS which sets the bank constitution of the DRAM chip 210, and further outputs a control signal MIOS which sets the constitutions of the IO chips 211a, 211b. It is to be noted that the internal bank mode signal MBS is a signal which determines whether or not the DRAM inside is formed in the 2-bank constitution. This means that the shown memory module can be selectively operated in two banks or in a single bank.

Figure 23:
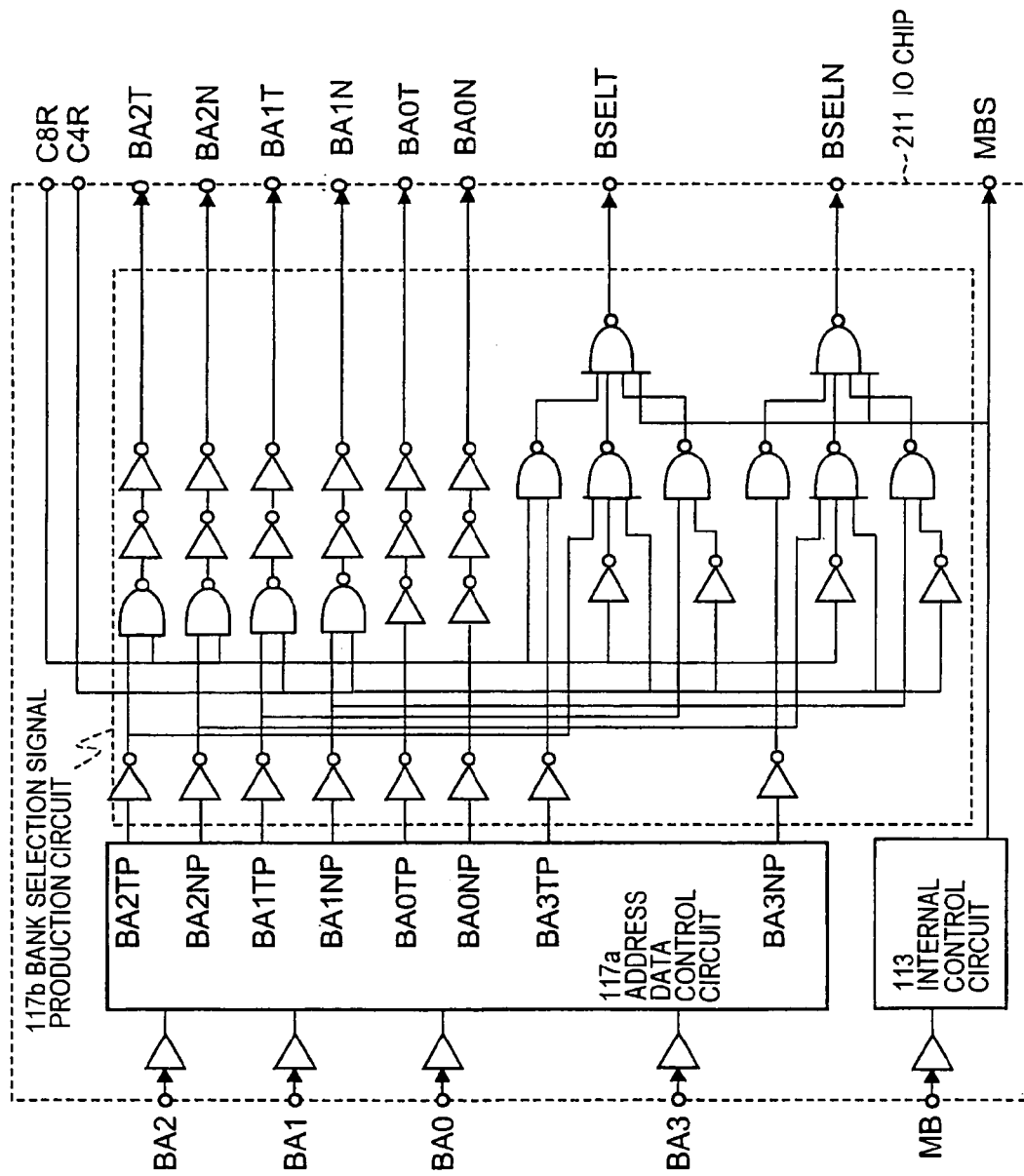
FIG. 23 is a block diagram concretely showing the constitution of the IO chip shown in FIG. 22.

The bank selection signal production circuit 117b shown in FIG. 23 logically calculates the internal bank selection signals (BA0T/NP to BA3T/NP) and the signals on the laminate number recognition line (C4R, C8R) to output the bank selection signals (BA0T/N to BA2T/N) for selecting the bank on the IO chip 211a or 211b. On the other hand, the bank constitution selection signals BSELT, BSELN which designate the bank constitutions in the respective DRAM chips 201a, 201b.

Figure 24:
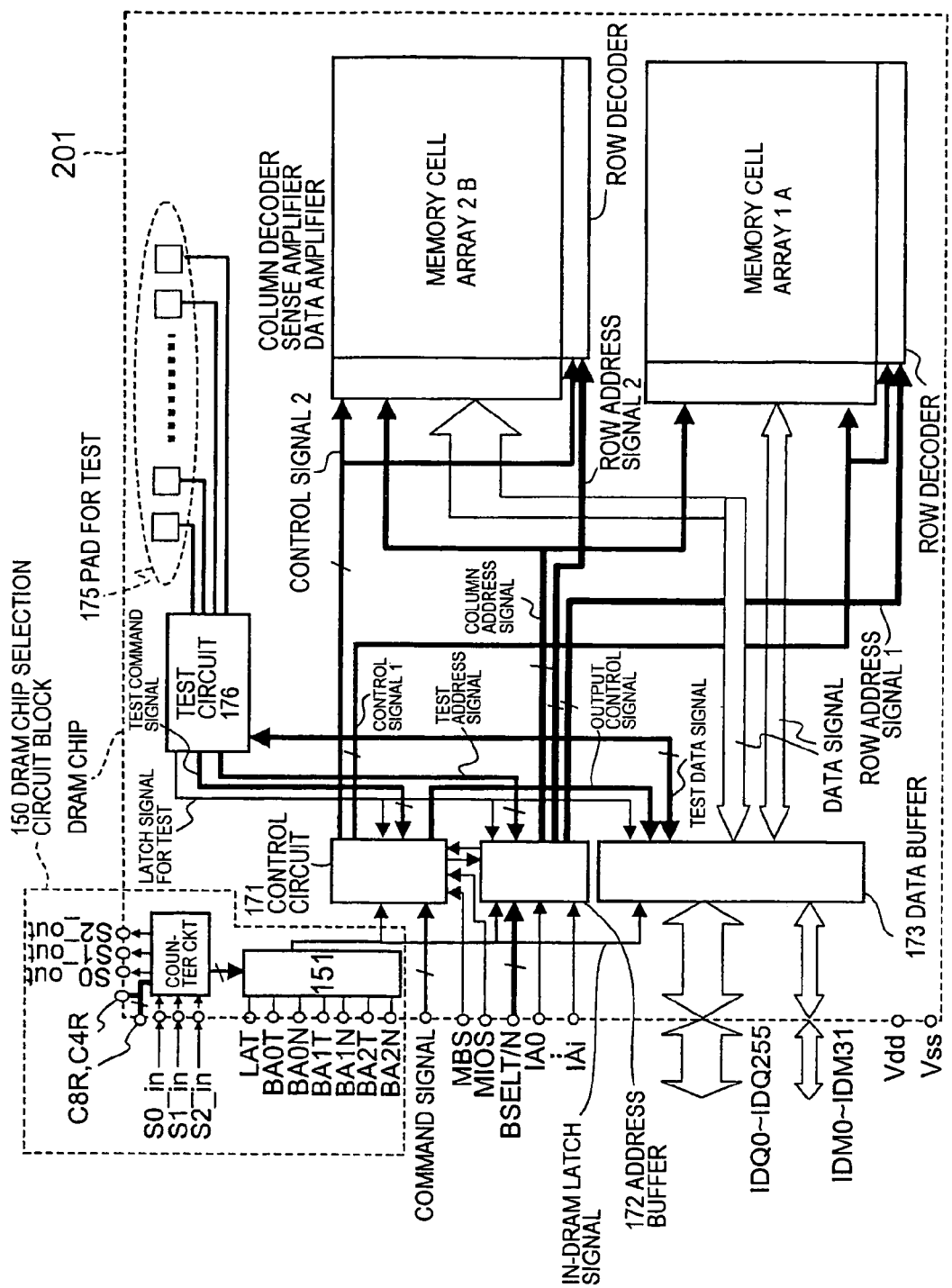
FIG. 24 is a block diagram concretely showing the constitution of the DRAM chip shown in FIG. 22.

Referring to FIG. 24, the respective DRAM chips 201 (affixed characters are omitted) stacked on the IO chips 211a, 211b shown in FIG. 23 have a memory cell array 1 (bank A) and a memory cell array 2 (bank B), and these banks A, B selectively operate in a single bank or 2-bank constitution in response to the internal bank mode signal MBS.

Specifically, the DRAM chip 201 shown in FIG. 24 includes the DRAM chip selection circuit block 150 comprising the counter circuit 300, and further includes the control circuit 171, address buffer 172, data buffer 173, test circuit 176, and pad for test 176. Here, since the DRAM chip selection circuit block 150 and test circuit 176 are described already in the above-described embodiment, the description thereof is omitted here.

The shown control circuit 171 receives the internal bank mode signal MBS and control signal MIOS to output control signals 1 and 2 to the memory cell arrays 1 and 2 in response to MBS and MIOS. Furthermore, bank level selection signals BSELT, BSELN which designate the bank levels in the respective DRAM chips 201a, 201b are supplied to the address buffer 172. The address buffer 172 outputs a column address signal to the memory cell arrays 1 and 2 in accordance with BSELT, BSELN, and further outputs row address signals 1, 2 to the memory cell arrays A, B.

As apparent from this, the control circuit 171, address buffer 172, and data buffer 173 shown in FIG. 24 operate as an array control circuit which controls the memory array.

Since an operation other than this operation is similar to the above-described embodiment, the description is omitted.

In the IO chip 211 shown in FIG. 23, the internal control circuit 113 produces the bank mode signal MBS in response to the bank mode signal MB of the system.

Figure 25:
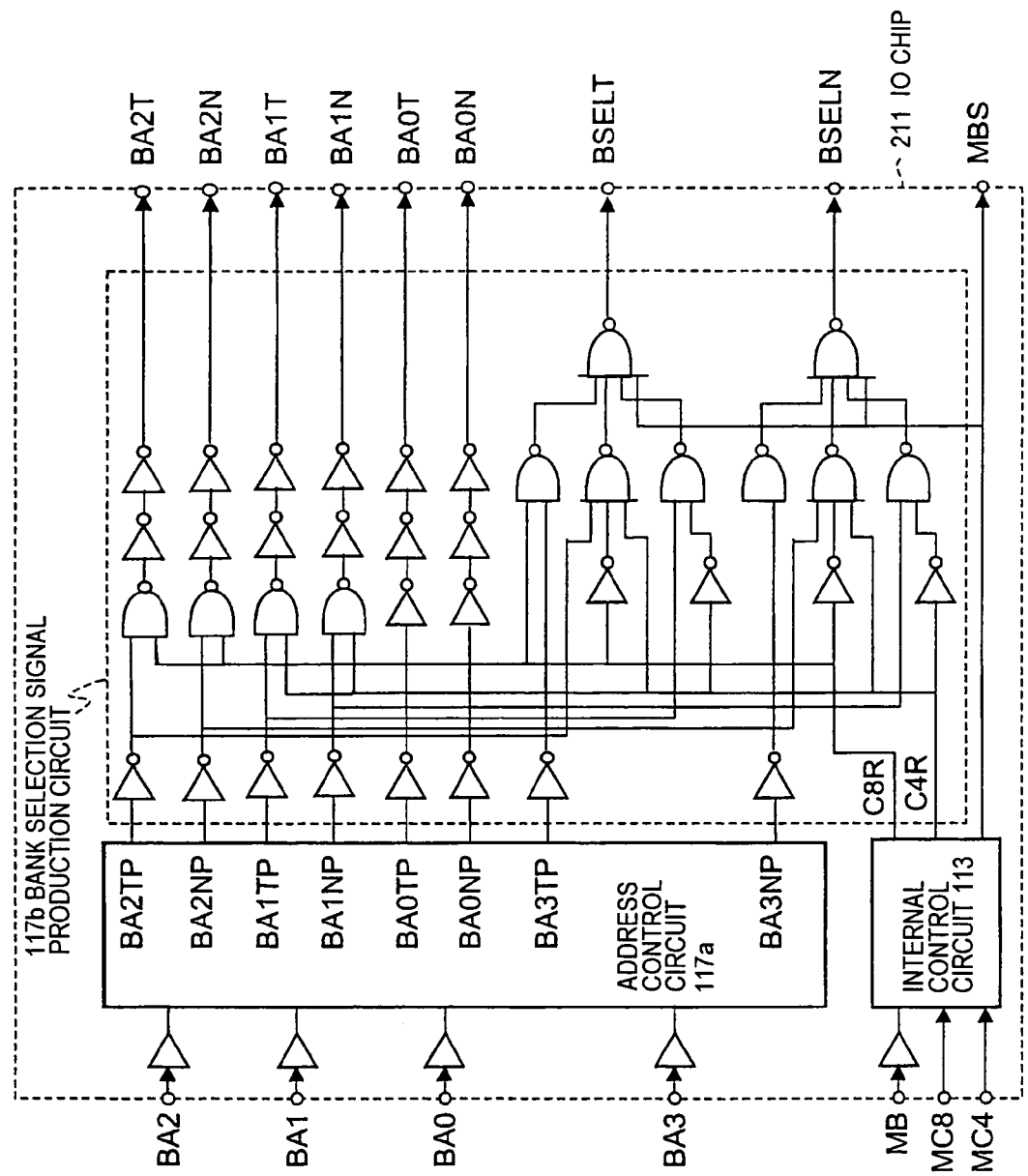
FIG. 25 is a block diagram showing another constitution example of the IO chip shown in FIG. 22.

FIG. 25 shows another example of the IO chip 211. DRAM chip laminate number identification signals MC8 and MC4 are supplied to the internal control circuit 113 of the shown IO chip 211 from the BGA terminal on the interposer substrate. This internal control circuit 113 refers to not only the bank mode signal MB of the system but also the level designated by MC8 and MC4 to produce the bank mode signal MBS.

In the above-described embodiment, it is controlled by the signal supplied to a BGA terminal MB whether or not to form the inside of the DRAM in the 2-bank constitution. Therefore, the internal bank constitution can be varied in accordance with a system master's request. A fixed potential may be supplied to the MB terminal by the system, or the terminal may also be switched in the same manner as in the system command signal.

As described above, when the 2-bank constitution is formed in the DRAM chip, a minimum DRAM capacity can be handled even with a DRAM laminate number of two. Furthermore, the constitutions of four layers, eight layers may be formed by the same IO chip and DRAM chip, various memory capacity requirements can be handled, and productivity is enhanced.

An effect by the increase of the bank number will be described. A method of using the memory bank differs with the system. However, when a page hit ratio is high, a request from the system is waited for in a bank activated state, and therefore a longer page length is effective in enhancing the hit ratio. When the page hit ratio is low, the request from the system is waited for in a bank closed state, and therefore a larger bank number is more preferable.

Here, information such as a memory capacity, bank constitution, and assured operation speed of the module are written in the memory module at a manufacturing time, and the SPD chip is sometimes mounted having a function to which the chip set refers in automatically setting the control conditions at the system boot time. The present invention is similarly applicable even to the memory module comprising the SPD chip.

Figure 26:
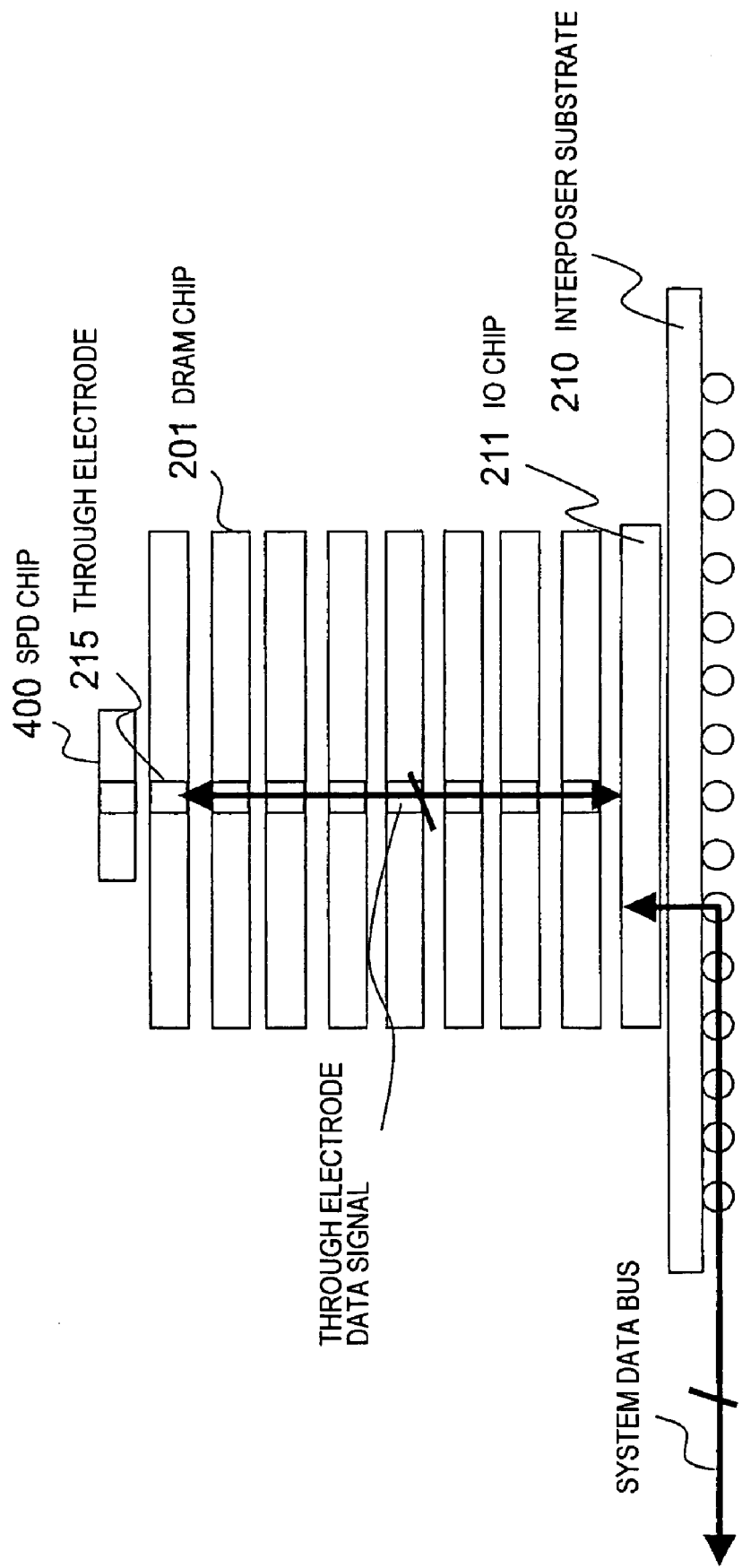
FIG. 26 is a diagram showing the schematic constitution of the DRAM module according to another embodiment of the present invention.

Referring to FIG. 26, the memory module according to the fourth embodiment of the present invention is disposed. For the shown memory module, an IO substrate, that is, the IO chip 211 is mounted on the interposer substrate 210, and the DRAM chips 201 formed of eight layers are stacked on the IO chip 211. Furthermore, an SPD chip 400 is mounted on the DRAM chip 201 in the uppermost layer. The SPD chip 400 is a ROM in which the memory capacity and the like are written as described above, the control conditions of the SPD chip 400 are read from the chip set at the system boot time, and the conditions are automatically set in the system.

The SPD chip 400 is connected to the IO chip 211 by the through electrode 215 in the same manner as in the DRAM chip 201, and further connected to the interposer substrate 210 via the pad on the IO chip 211.

The operation of the shown memory module is similar to that of the memory module according to the second embodiment except the operation at the boot time.

Figure 27:
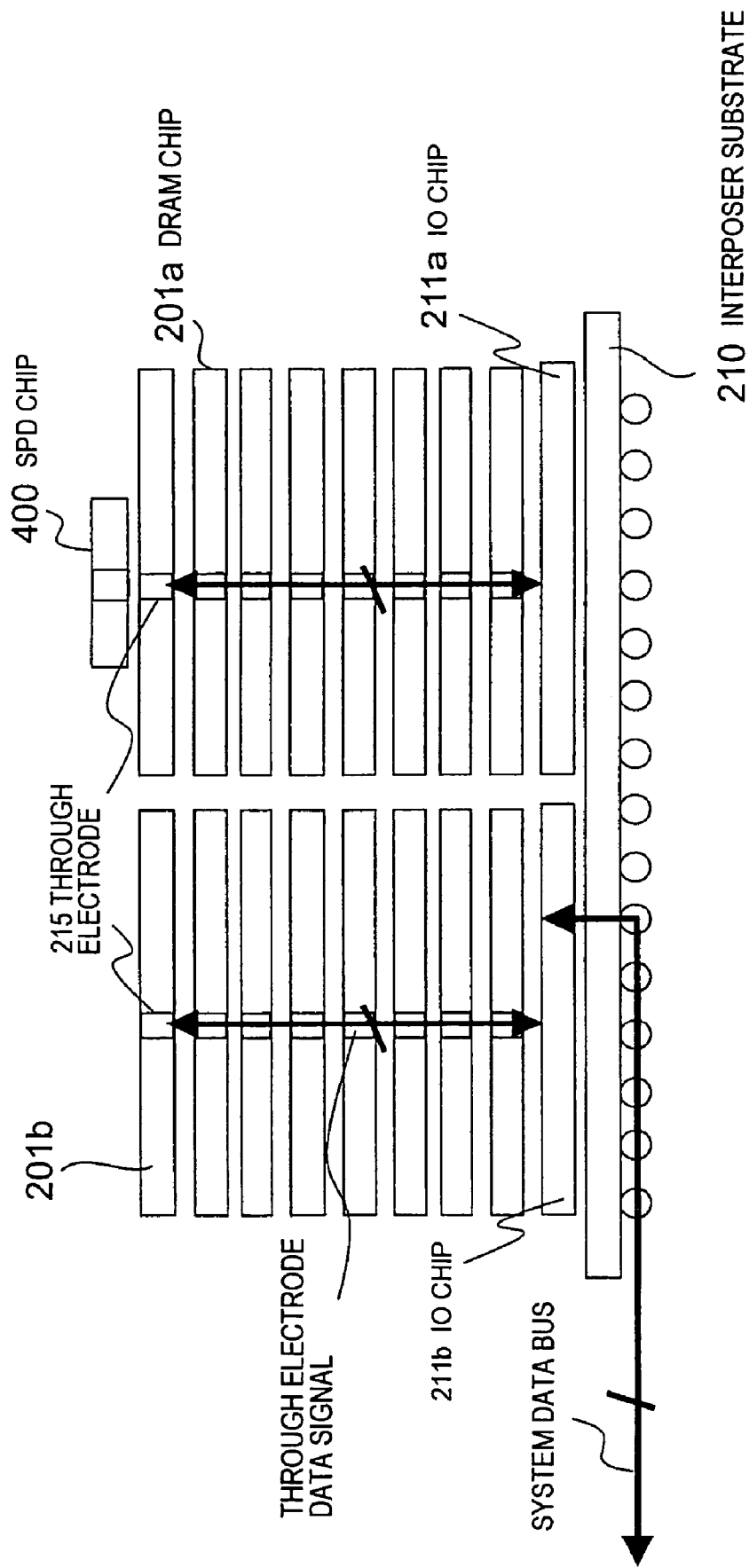
FIG. 27 is a diagram showing the schematic constitution of the DRAM module according to still another embodiment of the present invention.

Referring to FIG. 27, another example in which the SPD chip 400 is used is shown. Here, two IO chips 211a and 211b are mounted on the interposer substrate 210. Eight DRAM chips 201a, 201b are stacked on each of the IO chips 211a and 211b. Furthermore, in the shown example, the SPD chip 400 is attached only to the DRAM chip 201a on the IO chip 211a. The SPD chip 400 is connected to the IO chip 211a via the through electrodes 215.

In this constitution, the SPD signal can be read by the IO chip 201a via the through electrodes 215.

The chip set reads the information written in the SPD chip 400 at the0 system boot time. The information is taken into the IO chips 211a, 211b to produce the control signals of the DRAM chips 201a, 201b (MBS; bank constitution in the DRAM chip, MIOS; IO constitution of the DRAM chip).

When the IO chips 201a, 201b read/access the SPD chip 400 in this manner at an initialization setting time of the memory module, set information such as internal timing setting and module constitution written in the SPD chip 400 at a manufacturing time may also be read to set the internal circuit.

Moreover, as shown in FIG. 27, when two IO chips 211a and 201b are mounted, the SPD chip 4100 is mounted only on the DRAM chip 201a on one side, connected to the pad on the IO chip 211a via the through electrodes 215, and further connected to the pad of the other IO chip 211b by a wiring on the interposer substrate 210. Accordingly, the signals from the SPD chip 400 can be read by both the IO chips 211a, 211b.

Figure 28:
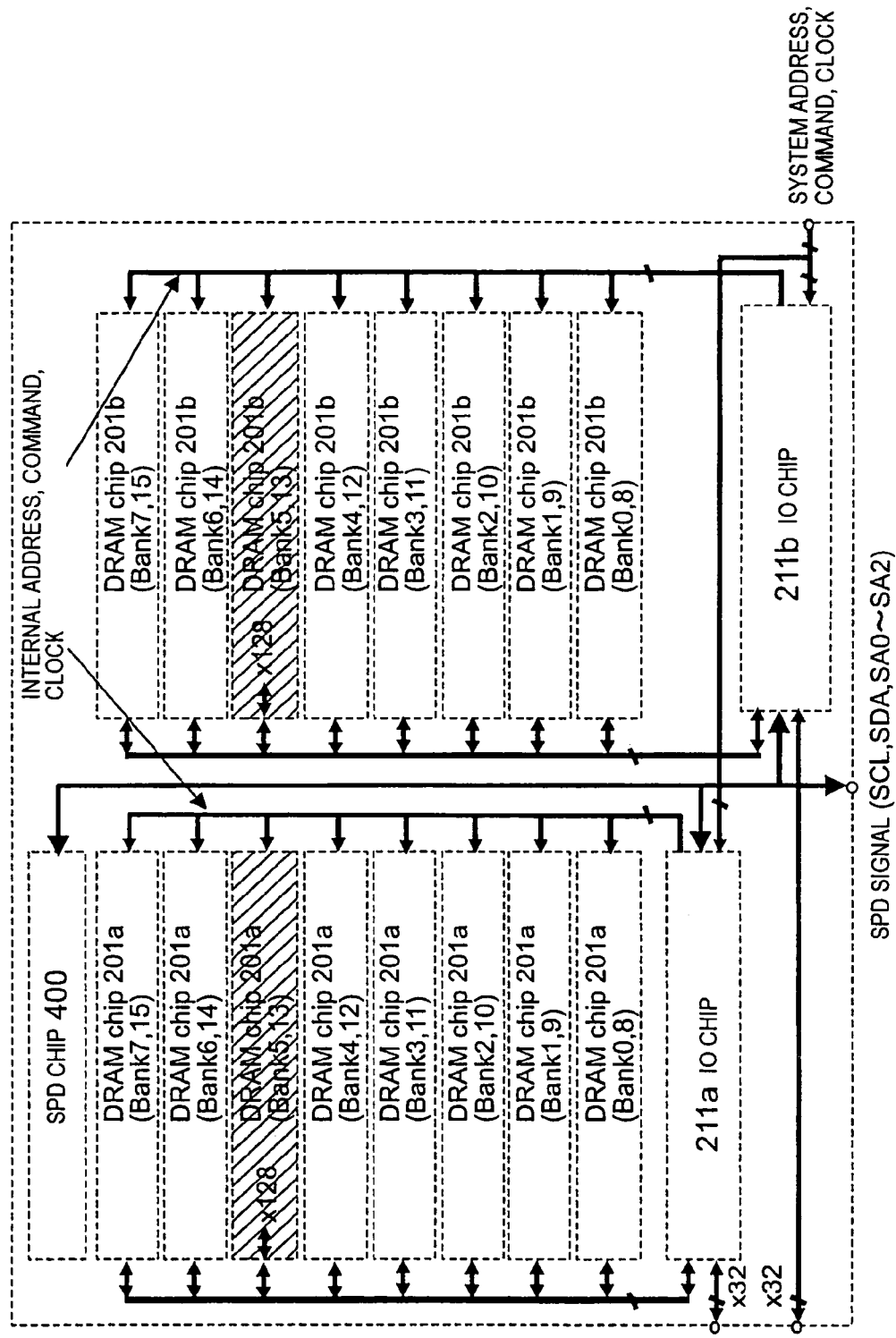
FIG. 28 is a diagram showing a bank and wiring of the DRAM module shown in FIG. 27.

Referring to FIG. 28, a laminate structure of the memory module shown in FIG. 27 is shown. As apparent from the drawing, the SPD chip 400 is disposed only on the left DRAM chip 201a, and is not disposed on the right DRAM chip 201b. Furthermore, each of the shown DRAM chips 201a, 201b has the 2-bank constitution, and two bank levels are applied to the respective DRAM chips 201a, 201b in this relation.

The system address, command, and clock signals are applied to two IO chips 211a, 211b in common, and the SPD chip 400 is accessed at the system boot time. When the SPD chip 400 is accessed, the SPD signals (SCL, SDA, SA0 to SA2) are output to the IO chips 211a, 211b and chip set.

Figure 29:
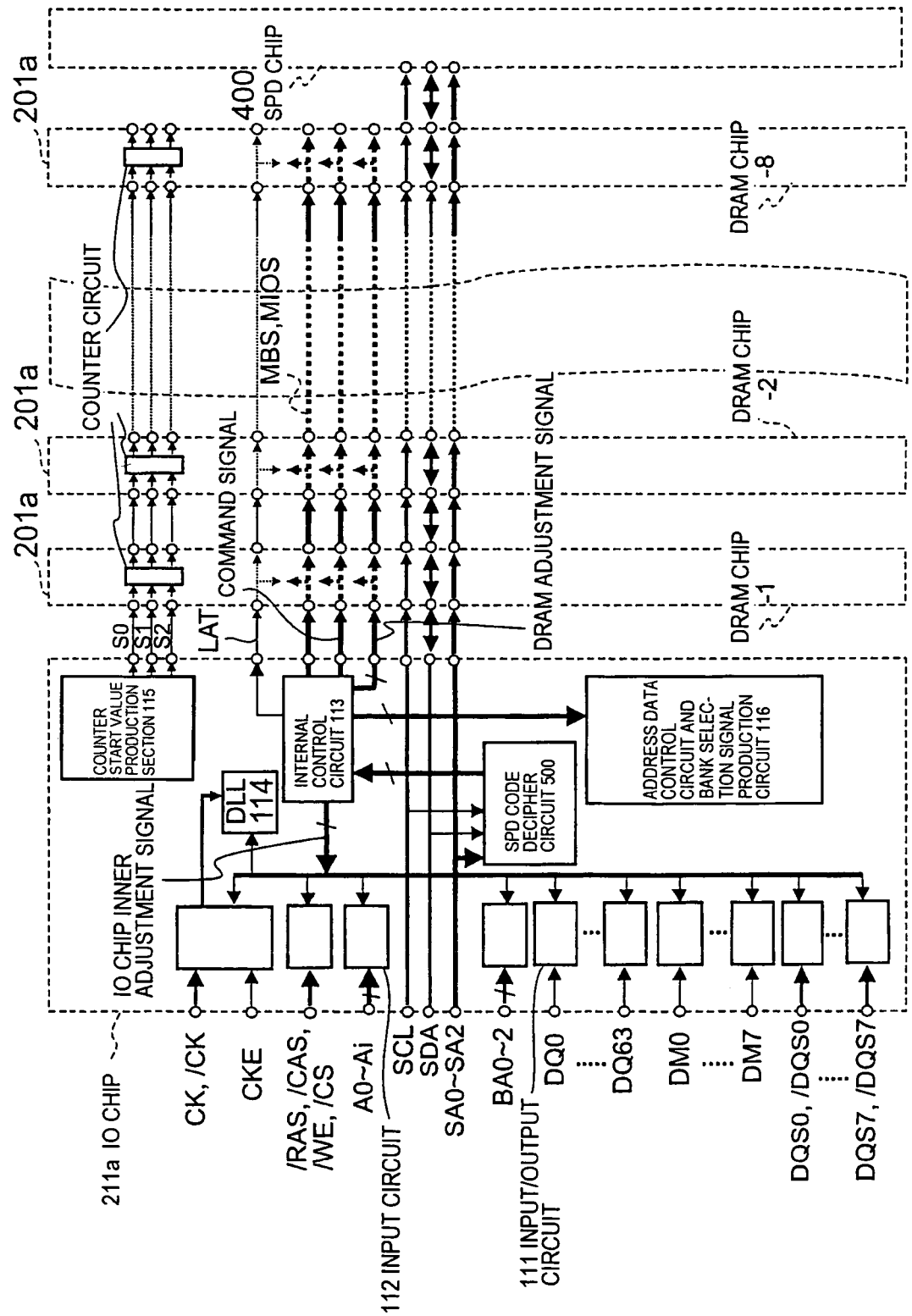
FIG. 29 is a block diagram showing the constitution of one of DRAM laminates in the DRAM module shown in FIG. 28.
Figure 30:
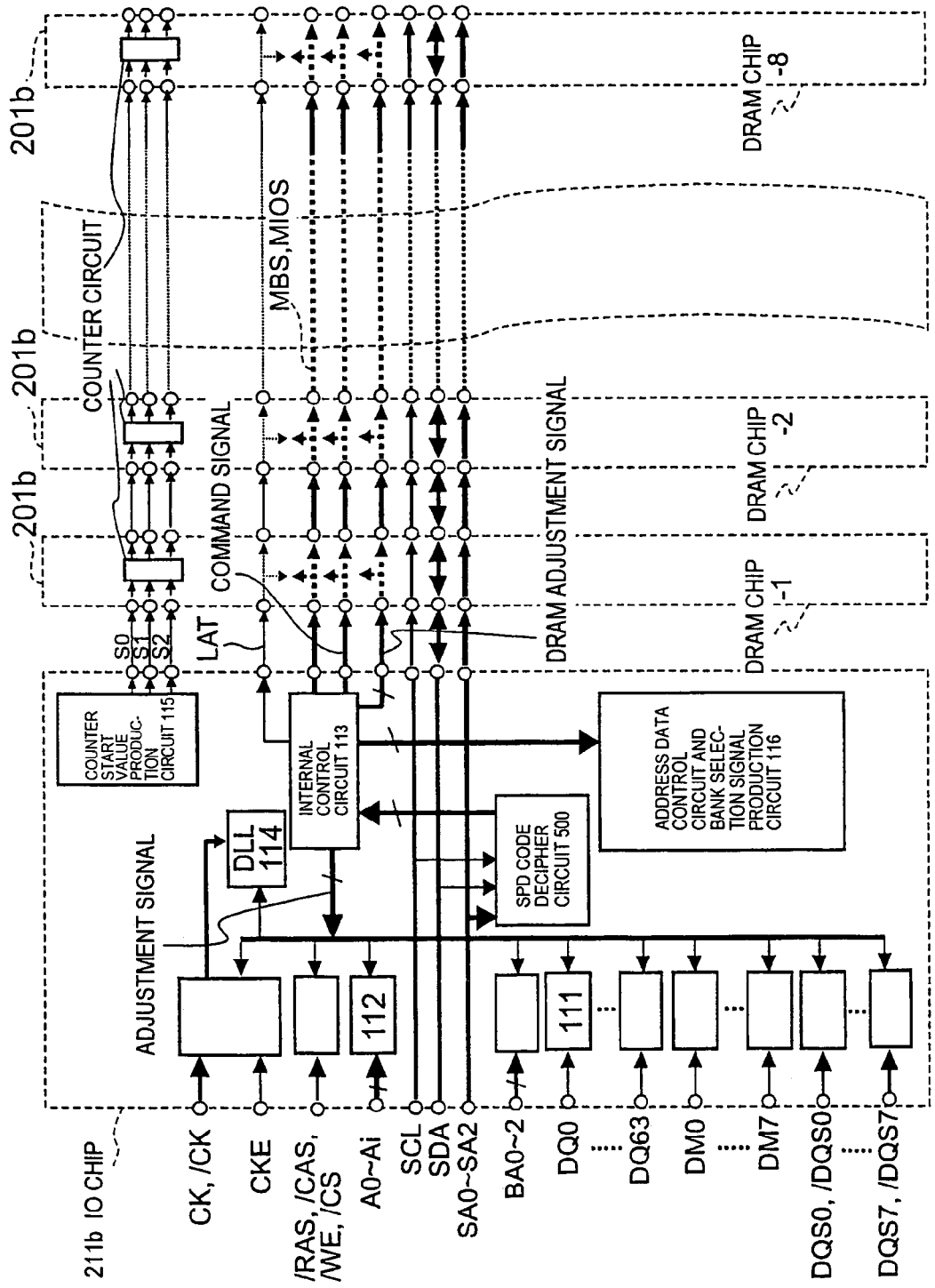
FIG. 30 is a block diagram showing the constitution of the other DRAM laminate in the DRAM module shown in FIG. 28.

FIG. 29 shows a connection relation of the IO chip 211a, DRAM chip 201a, and SPD chip 400 shown in FIG. 28, and FIG. 30 shows a connection relation of the IO chip 211b and DRAM chip 201b. The shown IO chip 211a comprises an SPD code decipher circuit 500 connected to the SPD chip 400, and the SPD code decipher circuit 500 deciphers the SPD signal to output a decipher result to the internal control circuit 113. The internal control circuit 113 supplies an IO inner adjustment signal to the input/output circuit 111 and input circuit 112 in accordance with the decipher result to perform initial setting. Moreover, the control signals MBS and MIOS are supplied to the DRAM chip 201a on the IO chip 211a to initially set each DRAM chip 201a.

The SPD signal is also supplied to the SPD code decipher circuit 500 of the IO chip 211b shown in FIG. 30 via the IO chip 201a, and the decipher result is supplied to the internal control circuit 113 in the IO chip 211b to perform the initial setting of the DRAM chip 201b in the same manner as in the DRAM chip 201a on the IO chip 211a.

Figure 31:
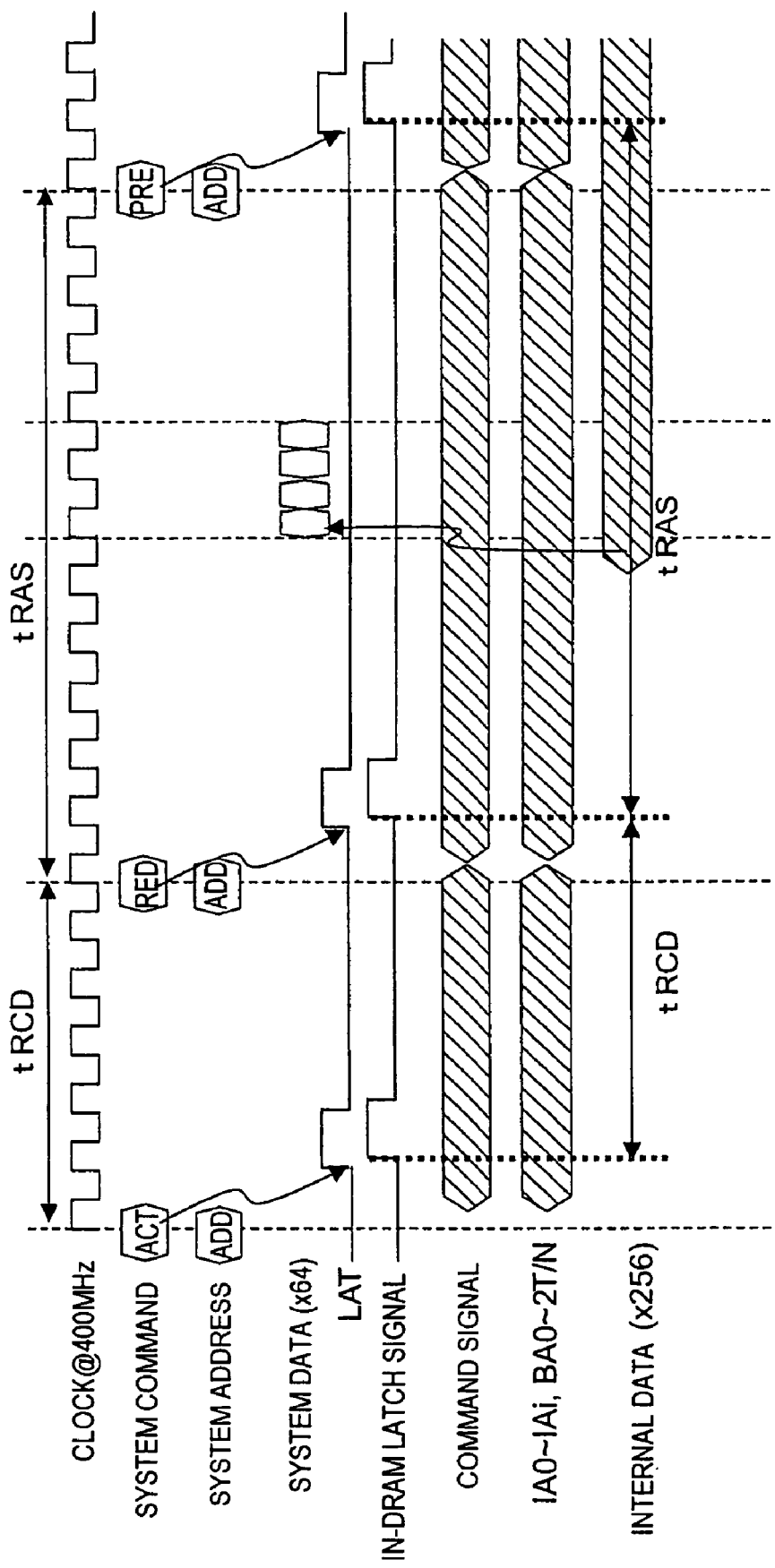
FIG. 31 is a time chart showing a read operation in the DRAM module according to the present invention.

The operation of the memory module according to the present invention will be described with reference to FIG. 31. It is to be noted that the operation of the memory module is basically similar in all the embodiments. On receiving the system command signals (ACT, RED, PRE) from the chip set, the IO chip 211 transmits the latch signal LAT, address signals IA0 to IAi, bank selection signals BA0 to 2T/N, command signal, and internal data signal (x256) to the DRAM chip 201.

In the shown example, 400 MHz is supplied as the system clock signal, system commands (ACT, RED, PRE) are supplied in synchronization with the system clock signal, and the latch signal LAT and in-DRAM latch signal are output after a predetermined timing in response to the system commands ACT, RED. As apparent from the drawing, the latch signal LAT and the latch signal in the DRAM are produced at the same time interval.

The DRAM chip 201 receives the address, command, data signals by the latch signal LAT transmitted from the IO chip 211 to start an internal operation. Here, since the command signal is transmitted to the DRAM chip 201 by the latch signal LAT in synchronization with the system clock, the timing between the command signals in the memory module is the same as the time interval on the system.

As shown, when the system command ACT is supplied together with an address signal ADD, the corresponding DRAM chip is activated. When the read command RED is supplied in this state, internal data of 256 bits are read as the system data four times by a unit of 64 bits.

Figure 32:
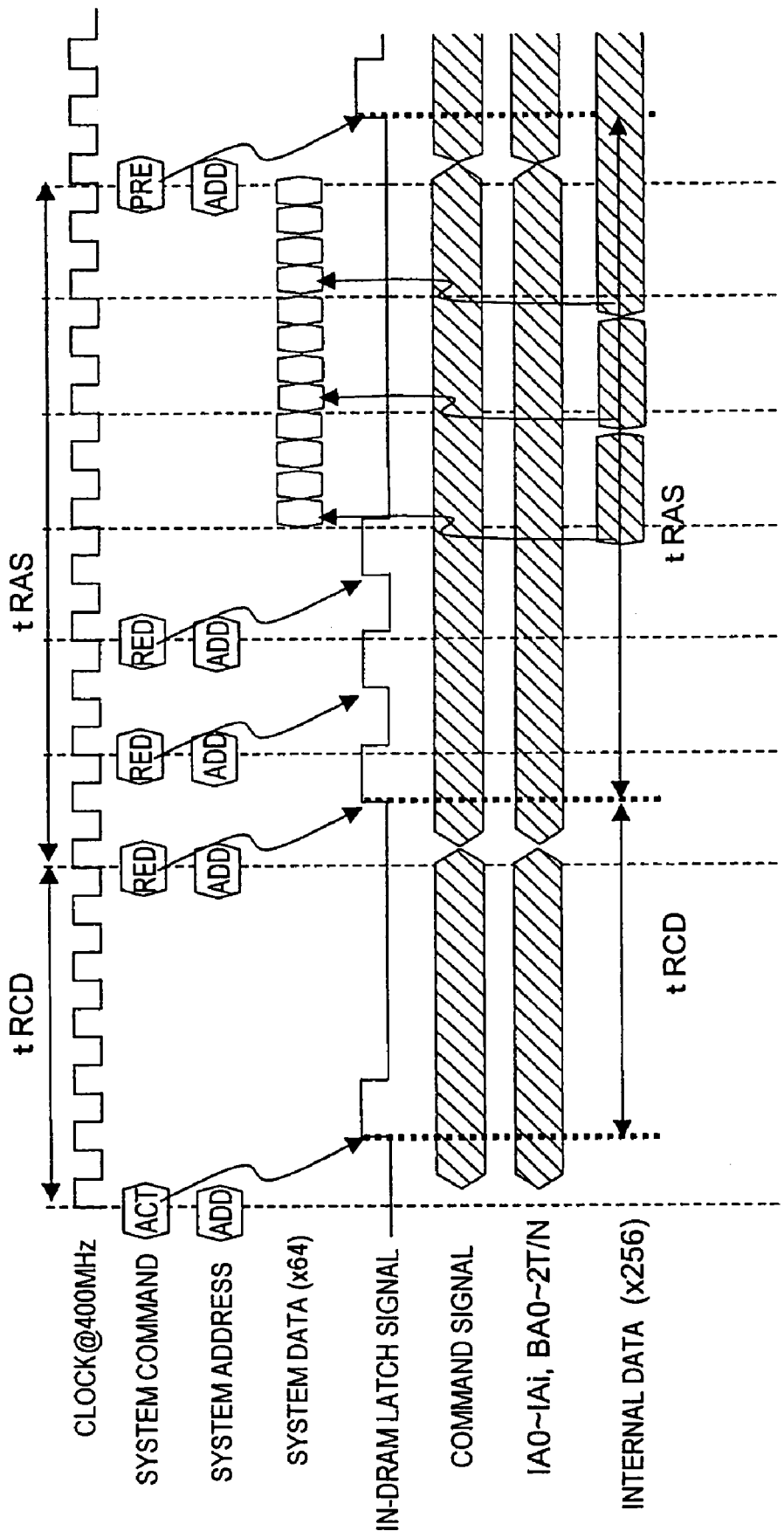
FIG. 32 is a time chart showing a case where a continuous read operation is performed in the DRAM module according to the present invention.

Referring to FIG. 32, an operation is shown in a case where the read command RED is continuously supplied as the system command together with a system address Add, and even in this case, the internal data of 256 bits is continuously read out as system data by a unit of 64 bits in a tRAS period.

Figure 33:
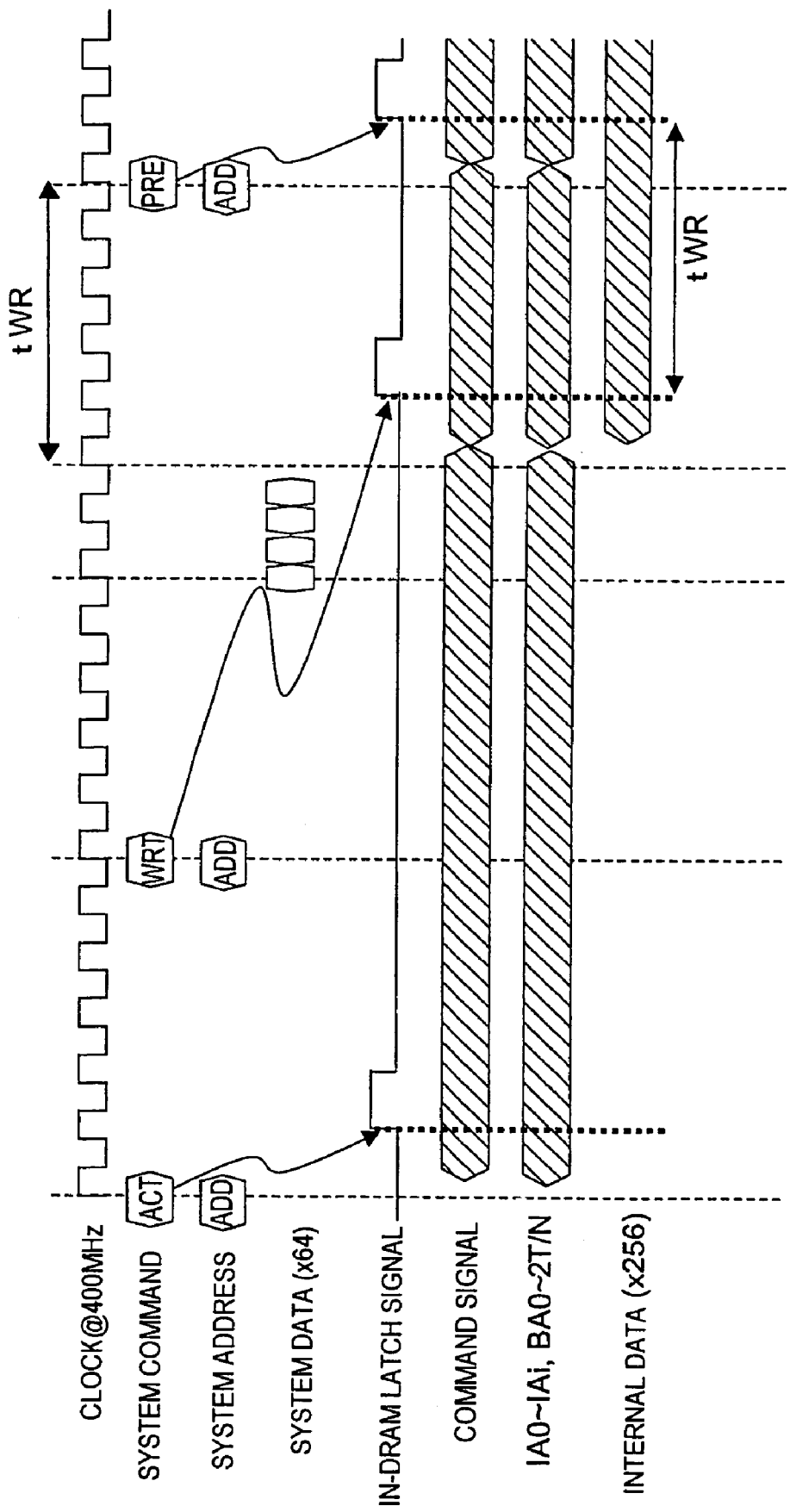
FIG. 33 is a time chart showing a write operation in the DRAM module according to the present invention.

On the other hand, FIG. 33 shows an operation in a case where a write command (WRT) is supplied after the system command ACT. In this case, in the DRAM chip, the latch signal in the DRAM, command signal, and internal address signal are produced in synchronization with the system commands ACT and WRT, and the system data signal is written as the internal data signal of 256 bits by a unit of 64 bits in synchronization with the DRAM latch signal.

As described above, the pad for test 175 and test circuit 176 are built in the DRAM chip 201 in the memory module according to the present invention.

Figure 34:
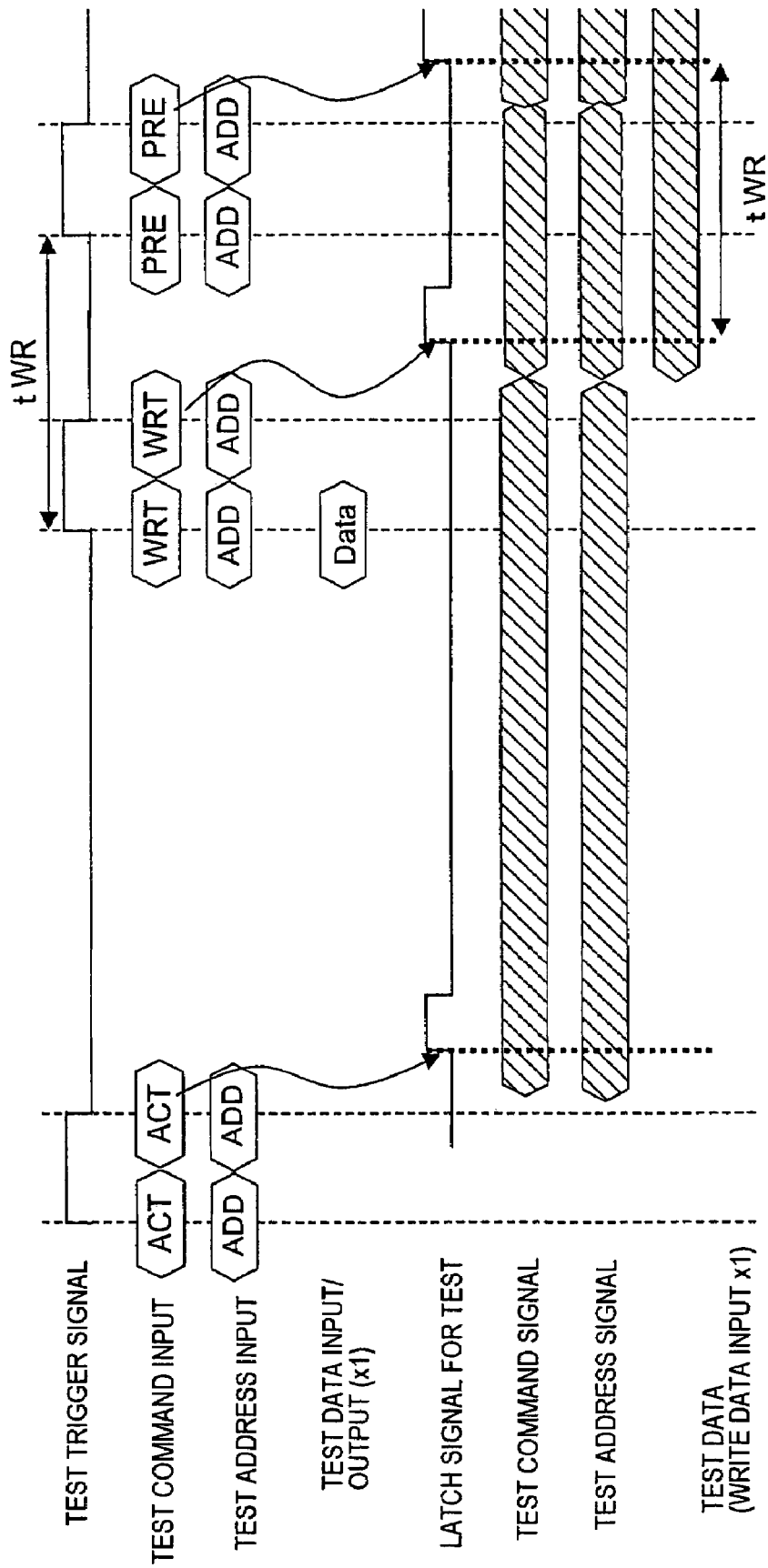
FIG. 34 is a time chart showing the write operation of test data in the DRAM module according to the present invention.

Referring to FIG. 34, a write operation in a case where each DRAM chip 201 is tested. In this case, the test command signals (ACT, RED, PRE) are supplied from the test pad 175 in synchronization with a test trigger signal. On receiving the test command signal, the test circuit 176 transmits the latch signal for test, test address, test command, and test data signal to the address buffer 172, control circuit 171, and data buffer 173. In the shown example, since a test pad number is reduced, the signal for test is input continuously to rising, falling of the trigger signal for test, and modulated in the test circuit 176 to produce the test address, test command.

The test data signal is input from one pin, and internal x256IO is degenerated and tested. The DRAM chip 201 receives the address, command, and data signal by the latch signal for the test transmitted from the test circuit 176 to start the internal operation.

Here, since the test command is formed in the internal operation signal by the latch signal for the test in synchronization with the test trigger signal, the timing between the commands in the DRAM chip is equal to a timing interval of the test command.

Figure 35:
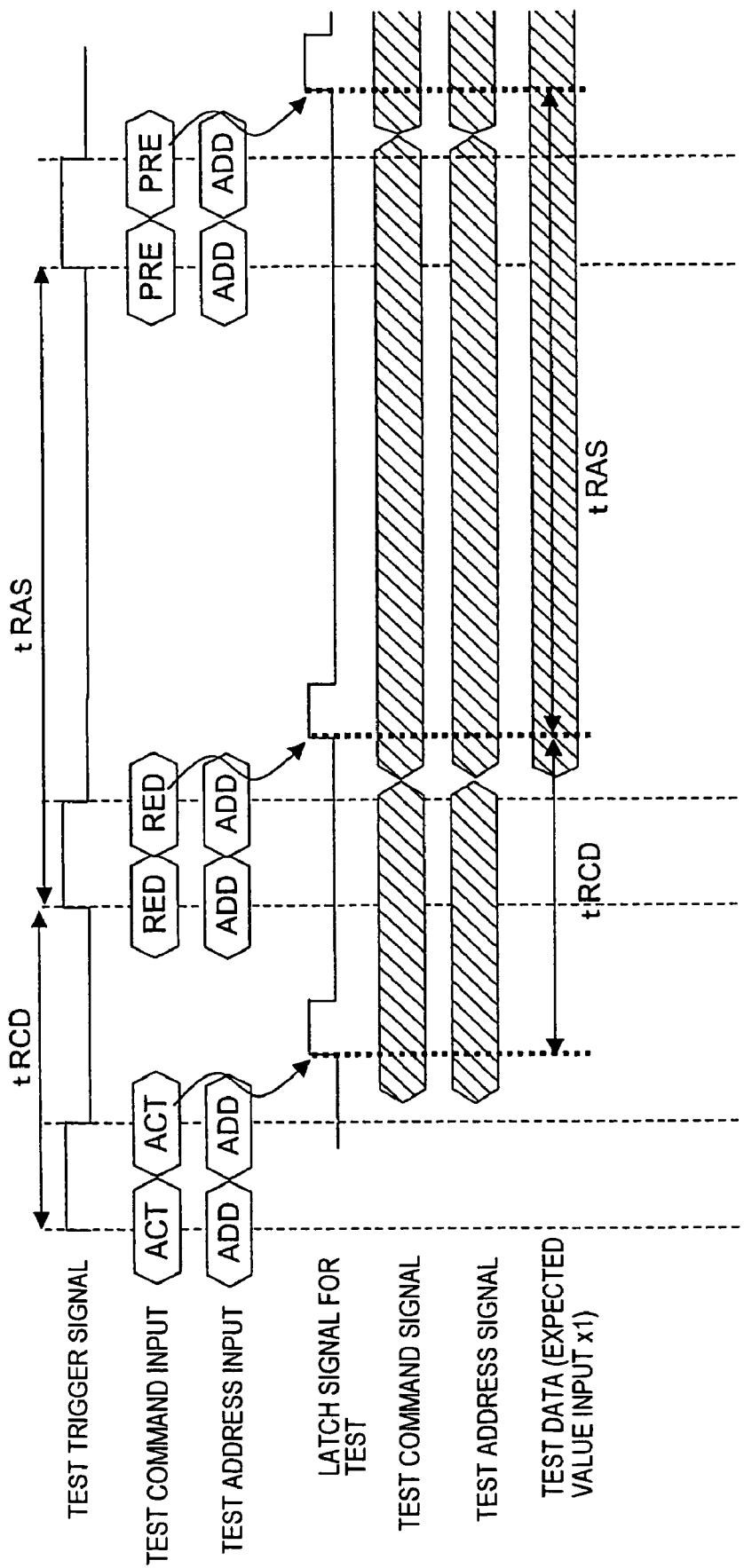
FIG. 35 is a time chart showing a test data read operation in the DRAM module according to the present invention.

FIG. 35 is a timing chart showing an operation in a case where the read operation of each DRAM chip 201 is tested. At a read operation time, expected value data is input from test data input/output, and compared with internal read data, and a comparison result is latched.

Figure 36:
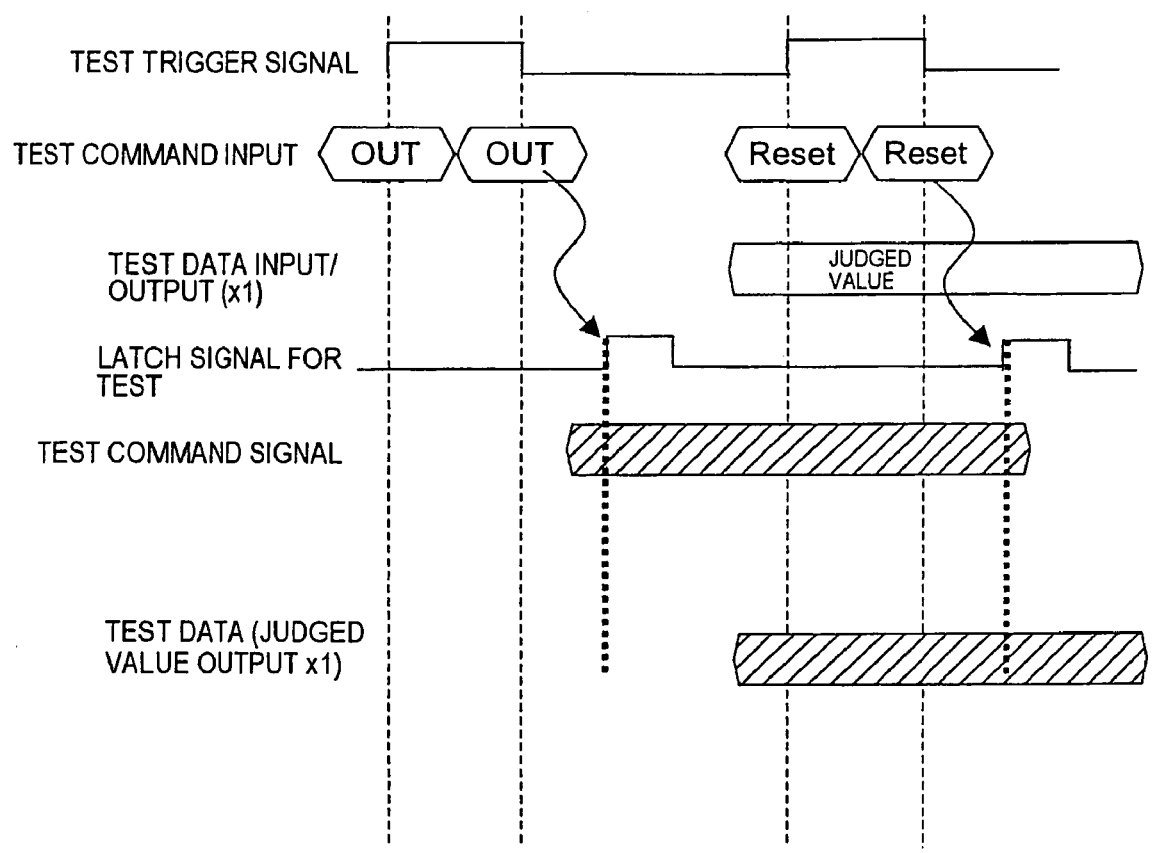
FIG. 36 is a time chart showing a test data comparison operation in the DRAM module according to the present invention.

A judgment result is output and reset in a comparison cycle shown in FIG. 36.

Figure 37:
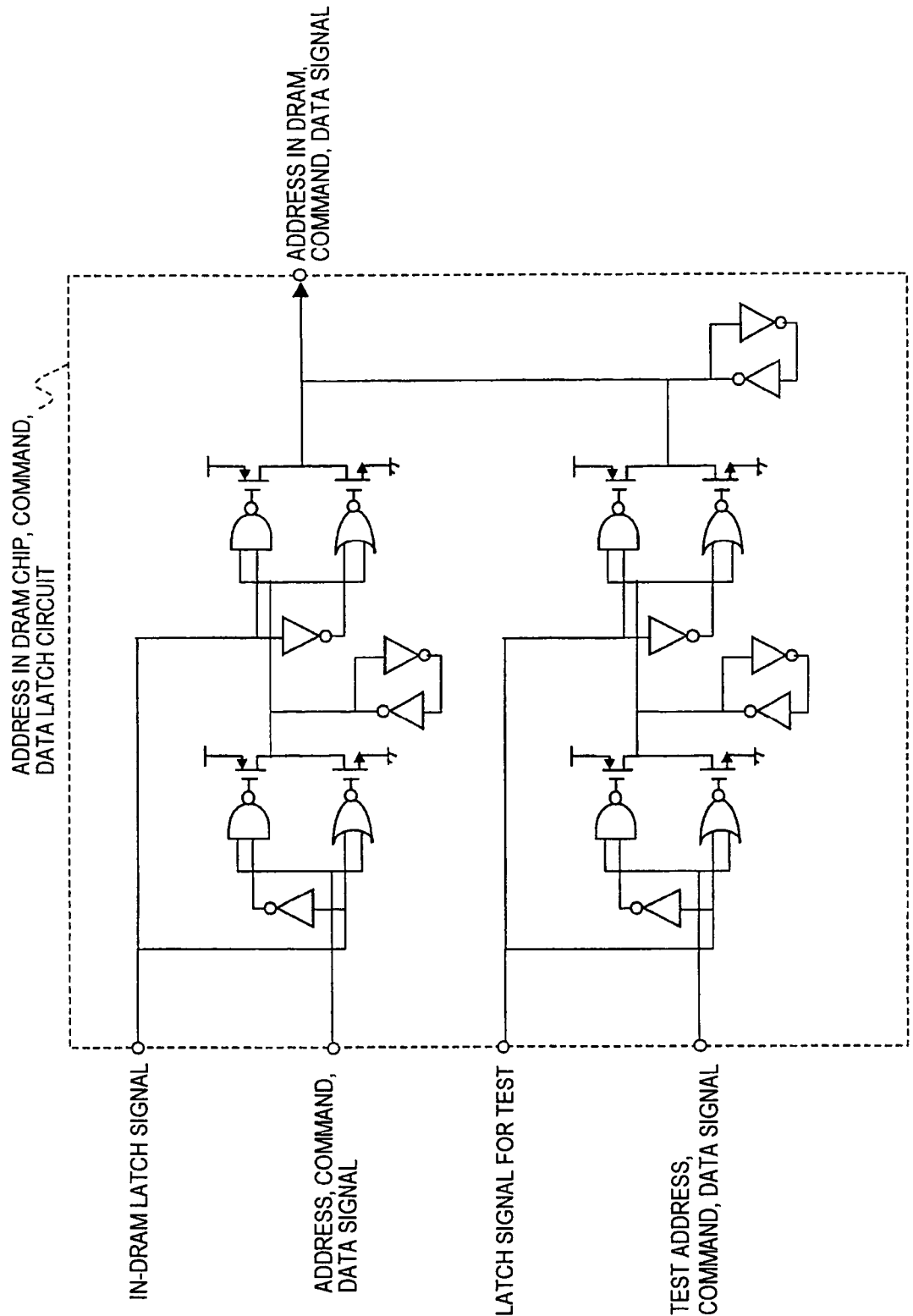
FIG. 37 is a circuit diagram showing a data latch circuit for use during a test.

FIG. 36 shows the constitution of an in-DRAM chip signal latch circuit which latches the judgment result. The latch circuit shown in FIG. 37 is used during the test, and comprises a circuit section which latches the test address, command, data signal by the latch signal for the test, and an output section which is used at a normal operation time and which is common to the circuit section for latching the address, command, data signal by the latch signal in the DRAM. In this constitution, since an in-DRAM chip production timing interval of the signal to be latched in the circuit section can be equal at a test time and at a mounting time, it is possible to remove a defect of the DRAM chip in a wafer state.

A memory system constituted using the memory module according to the present invention will be described with reference to FIG. 38. In the shown memory system, the memory module (shown by 400a to 400d) including the laminate of the DRAM chips 201 shown in FIG. 1 and the like is mounted on a mother board 401 together with a memory controller (chip set) 402.

In the shown example, the respective memory modules 400a to 400d are mounted in a plane on the mother board 401. In this relation, plane mounting sockets 403 are disposed in mounted positions of the memory modules 400a to 400d, and the memory modules 400a to 400d are electrically connected to the pads of the plane mounting sockets 403 via the BGA terminals of the interposer substrate 210.

In this case, the data signal, address command signal, clock signal, and control signal are supplied to the BGA terminals of the interposer substrates 210 disposed in the memory modules 400a to 400d. These signals are supplied to the signal pads on the IO chips 211 of the memory modules 400a to 400d and further to the interface circuit. Since connections in the respective memory modules 400a to 400d are remarkably short, only a branch occurs on the signal wiring to such an extent that the branch is electrically ignorable (@1.6 Gbps).

In the shown example, the wirings of the data signal, address command signal, and clock signal can be formed in physically the same wiring topology. Therefore, a difference is not made in a signal reach time (i.e., skew) in the respective memory modules 400a to 400d (especially IO chip input pads).

In this constitution, since the bus width per channel can be equal to or more than that of a DDRII module, there is an advantage that the number of packages connected to the bus does not increase as in the RDRAM.

Figure 38:
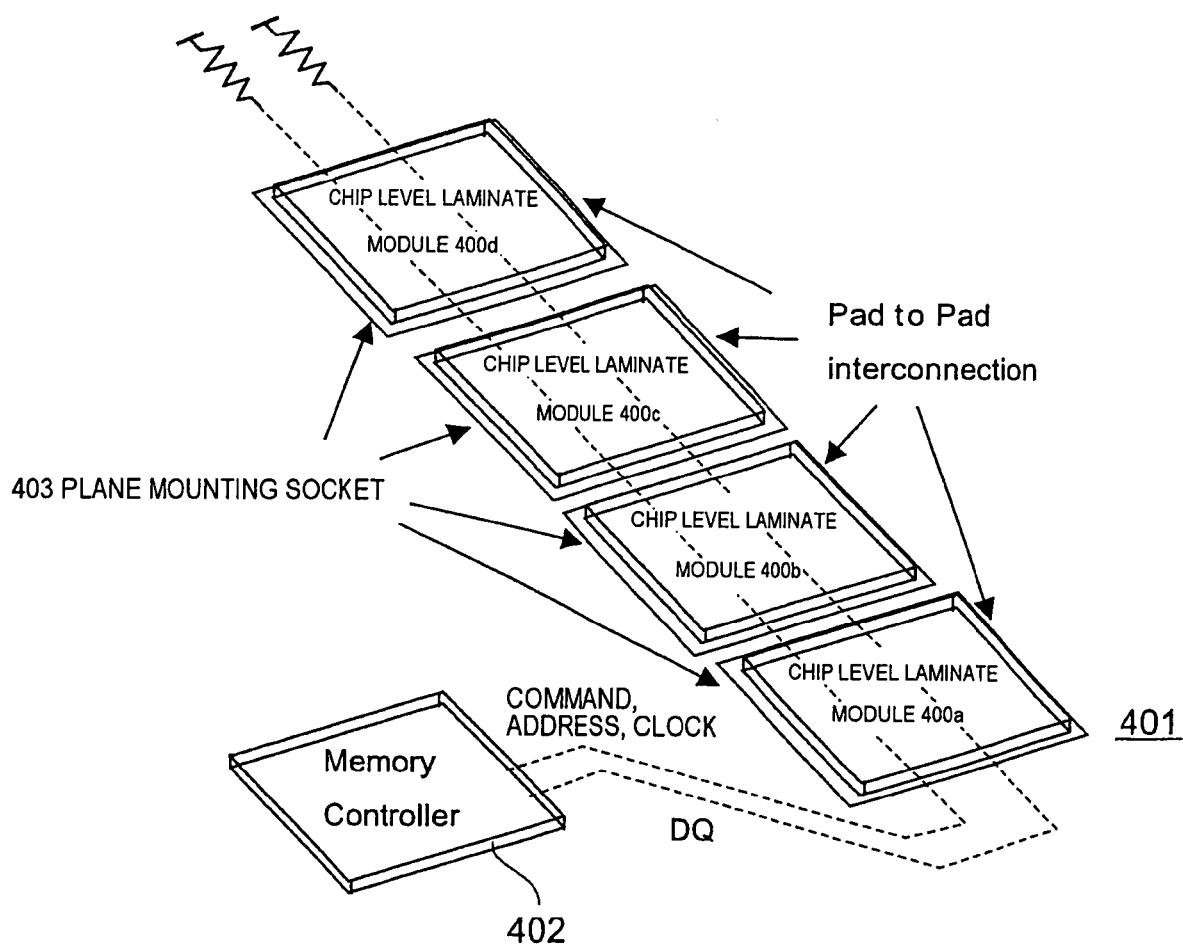
FIG. 38 is a perspective view showing one example of a memory system including a plurality of DRAM modules according to the present invention.
Figure 39:
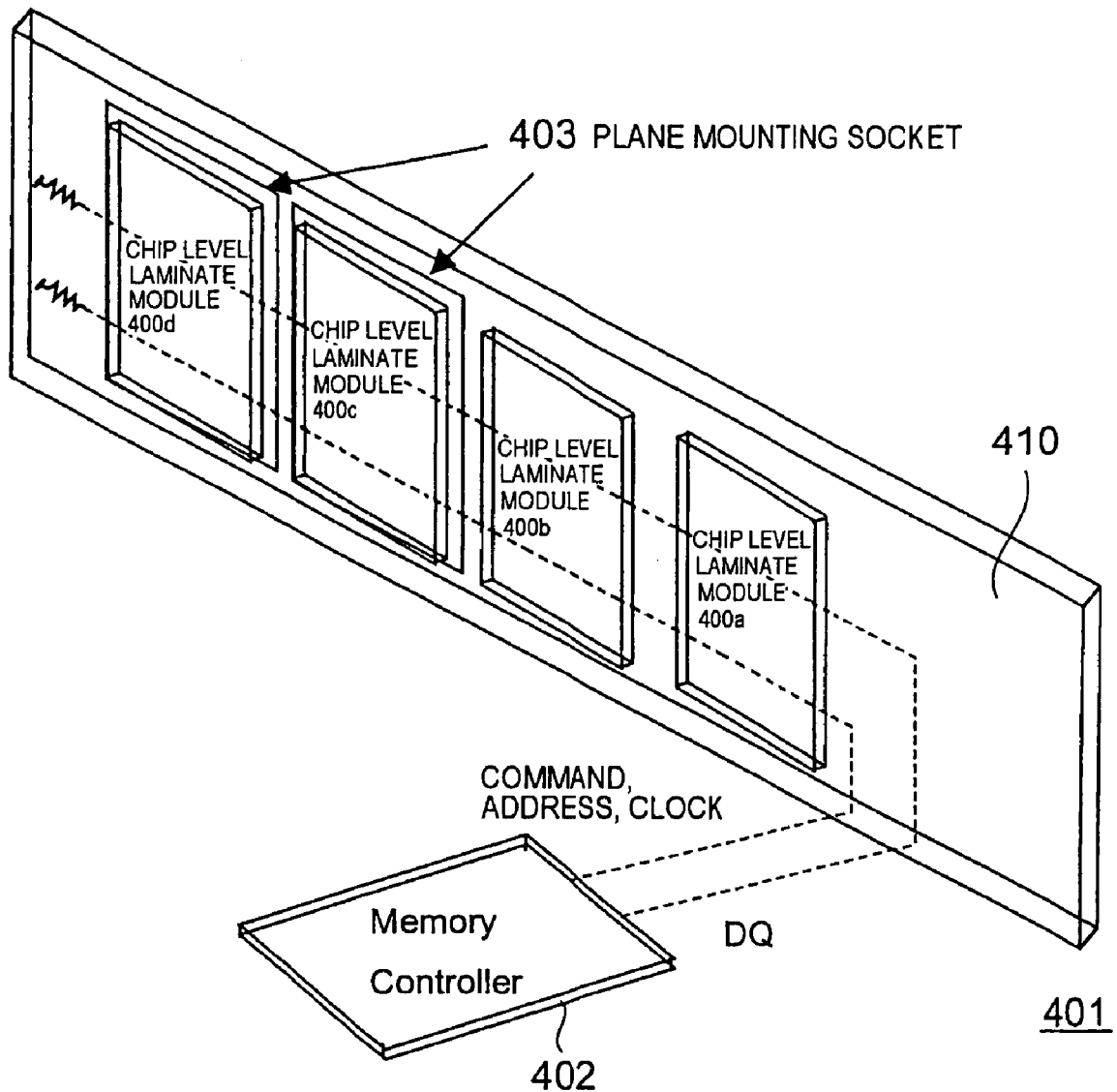
FIG. 39 is a perspective view showing another example of the memory system including a plurality of DRAM modules according to the present invention.

Next, a memory system shown in FIG. 39 has a constitution in which the memory modules 400a to 400d shown in FIG. 38 are mounted on a mounting substrate 410 via the plane mounting sockets 403 and the mounting substrate 410 is mounted on the mother board 401 via a slot and connector (not shown). In this manner, the memory system of the present invention may also use a constitution in which the mounting substrate 410 including the stacked and mounted memory modules 400a to 400d is vertically disposed on the mother board 401. Even in this constitution shown in the drawing, the wirings of the data signal (DQ), address command signal, and clock signal are formed substantially in physically the same wiring topology. Therefore, the skew in the respective memory modules 400a to 400d (especially, the IO chip input pads) can be suppressed.

When write, read simulation is performed at 1.6 Gbps with reference to the memory system including the mounting substrates 410 shown in FIG. 39, mounted in two slots, it has been confirmed that a window sufficient for an eye pattern is opened. Similarly, a sufficient window can be obtained even in four slots.

On the other hand, when similar simulation is performed with respect to RDRAM including 16 devices mounted in two slots, any sufficient window is not obtained.

This is supposedly because a received waveform in a far-end device is influenced by a reflection signal by another device input LC in a case where 16 devices are connected to the bus.

In the above-described embodiments, only the DRAM chip has been described, but the present invention is not limited to this, and is applicable to a system in which the transfer rate and width of the external data signal are different from those of the internal data signal in the module.

As described above, a DRAM memory module according to the present invention has a structure in which an interposer, an IO chip, a through electrode, and a plurality of DRAM chips are stacked. According to this structure, an input circuit of an address, command, clock signal is mounted only on the IO chip, and a current consumption of the input circuit of the address, command, clock signal, which has heretofore been consumed by each DRAM chip on a conventional memory module, is only for one set on the IO chip. Similarly, a DLL, which has heretofore been mounted on each DRAM chip, is mounted only on the IO chip in the memory module of the present invention, and the current consumption is only for one set. In the structure of the present invention, a wiring on a module substrate corresponds to a through electrode, a size of the through electrode is only 450 μm even with eight laminates of about 50 μm, and charge/discharge of the wiring is remarkably small. Therefore, in the present invention, a wiring charge/discharge current on the substrate in the conventional module can largely be reduced.

In the memory module according to the present invention, only one DRAM chip in the module is accessed in response to an access command from a memory controller. Redundant operations of a control circuit section and control signal on the DRAM chip in a case where all the DRAM chips or ½ of the DRAM chips on the module are accessed as in a conventional DDR module can be eliminated to reduce the operation current of the whole module.

Furthermore, in the memory module according to the present invention, a register or a PLL which has heretofore been mounted for timing adjustment with respect to a wiring delay on the module in systems such as a conventional DDR is not required, and therefore the current consumption by these active components is reduced.

Moreover, since termination of the data signal wiring (DQ) in the DRAM chip required in a DDRII system is not required, a DC chip consumed here can be reduced.

In the memory module of the present invention, only one DRAM chip in the module is accessed with respect to one access command from the memory controller for reducing the operation current.

Moreover, for the DRAM chips to be stacked, it is preferable that all patterns including the through electrodes be common in consideration of productivity. When all the patterns are common in this manner, a problem occurs that it is difficult to individually transmit signals to the DRAM chips from the IO chip and to operate the chips. However, this problem can be solved by a counter circuit disposed so as to produce a collation signal for receiving signals by collation with a control signal or an address signal transmitted to each DRAM chip from the IO chip. A wiring for this counter circuit is laid on a wafer on which the patterns of the DRAM chips have been formed after forming the through electrode.

What is claimed is:

1. A memory module comprising: an IO chip; a plurality of DRAMs stacked on the IO chip; and an interposer substrate having BGA terminals of all system data signals, system address signals, system control signals, and system clock signals required to constitute a function of a memory sub-system of one channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM chip and a GND terminal via the through electrode, and wherein the DRAM chip has the number, which is 2n (n denotes a natural number of 1 or more) times that of system data buses, of through electrode data signal terminals for write and read, or bidirectional terminals, and the IO chip further has the number, which is 2n times that of system data buses, of through electrode data signal terminals for write and read, or bidirectional terminals.

2. The memory module according to claim 1, wherein the data signal terminals of the respective DRAMs share a data signal line via the through electrodes and are connected to the data signal terminal of the IO chip, the address signal terminals of the respective DRAMs share an address signal line via the through electrodes and are connected to the address signal terminal of the IO chip, and the control signal terminals of the respective DRAMs share a control signal line via the through electrodes and are connected to the control signal terminal of the IO chip.

3. The memory module according to claim 1, wherein a pattern other than a pattern for forming the through electrode is formed using the same pattern for the DRAM chips to be stacked.

4. A memory module comprising: an IO chip; a plurality of DRAMs stacked on the IO chip; and an interposer substrate having BGA terminals of all system data signals, system address signals, system control signals, and system clock signals required to constitute a function of a memory sub-system of one channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM chip and a GND terminal via the through electrode, wherein the DRAM chip and the IO chip mutually transfer data via a through electrode data terminal, whereas the IO chip has a serial/parallel circuit which serial/parallel converts 2n data signals per continuous terminal transferred via a system data bus to simultaneously transfer the data signals to the DRAM chip, and a parallel/serial circuit which parallel/serial converts 2n data signals per terminal transferred from the DRAM chip to output continuous 2n data to the system data bus.

5. A memory module comprising: an IO chip; a plurality of DRAMs stacked on the IO chip; and an interposer substrate having BGA terminals of all system data signals, system address signals, system control signals, and system clock signals required to constitute a function of a memory sub-system of one channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM chip and a GND terminal via the through electrode, wherein SPD chips are stacked on the stacked DRAM chips.

6. A memory module comprising: an IO chip; a plurality of DRAMs stacked on the IO chip; and an interposer substrate having BGA terminals of all system data signals, system address signals, system control signals, and system clock signals required to constitute a function of a memory sub-system of one channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM chip and a GND terminal via the through electrode, wherein an input/output signal terminal of the SPD chip is connected to an SPD input/output terminal pad on the IO chip via the through electrode, and each DRAM chip has a through electrode for an SPD input/output signal, which is not used in the DRAM chip.

7. A memory module comprising: an IO chip; a plurality of DRAMs stacked on the IO chip; and an interposer substrate having BGA terminals of all system data signals, system address signals, system control signals, and system clock signals required to constitute a function of a memory sub-system of one channel, and including a constitution in which a plurality of DRAM chips connected to a pad for input/output and a pad for input of each input/output circuit on the IO chip and stacked on the IO chip are bonded to a data signal terminal, an address signal terminal, and a control signal terminal of the IO chip by the through electrodes, a data signal, an address signal, and a control signal between the chips are received/transmitted via the through electrodes, and a power supply and GND are supplied to the pads on the IO chip from the BGA terminals, and supplied to a power supply of each DRAM chip and a GND terminal via the through electrode, wherein the same pattern is formed for all of the DRAM chips to be stacked, and a fuse data is cut to identify signals for the individual DRAM chips from the IO chip.

\* \* \* \* \*